US011215891B2

(12) United States Patent
Kitagawa et al.

(10) Patent No.: US 11,215,891 B2
(45) Date of Patent: Jan. 4, 2022

(54) ACTIVE MATRIX SUBSTRATE AND MANUFACTURING METHOD THEREOF

(71) Applicant: SHARP KABUSHIKI KAISHA, Sakai (JP)

(72) Inventors: Hideki Kitagawa, Sakai (JP); Yoshihito Hara, Sakai (JP); Masaki Maeda, Sakai (JP); Yoshiharu Hirata, Sakai (JP); Tatsuya Kawasaki, Sakai (JP); Teruyuki Ueda, Sakai (JP); Hajime Imai, Sakai (JP); Tohru Daitoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/880,317

(22) Filed: May 21, 2020

(65) Prior Publication Data

US 2020/0371401 A1 Nov. 26, 2020

Related U.S. Application Data

(60) Provisional application No. 62/852,658, filed on May 24, 2019.

(51) Int. Cl.
*G02F 1/1362* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *H01L 27/124* (2013.01);
(Continued)

(58) Field of Classification Search
CPC ............ G02F 1/136286; G02F 1/1368; G02F 1/133345; G02F 1/136227;
(Continued)

(56) References Cited

U.S. PATENT DOCUMENTS 5,907,379 A * 5/1999 Kim .................. G02F 1/134363
349/141
9,640,669 B2 * 5/2017 Yamazaki ............... H01L 29/24
(Continued)

FOREIGN PATENT DOCUMENTS

JP 2015-109315 A 6/2015
WO 2015/186619 A1 12/2015

*Primary Examiner* — Hoan C Nguyen
(74) *Attorney, Agent, or Firm* — ScienBiziP, P.C.

(57) ABSTRACT

An active matrix substrate includes: a substrate; lower bus lines and upper bus lines; a lower insulating layer positioned between the lower bus lines and the upper bus lines; an oxide semiconductor TFT that are disposed in each pixel region and have an oxide semiconductor layer disposed on the lower insulating layer; pixel electrodes disposed in each pixel region; and wiring connection units arranged in a non-display region. Each wiring connection unit includes: a lower conductive layer formed using the same conductive film as the lower bus lines; an insulating layer that extends on the lower conductive layer and includes the lower insulating layer. The lower bus lines and the lower conductive layer have a first laminated structure including a metal layer and a transparent conductive layer that covers an upper surface and a side surface of the metal layer.

20 Claims, 29 Drawing Sheets

(52) U.S. Cl.
CPC ...... *H01L 27/1225* (2013.01); *H01L 27/1248* (2013.01); *H01L 27/1251* (2013.01); *H01L 27/1288* (2013.01); *G02F 2201/121* (2013.01); *G02F 2201/123* (2013.01)

(58) Field of Classification Search
CPC ..... G02F 1/136209; G02F 2001/13685; G02F 2202/10; G02F 2001/136295; G02F 2201/123; H01L 29/7869; H01L 29/78648; H01L 29/78633; H01L 27/1225
See application file for complete search history.

(56) References Cited

U.S. PATENT DOCUMENTS

| | | | |
|---|---|---|---|
| 9,653,487 B2* | 5/2017 | Yamazaki | H01L 29/66969 |
| 2013/0153904 A1* | 6/2013 | Nishimura | G02F 1/136213 257/57 |
| 2015/0103302 A1* | 4/2015 | Nagasawa | G02F 1/134336 349/153 |
| 2017/0090229 A1 | 3/2017 | Imai et al. | |

* cited by examiner

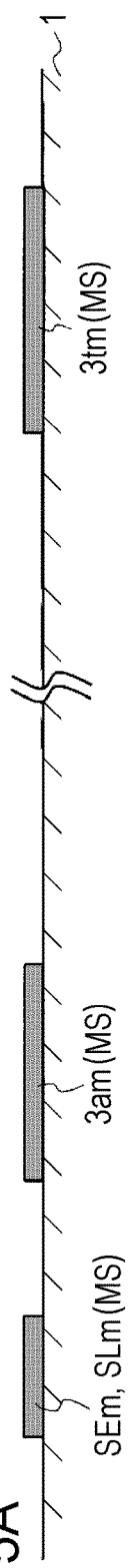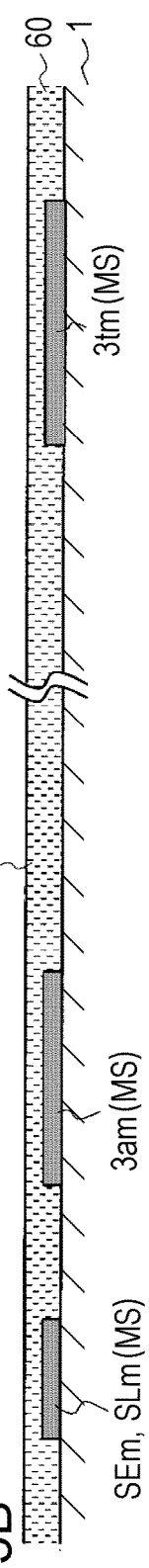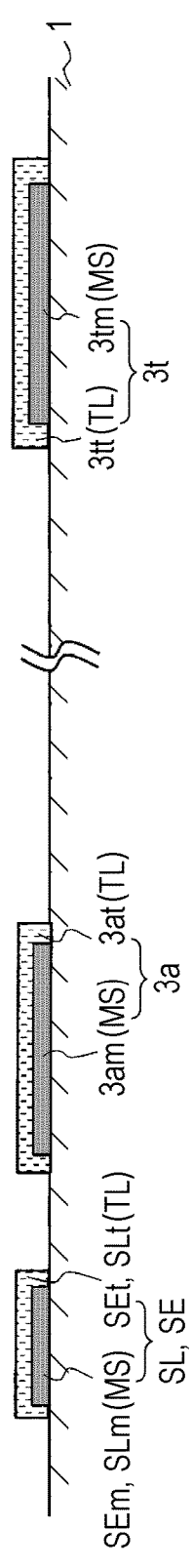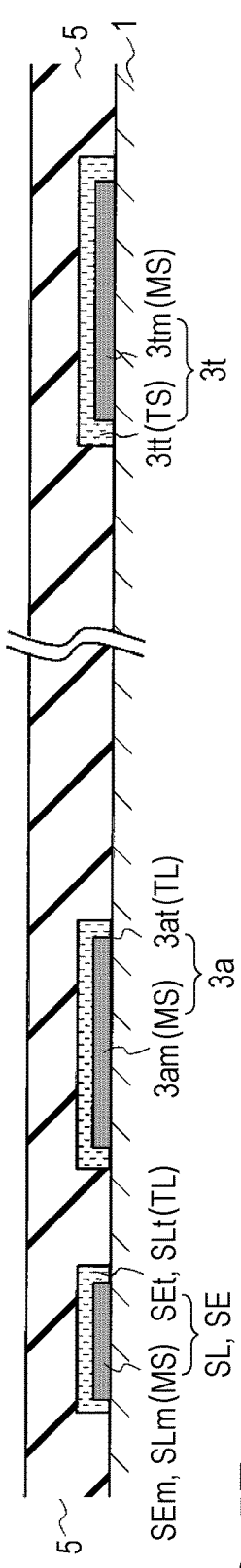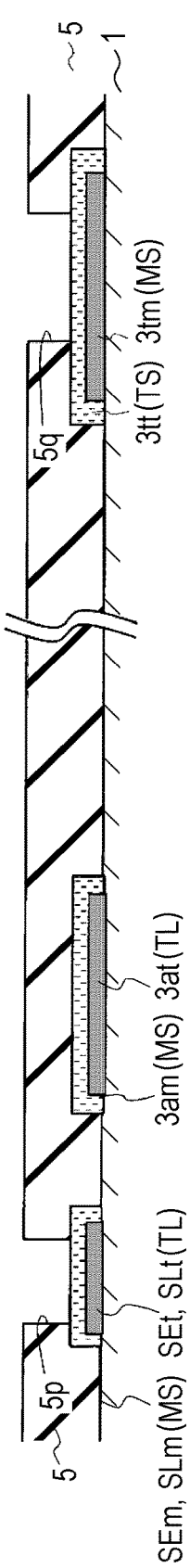

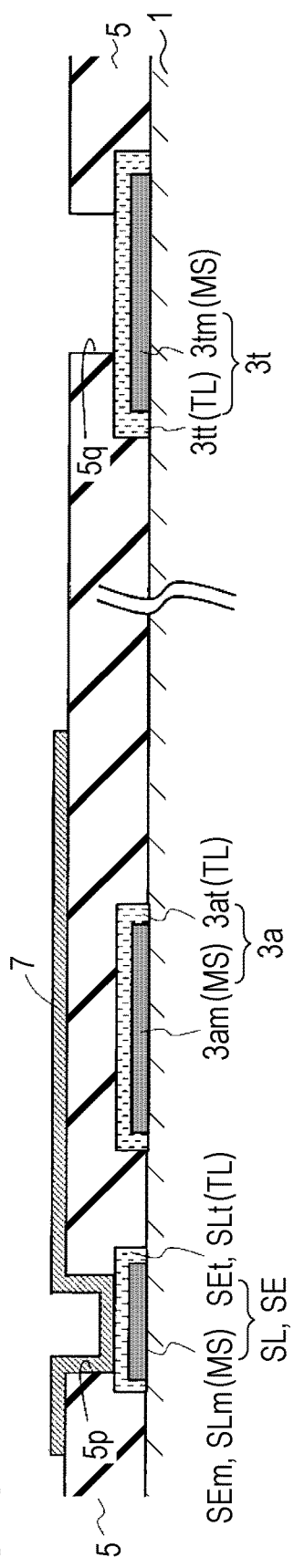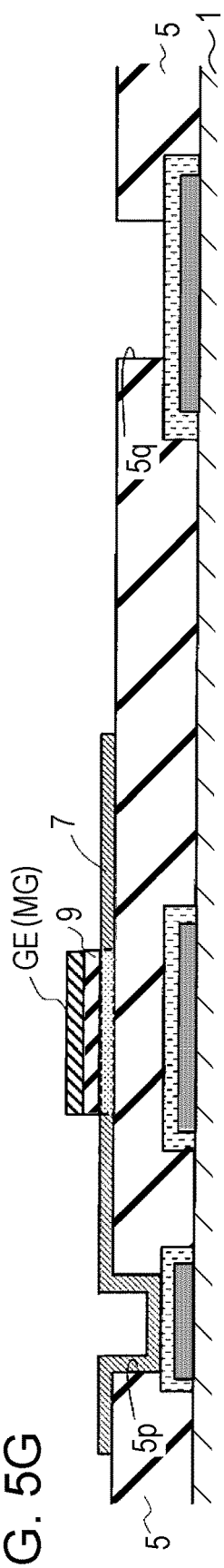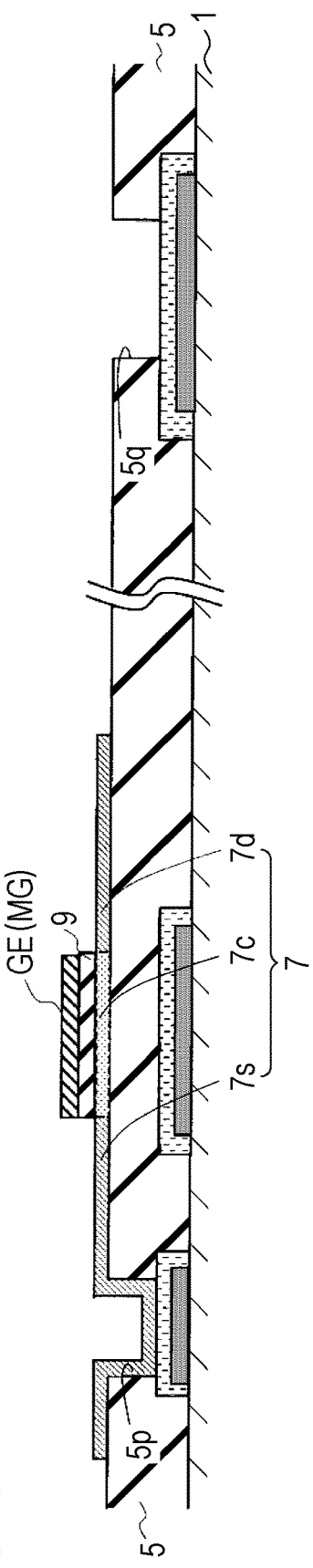

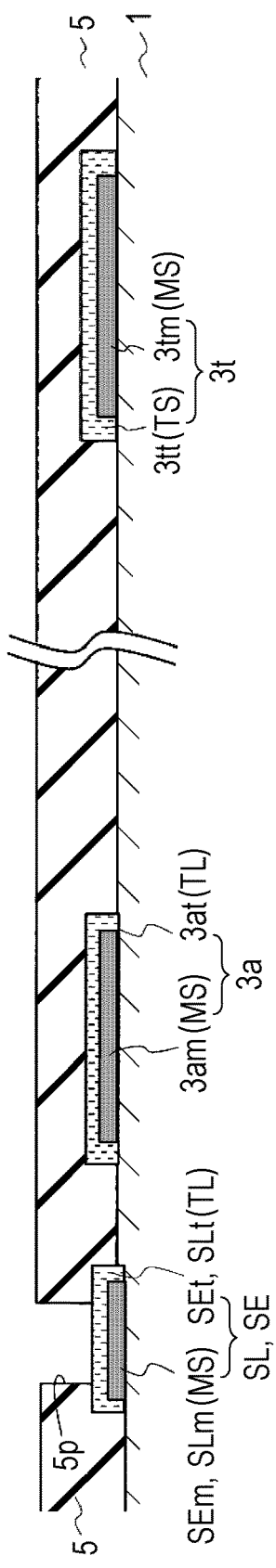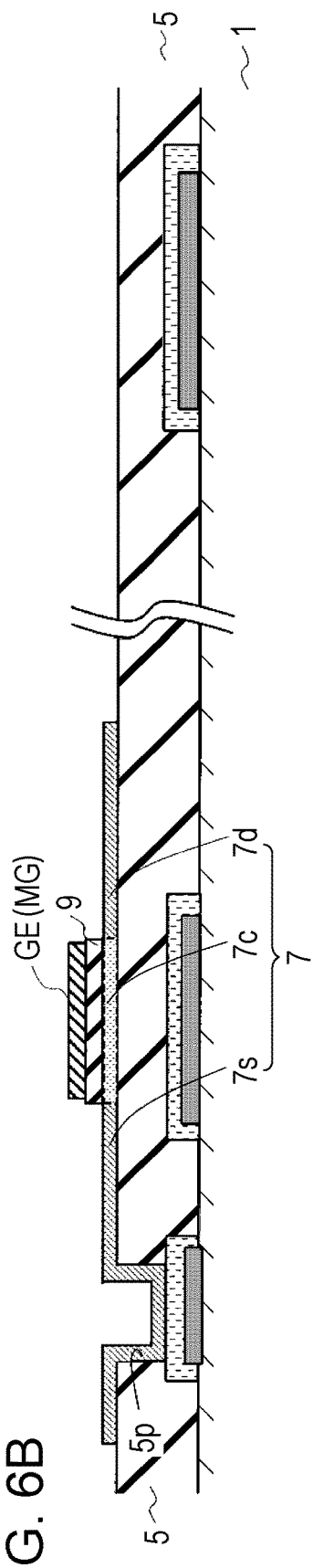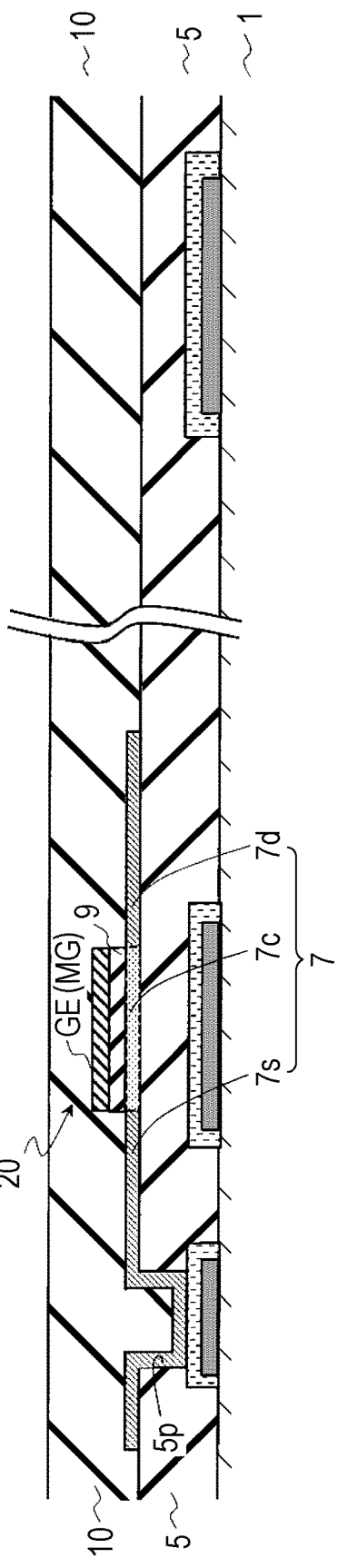

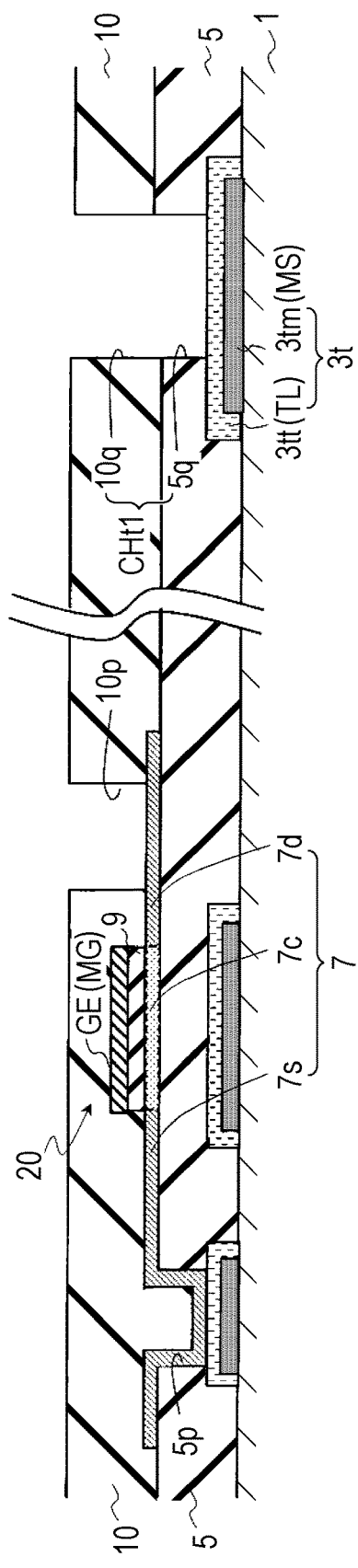
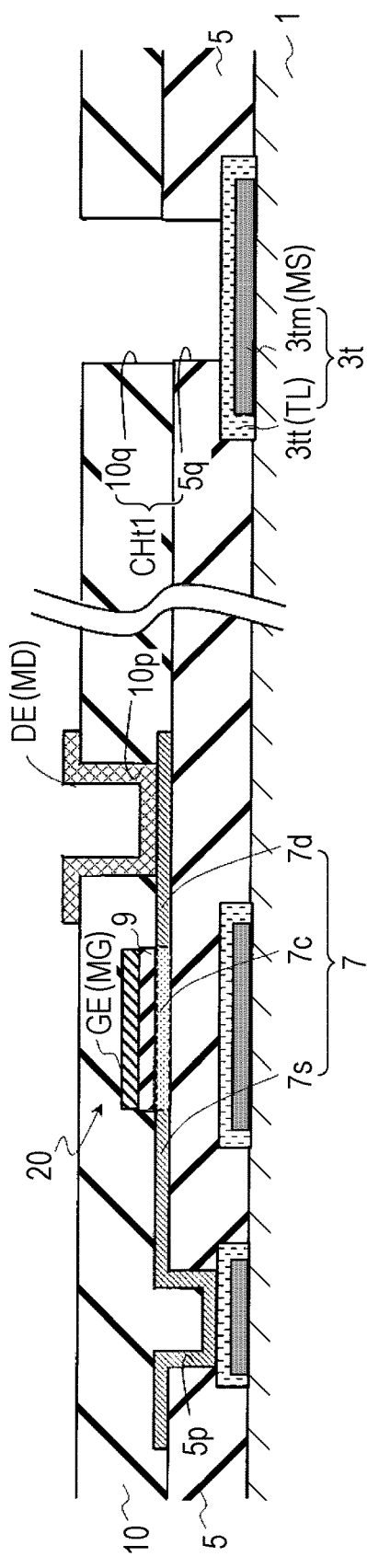
FIG. 9A
FIG. 9B

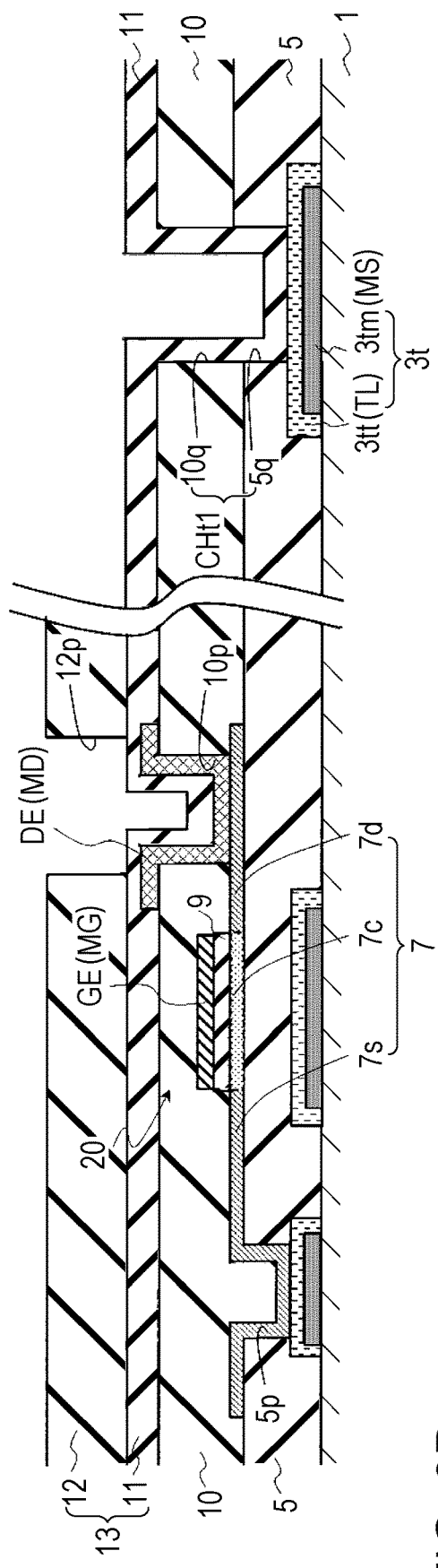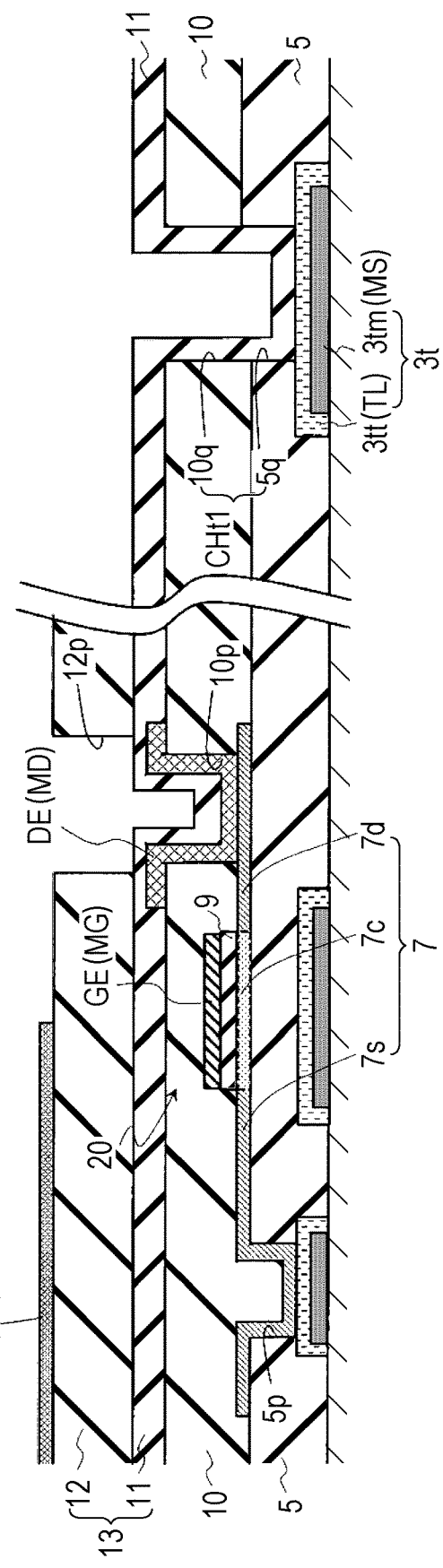

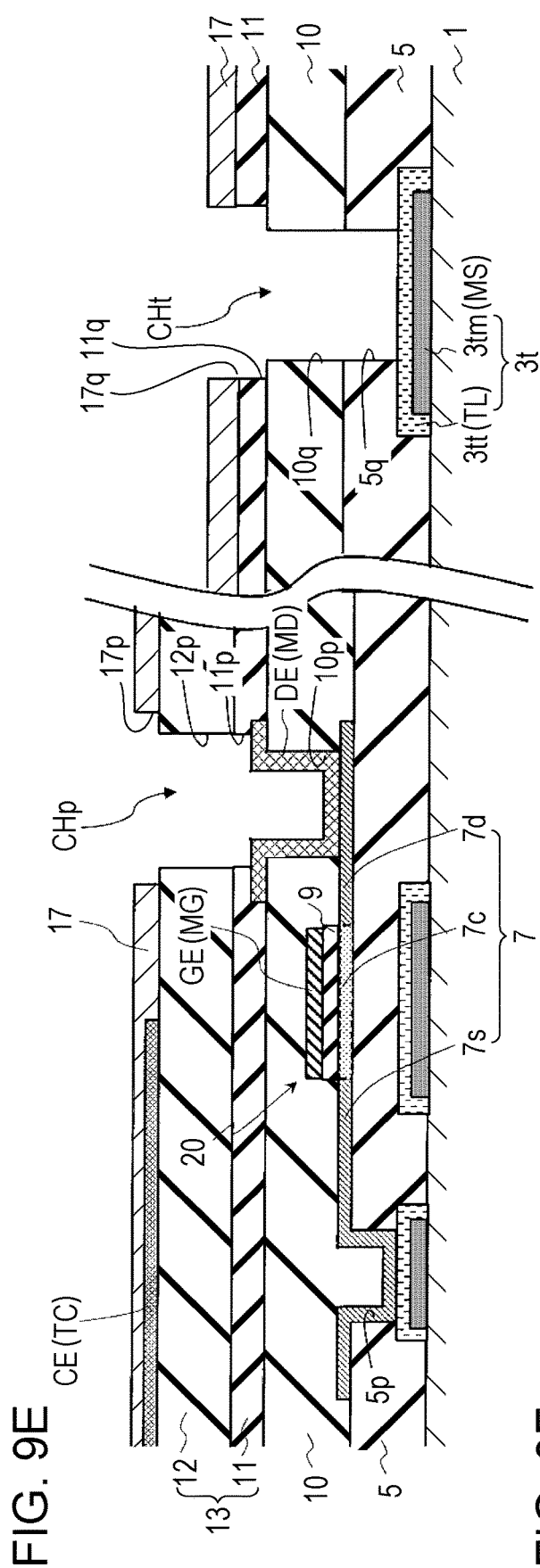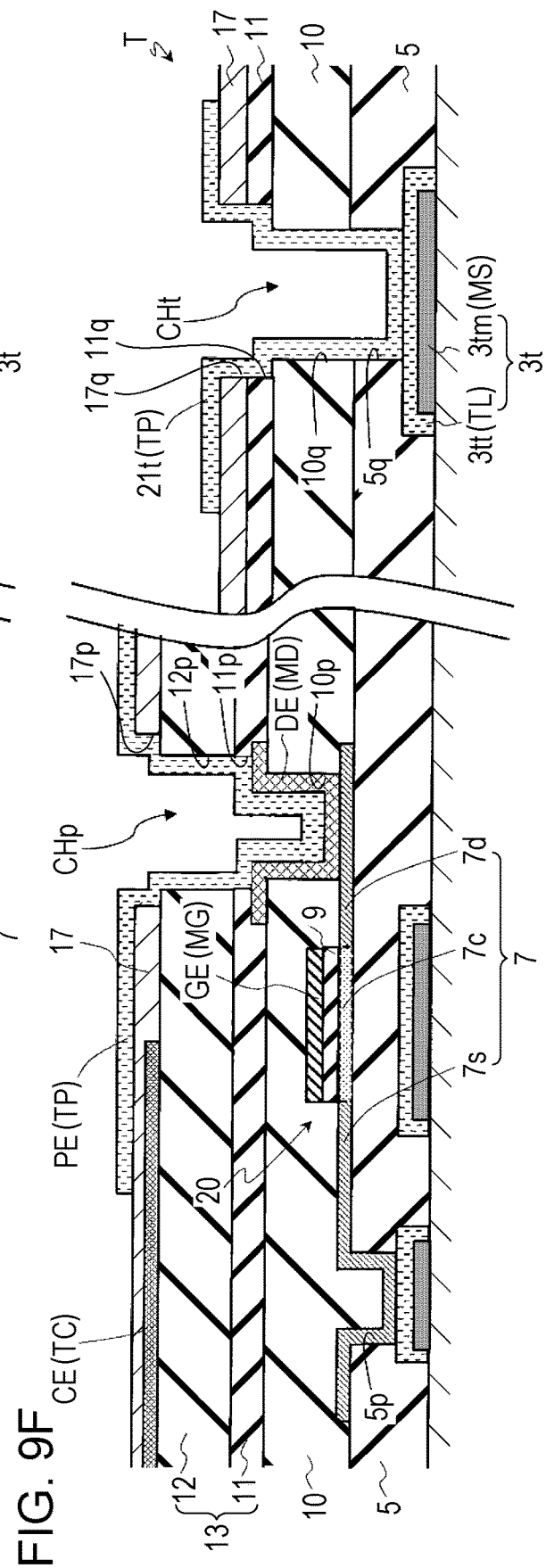

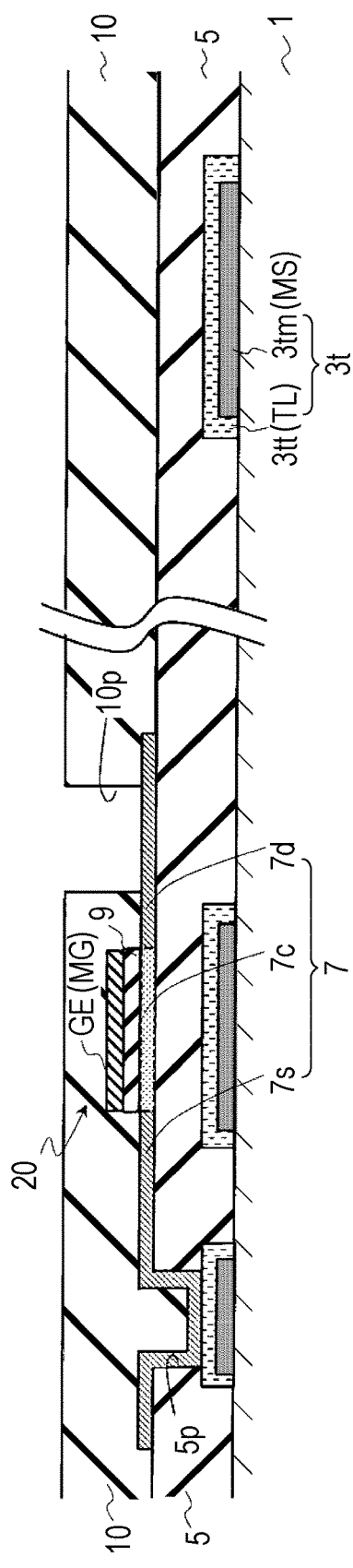
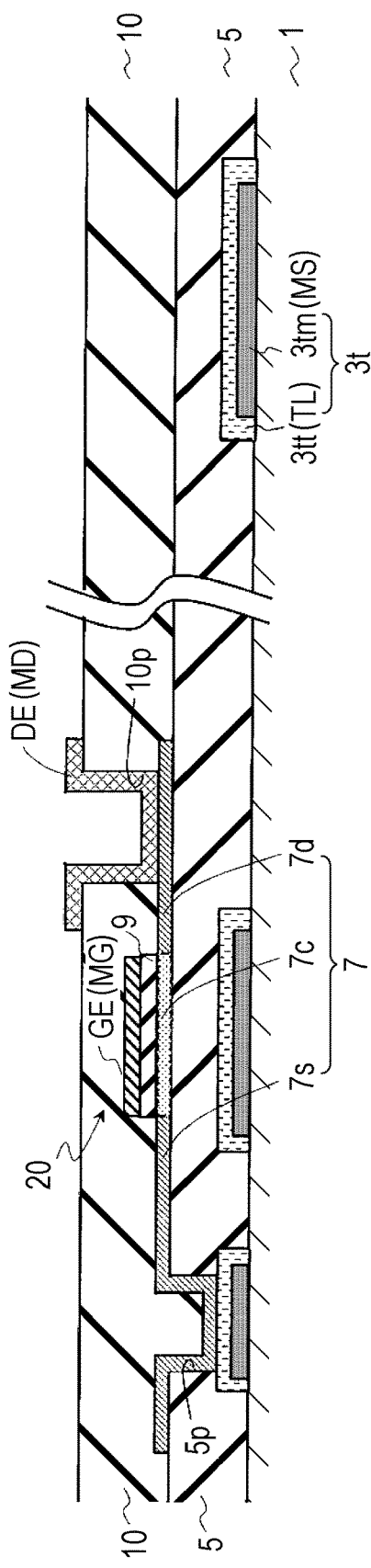

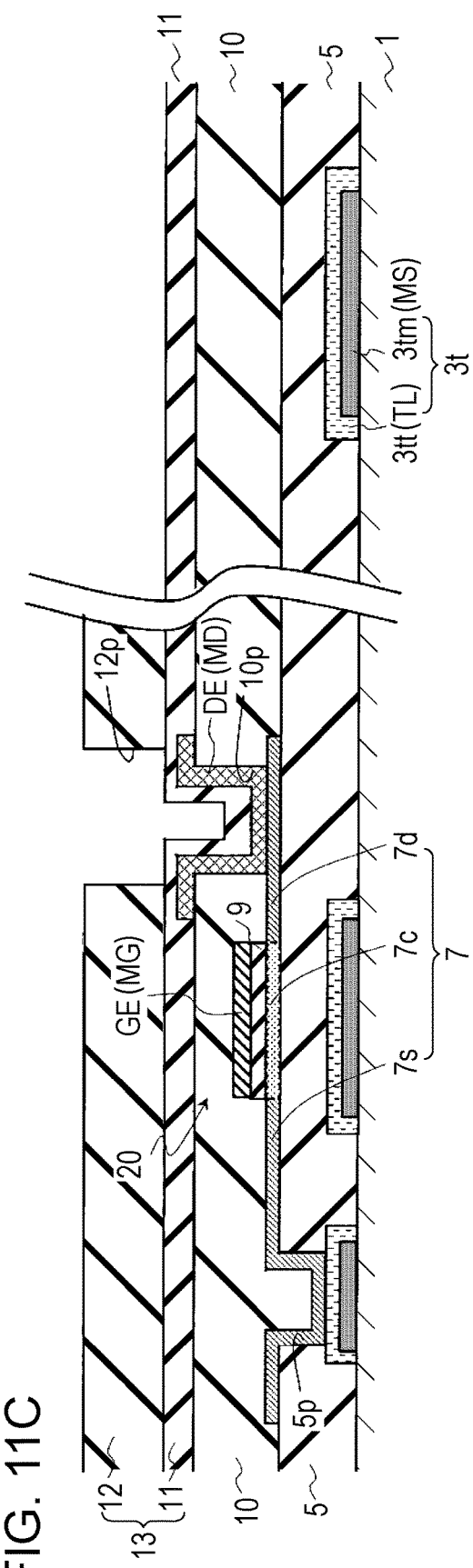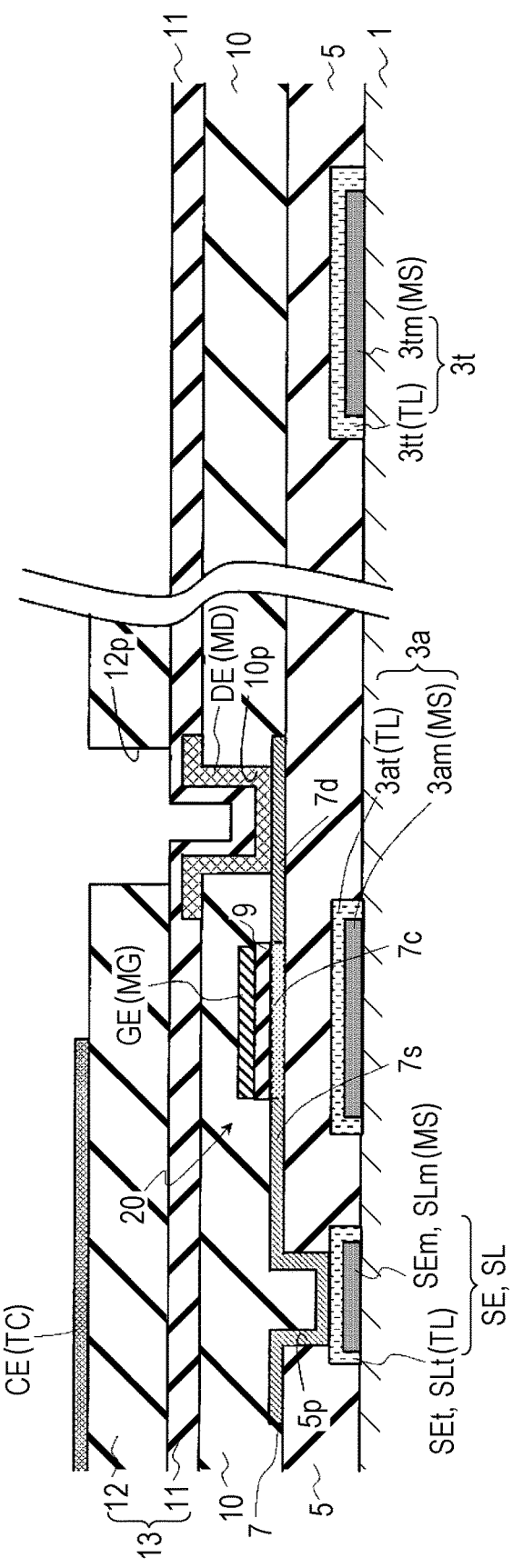

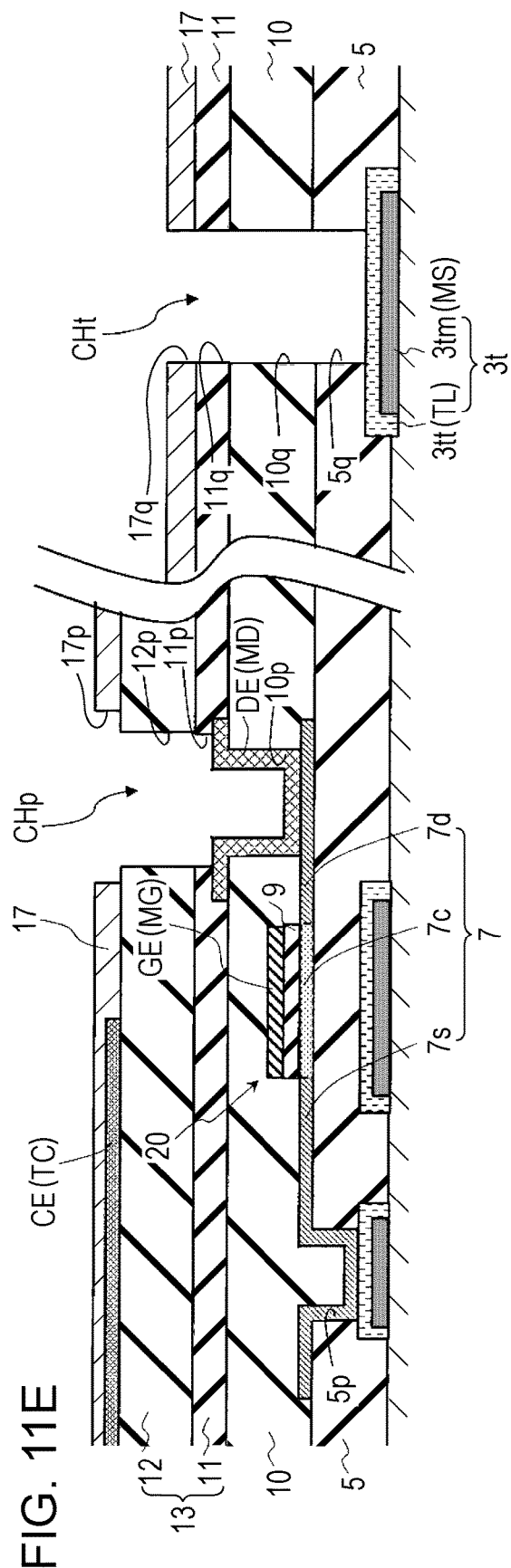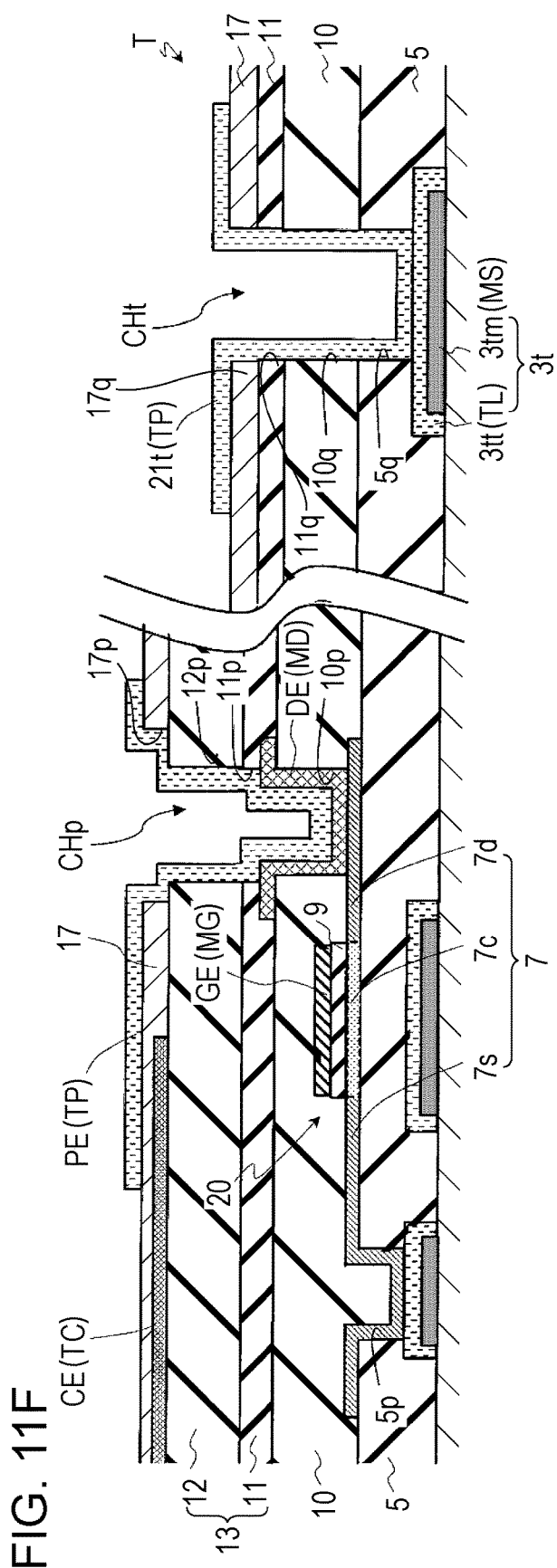

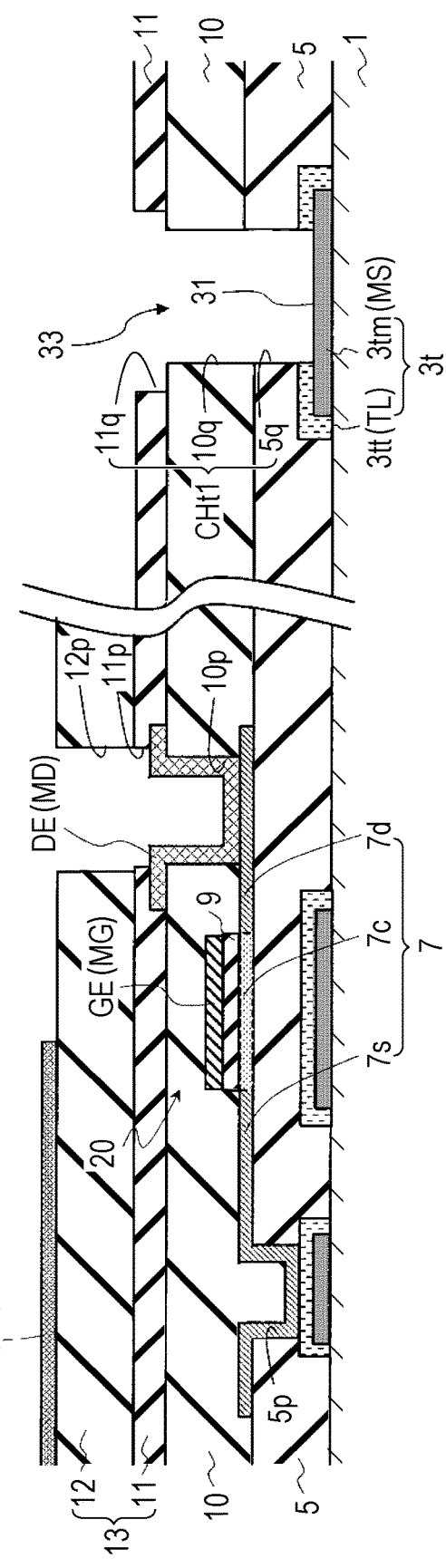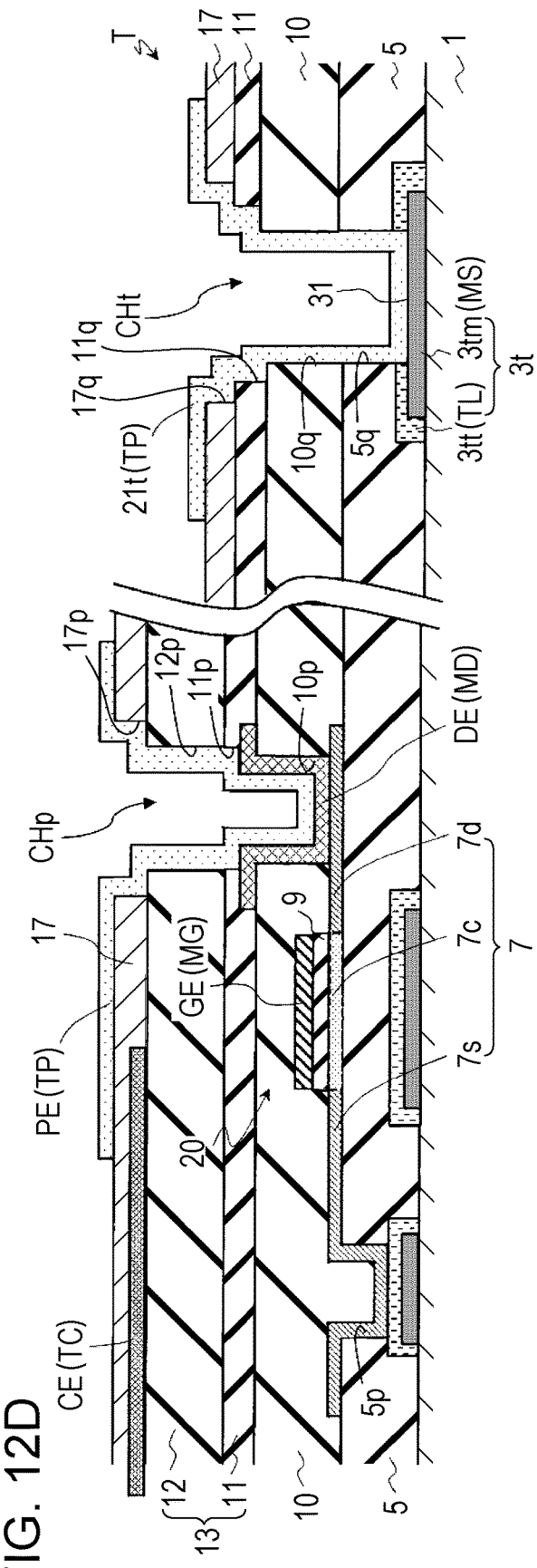

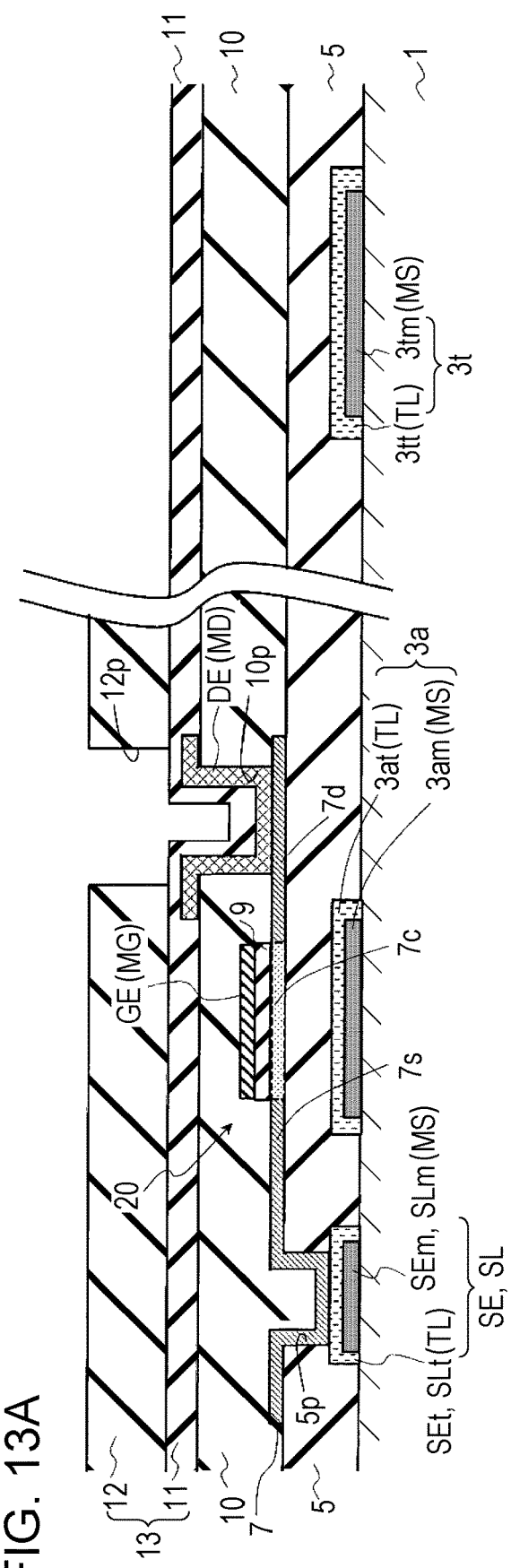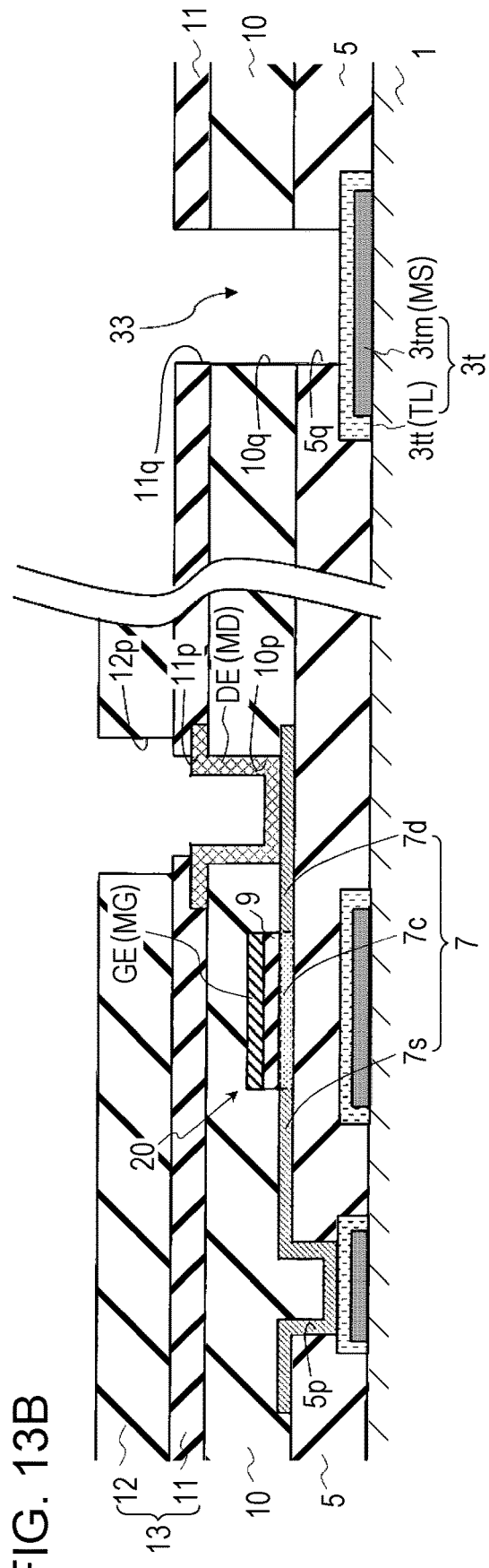

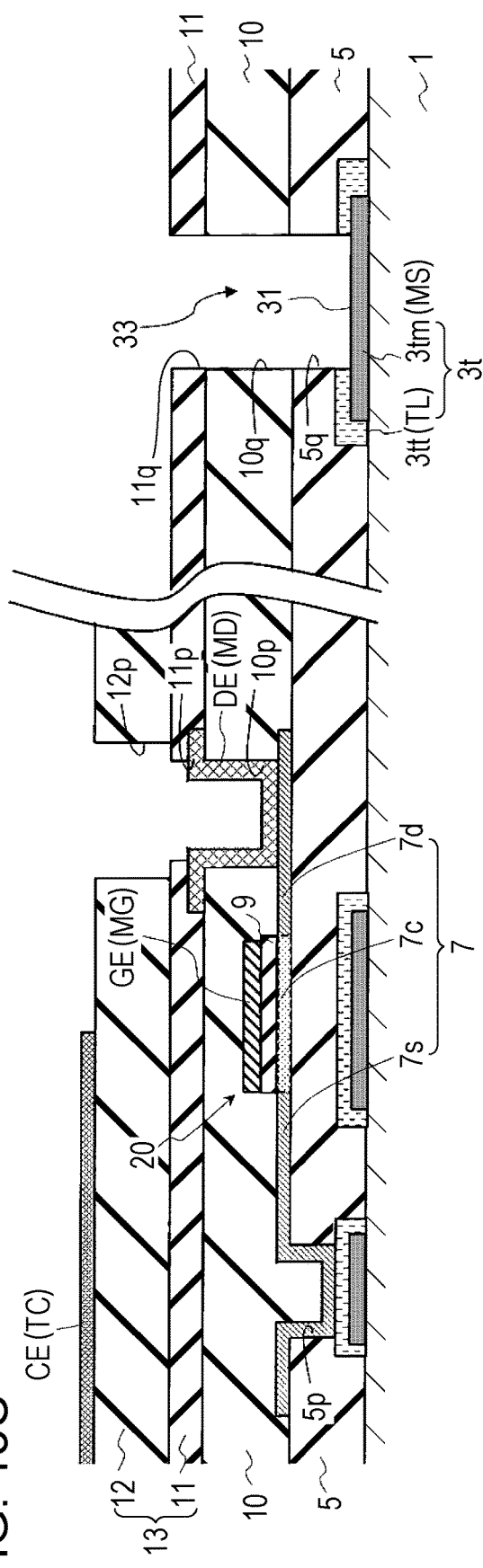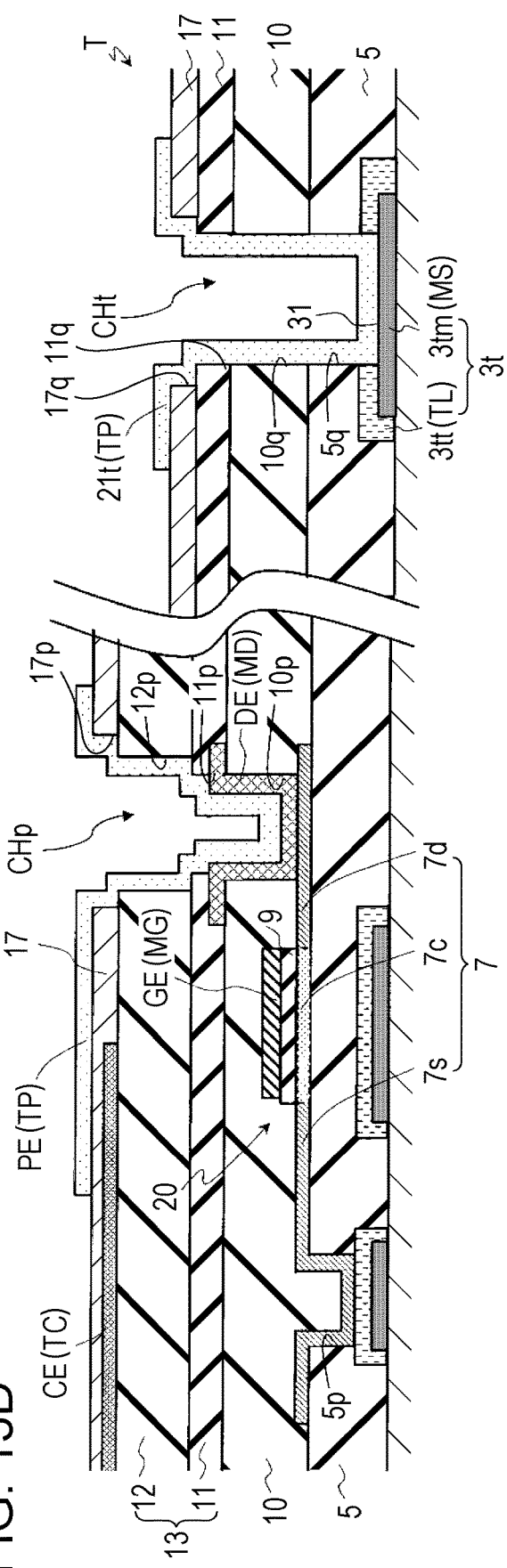

ACTIVE MATRIX SUBSTRATE AND MANUFACTURING METHOD THEREOF

CROSS-REFERENCE TO RELATED APPLICATION

The present application claims priority from Provisional Application 62/852,658, the content to which is hereby incorporated by reference into this application.

BACK GROUND OF THE INVENTION

1. Field of the Invention

The present invention relates to an active matrix substrate and a manufacturing method thereof.

2. Description of the Related Art

A display device including an active matrix substrate provided with a switching element for each pixel is widely used. An active matrix substrate including a thin film transistor (TFT) as a switching element is called a TFT substrate. In addition, in the present specification, a part of the TFT substrate that corresponds to the pixel of the display device is referred to as a pixel region or a pixel. In addition, a TFT provided as a switching element in each pixel of the active matrix substrate is called a "pixel TFT".

A plurality of source bus lines and a plurality of gate bus lines are provided on the TFT substrate, and the pixel TFTs are arranged in the vicinity of intersections of the lines. A source electrode of the pixel TFT is connected to one of the source bus lines, and a gate electrode is connected to one of the gate bus lines. Therefore, usually, the source electrode is formed in the same metal layer (source metal layer) as the source bus line, and the gate electrode is formed in the same metal layer (gate metal layer) as the gate bus line.

The TFT substrate is provided with a wiring connection unit for connecting (or changing over) a wiring formed in the source metal layer or the gate metal layer to another wiring. The wiring connection unit includes, for example, a terminal unit, a source-gate connection unit that connects the source metal layer and the gate metal layer to each other, and the like.

In recent years, it has been proposed to use an oxide semiconductor instead of amorphous silicon or polycrystalline silicon as a material for an active layer of a TFT. Such a TFT is referred to as an "oxide semiconductor TFT". The oxide semiconductor has higher mobility than that of amorphous silicon. Therefore, the oxide semiconductor TFT can operate at higher speed than the amorphous silicon TFT. Further, since an oxide semiconductor film is formed by a more convenient process than a polycrystalline silicon film, the film can be applied to an apparatus that requires a large area.

Most of the oxide semiconductor TFTs are bottom-gate type TFT, but top-gate type oxide semiconductor TFTs have also been proposed. For example, Japanese Unexamined Patent Application Publication No. 2015-109315 discloses a top-gate type TFT in which a gate electrode is disposed over a part of an oxide semiconductor layer with a gate insulating layer in between, and a source and drain electrodes are disposed on an insulating layer that covers the gate electrode.

Meanwhile, International Publication No. 2015/186619 by the present applicant has proposed a substrate structure (hereinafter, referred to as a "lower source structure") in which a source electrode and a source bus line are provided on a substrate side of a gate bus line and an oxide semiconductor layer of an oxide semiconductor TFT. According to the TFT substrate (hereinafter, abbreviated as "lower source structure substrate") having the lower source structure, since an insulating layer positioned between the source bus line and the gate bus line can be made thicker, it is possible to reduce the parasitic capacitance generated in the intersection of the bus lines.

SUMMARY OF THE INVENTION

International Publication No. 2015/186619 does not disclose a specific structure of a wiring connection unit such as a terminal unit formed on a lower source structure substrate.

According to the study by the present inventors, in the process of manufacturing the lower source structure substrate, there is a concern that the surface of a source metal layer is damaged. Therefore, there is a case where it becomes difficult to form a low-resistance wiring connection unit using the source metal layer. Details will be described later.

In addition, an active matrix substrate having a bottom-gate type TFT generally has a structure (lower gate structure substrate) in which the gate metal layer is disposed on a substrate side of the source bus line and the oxide semiconductor layer of the TFT. Even in the lower gate structure substrate, there is a case where it is difficult to form a low-resistance wiring connection unit using the gate metal layer due to the process damage to the gate metal layer.

One embodiment of the present invention provides an active matrix substrate including an oxide semiconductor TFT and a wiring connection unit, and capable of suppressing an increase in contact resistance of the wiring connection unit.

The present specification discloses an active matrix substrate and manufacturing method thereof described in the following items.

[Item 1]

According to an aspect of the invention, there is provided an active matrix substrate including: a display region including a plurality of pixel regions, and a non-display region other than the display region; a substrate; a plurality of lower bus lines and a plurality of upper bus lines which are supported on a main surface of the substrate, in which the plurality of lower bus lines are positioned closer to the substrate than the plurality of upper bus lines, one of the plurality of lower bus lines and the plurality of upper bus lines is a plurality of source bus lines, and another of the plurality of lower bus lines and the plurality of upper bus lines is a plurality of gate bus lines; a lower insulating layer positioned between the plurality of lower bus lines and the plurality of upper bus lines; an oxide semiconductor TFT positioned in each of the plurality of pixel regions and including an oxide semiconductor layer disposed on the lower insulating layer, a gate electrode electrically connected to corresponding one of the plurality of gate bus lines, a gate insulating layer positioned between the oxide semiconductor layer and the gate electrode, and a source electrode electrically connected to corresponding one of the plurality of source bus lines; a pixel electrode disposed in each of the plurality of pixel regions; and a plurality of wiring connection units disposed in the non-display region, in which the oxide semiconductor layer includes a channel region and a first region and a second region positioned on both sides of the channel region, the first region is electrically connected to the source electrode, and the second region is electrically connected to the pixel electrode, in which each of the plurality of wiring connection units includes a lower conductive layer formed using a conductive film identical with a conductive film of the plurality of lower bus lines, an insulating layer that extends on the lower conductive layer and includes the lower insulating layer, and has a first opening portion that exposes a part of the lower conductive layer, and another conductive layer connected to the lower conductive layer in the first opening portion, and in which the plurality of lower bus lines and the lower conductive layer have a first laminated structure including a metal layer and a transparent conductive layer that covers an upper surface and a side surface of the metal layer.

[Item 2]

In the active matrix substrate according to Item 1, the other conductive layer may be in direct contact with the transparent conductive layer of the lower conductive layer in the first opening portion.

[Item 3]

In the active matrix substrate according to Item 1, the transparent conductive layer of the lower conductive layer may have an opening portion that exposes only a part of the upper surface of the metal layer in the first opening portion, and the other conductive layer may be in direct contact with the part exposed at the opening portion of the transparent conductive layer on the upper surface of the metal layer in the first opening portion.

[Item 4]

In the active matrix substrate according to any one of Items 1 to 3, the plurality of lower bus lines may be the plurality of source bus lines and the plurality of upper bus lines may be the plurality of gate bus lines, and the gate electrode of the oxide semiconductor TFT may be disposed on the oxide semiconductor layer with the gate insulating layer in between.

[Item 5]

In the active matrix substrate according to Item 4, the source electrode may be a part of the corresponding one of the source bus lines or may be connected to the corresponding one of the source bus lines, the source electrode may have the first laminated structure, and the oxide semiconductor layer may be formed on the lower insulating layer and in a source opening portion formed in the lower insulating layer, and is in contact with the transparent conductive layer of the source electrode in the source opening portion.

[Item 6]

In the active matrix substrate according to Item 5, an interlayer insulating layer that covers the oxide semiconductor layer and the gate electrode may further be provided, the oxide semiconductor TFT may further include a drain electrode, the drain electrode may be disposed on the interlayer insulating layer and in a drain opening portion formed in the interlayer insulating layer, and may be connected to the second region of the oxide semiconductor layer in the drain opening portion, the pixel electrode may be electrically connected to the oxide semiconductor TFT via the drain electrode, and, in each of the plurality of wiring connection units, the first opening portion may be formed in the insulating layer including the lower insulating layer and an interlayer insulating layer.

[Item 7]

In the active matrix substrate according to Item 6, a side surface of the lower insulating layer and a side surface of the interlayer insulating layer may be aligned in the first opening portion.

[Item 8]

In the active matrix substrate according to Item 6 or 7, the other conductive layer may be a connection unit formed of a conductive film identical with a conductive film of the drain electrode, and each of the plurality of wiring connection units may further include an upper conductive layer disposed on the other conductive layer.

[Item 9]

In the active matrix substrate according to any one of Items 6 to 8, the other conductive layer in each of the plurality of wiring connection units may be an upper conductive layer formed of a transparent conductive film identical with a transparent conductive film of the pixel electrode, and in each of the plurality of wiring connection units, the upper conductive layer may be in direct contact with the lower conductive layer in the first opening portion.

[Item 10]

In the active matrix substrate according to Item 9, an upper insulating layer that covers the oxide semiconductor TFT; a common electrode disposed on the upper insulating layer; and a dielectric layer positioned between the common electrode and the pixel electrode may further be provided, and in each of the plurality of wiring connection units, the first opening portion may be formed in an insulating layer including the lower insulating layer, the interlayer insulating layer, the upper insulating layer, and the dielectric layer, and in the first opening portion, a side surface of the lower insulating layer, a side surface of the interlayer insulating layer, a side surface of the upper insulating layer, and a side surface of the dielectric layer may be aligned.

[Item 11]

In the active matrix substrate according to any one of Items 1 to 5, the other conductive layer in each of the plurality of wiring connection units may be an upper conductive layer formed of a transparent conductive film identical with a transparent conductive film of the pixel electrode, and in each of the plurality of wiring connection units, the upper conductive layer may be in direct contact with the lower conductive layer in the first opening portion.

[Item 12]

In the active matrix substrate according to any one of Items 1 to 11, the metal layer in the first laminated structure may contain Cu, Mo, or Al.

[Item 13]

In the active matrix substrate according to any one of Items 1 to 12, the transparent conductive layer in the first layer laminated structure may contain indium tin oxide, indium zinc oxide, zinc oxide, or tin oxide.

[Item 14]

In the active matrix substrate according to any one of Items 1 to 13, in the first laminated structure, a thickness $d1$ of a part of the transparent conductive layer positioned on the upper surface of the metal layer may be 20 nm or more and 120 nm or less, and a thickness $d2$ of a part of the transparent conductive layer positioned on the side surface of the metal layer may be different from the thickness of the part positioned on the upper surface and may be 20 nm or more and 120 nm or less.

[Item 15]

In the active matrix substrate according to any one of Items 1 to 14, the oxide semiconductor layer includes an In—Ga—Zn—O-based semiconductor.

[Item 16]

In the active matrix substrate according to Item 15, the In—Ga—Zn—O-based semiconductor may include a crystalline portion.

[Item 17]

According to another aspect of the invention, there is provided a manufacturing method of an active matrix substrate including a display region including a plurality of pixel regions, and a non-display region other than the display region, a plurality of lower bus lines and a plurality of upper bus lines, an oxide semiconductor TFT disposed in each of the pixel regions, and a plurality of wiring connection units disposed in the non-display region, in which one of the plurality of lower bus lines and the plurality of upper bus lines is a plurality of source bus lines and another of the plurality of lower bus lines and the plurality of upper bus lines is a plurality of gate bus lines, the method including: (a) a step of forming a first conductive film on a substrate; (b1) a step of forming a first resist layer on the first conductive film using a first photomask, and forming a first metal layer that is a part of the plurality of lower bus lines and a second metal layer that is a part of a lower conductive layer of the plurality of wiring connection units, from the first conductive film by performing patterning of the first conductive film using the first resist layer as a mask; (b2) a step of forming a lower transparent conductive film so as to cover the first metal layer and the second metal layer; (c) a step of forming a second resist layer on the lower transparent conductive film using the first photomask again, and forming a first transparent conductive layer that covers at least a part of an upper surface of the first metal layer and a second transparent conductive layer that covers at least a part of an upper surface of the second metal layer, from the lower transparent conductive film by performing patterning of the lower transparent conductive film using the second resist layer as a mask, in which the plurality of lower bus lines having a laminated structure including the first metal layer and the first transparent conductive layer and a lower conductive layer having a laminated structure including the second metal layer and the second transparent conductive layer are obtained; (d) a step of forming a lower insulating layer that covers the plurality of lower bus lines and the lower conductive layer; (e) a step of forming an oxide semiconductor film on the lower insulating layer and forming an oxide semiconductor layer that is an active layer of the oxide semiconductor TFT by performing patterning of the oxide semiconductor film; (f) a step of forming a first opening portion that exposes a part of the lower conductive layer, on an insulating layer including the lower insulating layer; and (g) a step of forming another conductive layer in contact with the part of the lower conductive layer in the first opening portion.

[Item 18]

In the manufacturing method of an active matrix substrate according to Item 17, in the step (c), the first transparent conductive layer may cover the upper surface and a side surface of the first metal layer, and the second transparent conductive layer may cover the upper surface and a side surface of the second metal layer.

[Item 19]

In the manufacturing method of an active matrix substrate according to Item 17 or 18, the plurality of lower bus lines may be the plurality of source bus lines, the method may further include: a step of forming a source opening portion that exposes a part of corresponding one of the source bus lines in the lower insulating layer between the step (d) and the step (e), after the step (e), the method may further include: a step (h) of forming a gate insulating layer and a gate electrode of the oxide semiconductor TFT; a step (i) of forming an interlayer insulating layer that covers the oxide semiconductor layer and the gate electrode; a step (j) of forming a drain opening portion that exposes a part of the oxide semiconductor layer in the interlayer insulating layer; and a step (k) of forming a drain conductive film on the interlayer insulating layer and forming a drain electrode in contact with the part of the oxide semiconductor layer in the drain opening portion by performing patterning of the drain conductive film.

[Item 20]

In the manufacturing method of an active matrix substrate according to Item 19, the step (f) may be a step of forming the first opening portion in an insulating layer including the lower insulating layer and the interlayer insulating layer, which is performed simultaneously with the step (j), and in the step (k), the other conductive layer of each of the wiring connection units may be formed together with the drain electrode by performing patterning of the drain conductive film.

[Item 21]

In the manufacturing method of an active matrix substrate according to Item 19, after the step (k), a step (l) of forming an upper insulating layer on the interlayer insulating layer and the drain electrode; a step of (m) of forming an common electrode transparent conductive film on the upper insulating layer and forming a common electrode by performing patterning of the common electrode transparent conductive film; a step (n) of forming a dielectric layer that covers the common electrode; and a step (o) of forming a pixel electrode transparent conductive film on the dielectric layer and forming pixel electrodes in each pixel region and forming the other conductive layers of each of the wiring connection units by performing patterning of the pixel electrode transparent conductive film may further be provided, and the first opening portion may be formed on the lower insulating layer, the interlayer insulating layer, the upper insulating layer, and the dielectric layer.

[Item 22]

In the manufacturing method of an active matrix substrate according to Item 21, the step (f) may be performed after the step (n), and in the step (f), the first opening portion may be formed by performing patterning of the lower insulating layer, the interlayer insulating layer, the upper insulating layer, and the dielectric layer using the same mask.

[Item 23]

In the manufacturing method of an active matrix substrate according to Item 21, before the step (m), an opening portion that exposes a part of the second transparent conductive layers of the lower conductive layer may be formed on the lower insulating layer, the interlayer insulating layer, and the upper insulating layer, in the step m), a part of the second metal layer may be exposed by performing patterning of the common electrode transparent conductive film and removing the part of the second transparent conductive layer exposed in the first opening portion, and in the step (o), the other conductive layer may be formed so as to be in direct contact with the part of the second metal layer.

[Item 24]

In the manufacturing method of an active matrix substrate according to Items 17 to 23, the transparent conductive layer in the first laminated structure may include indium tin oxide or indium zinc oxide, and in the step (e), the patterning of the oxide semiconductor film may be performed using a PAN-based etchant that contains phosphoric acid, nitric acid, and acetic acid.

[Item 25]

In the manufacturing method according to any one of Items 17 to 24, the oxide semiconductor film may include an In—Ga—Zn—O-based semiconductor.

[Item 26]

In the manufacturing method according to Item 25, the In—Ga—Zn—O-based semiconductor may include a crystalline portion.

One embodiment of the present invention provides an active matrix substrate including an oxide semiconductor TFT and a wiring connection unit, and capable of suppressing an increase in contact resistance of the wiring connection unit.

BRIEF DESCRIPTION OF THE DRAWINGS

FIG. 5A is a step sectional view illustrating a manufacturing method of the active matrix substrate 100.

FIG. 5B is a step sectional view illustrating a manufacturing method of the active matrix substrate 100.

FIG. 5C is a step sectional view illustrating the manufacturing method of the active matrix substrate 100.

FIG. 5D is a step sectional view illustrating the manufacturing method of the active matrix substrate 100.

FIG. 5E is a step sectional view illustrating the manufacturing method of the active matrix substrate 100.

FIG. 5F is a step sectional view illustrating the manufacturing method of the active matrix substrate 100.

FIG. 5G is a step sectional view illustrating the manufacturing method of the active matrix substrate 100.

FIG. 5H is a step sectional view illustrating the manufacturing method of the active matrix substrate 100.

FIG. 6A is a step sectional view illustrating another manufacturing method of the active matrix substrate 100.

FIG. 6B is a step sectional view illustrating another manufacturing method of the active matrix substrate 100.

FIG. 6C is a step sectional view illustrating another manufacturing method of the active matrix substrate 100.

FIG. 9A is a step sectional view illustrating a manufacturing method of the active matrix substrate according to Modification Example 1.

FIG. 9B is a step sectional view illustrating the manufacturing method of the active matrix substrate according to Modification Example 1.

FIG. 9C is a step sectional view illustrating the manufacturing method of the active matrix substrate according to Modification Example 1.

FIG. 9D is a step sectional view illustrating the manufacturing method of the active matrix substrate according to Modification Example 1.

FIG. 9E is a step sectional view illustrating the manufacturing method of the active matrix substrate according to Modification Example 1.

FIG. 9F is a step sectional view illustrating the manufacturing method of the active matrix substrate according to Modification Example 1.

FIG. 11A is a step sectional view illustrating a manufacturing method of the active matrix substrate according to Modification Example 2.

FIG. 11B is a step sectional view illustrating the manufacturing method of the active matrix substrate according to Modification Example 2.

FIG. 11C is a step sectional view illustrating the manufacturing method of the active matrix substrate according to Modification Example 2.

FIG. 11D is a step sectional view illustrating the manufacturing method of the active matrix substrate according to Modification Example 2.

FIG. 11E is a step sectional view illustrating the manufacturing method of the active matrix substrate according to Modification Example 2.

FIG. 11F is a step sectional view illustrating the manufacturing method of the active matrix substrate according to Modification Example 2.

FIG. 12C is a step sectional view illustrating the manufacturing method of the active matrix substrate according to Modification Example 3.

FIG. 12D is a step sectional view illustrating the manufacturing method of the active matrix substrate according to Modification Example 3.

FIG. 13A is a step sectional view illustrating another manufacturing method of the active matrix substrate.

FIG. 13B is a step sectional view illustrating another manufacturing method of the active matrix substrate.

FIG. 13C is a step sectional view illustrating another manufacturing method of the active matrix substrate.

FIG. 13D is a step sectional view illustrating another manufacturing method of the active matrix substrate.

DETAILED DESCRIPTION OF THE INVENTION

The present inventors has studied the manufacturing process of an active matrix substrate having a lower source structure (lower source structure substrate), and have obtained the following knowledge.

Figure 18A:
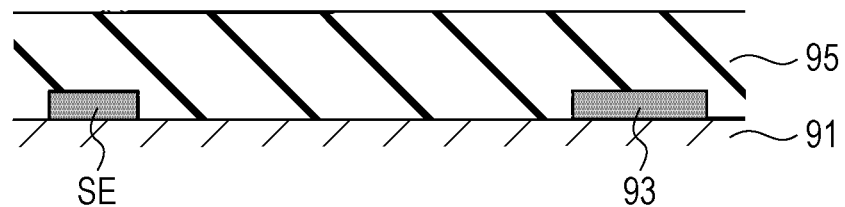
FIG. 18A is a step sectional view illustrating a manufacturing process of a wiring connection unit according to a reference example.
Figure 18B:
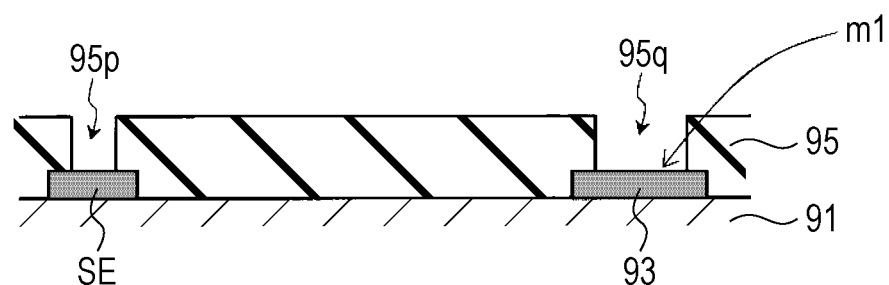
FIG. 18B is a step sectional view illustrating the manufacturing process of the wiring connection unit according to the reference example.
Figure 18C:
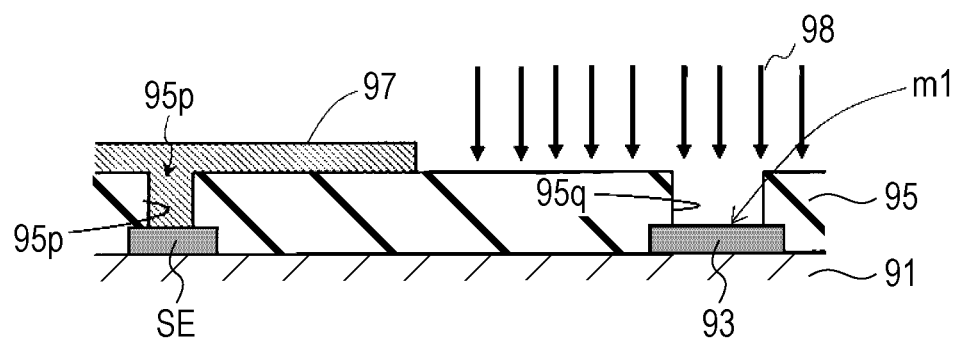
FIG. 18C is a step sectional view illustrating the manufacturing process of the wiring connection unit according to the reference example.

FIGS. 18A to 18C are schematic step sectional views for describing a reference example of a manufacturing process of the lower source structure substrate. Here, a part of a process for manufacturing an oxide semiconductor TFT and a wiring connection unit will be described as an example. The wiring connection unit is formed using the same conductive film as a source bus line.

First, as illustrated in FIG. 18A, a source metal layer including a source bus line, a source electrode SE, and a lower conductive layer 93 that constitutes the wiring connection unit is formed on a substrate 91. Next, a lower insulating layer 95 that covers the source metal layer is formed.

In this step, when the lower insulating layer 95 is formed on the source metal layer, there is a case where plasma treatment is performed. Due to the plasma treatment, the surface of the source metal layer is irradiated with plasma, and there is a possibility that the surface of the source metal layer is damaged. In a case where the source metal layer is, for example, a Cu layer, there is a concern that the source metal layer is oxidized by reacting with the plasma and discolored. When the surface of the source metal layer (in this example, the surface of the lower conductive layer 93 and the surface of the source electrode SE) is damaged, a problem that the contact resistance of the wiring connection unit using the lower conductive layer 93 increases or adhesion to other conductive layers to be formed on the upper layer deteriorates may occur. In addition, there is a concern that the contact resistance between the source electrode SE and an active layer of the TFT increases.

Subsequently, as illustrated in FIG. 18B, an opening portion is formed on the lower insulating layer 95, and the surface of a part of the source metal layer is exposed. In this example, a source opening portion 95p that exposes a part of the source electrode SE and a connection opening portion 95q that exposes a part of the lower conductive layer 93 are formed.

At this time, there is a case where annealing treatment is performed on the lower insulating layer 95 in order to ensure the reliability of the lower insulating layer 95. There is a possibility that annealing causes damage of a surface (in this example, the surface of the lower conductive layer 93) m1 of the source metal layer exposed in the connection opening portion 95q.

Subsequently, as illustrated in FIG. 18C, an oxide semiconductor film (for example, an In—Ga—Zn—O-based semiconductor film) is formed on the lower insulating layer 95, and an oxide semiconductor layer 97 is obtained by performing patterning of the oxide semiconductor film. The oxide semiconductor layer 97 is in contact with the source electrode SE in the source opening portion 95p.

The patterning of the oxide semiconductor film is performed by, for example, wet etching. In this case, the surface m1 of the source metal layer exposed in the connection opening portion 95q is exposed to an etchant 98. As a result, there is a possibility that the exposed surface m1 of the source metal layer deteriorates or the material of the source metal layer is eluted.

As an example, when a PAN-based etchant that contains phosphoric acid, nitric acid, and acetic acid is used as the etchant 98, and a Cu layer is used as a source metal layer (in a case where the source metal layer has a laminated structure, as the uppermost layer), Cu is eluted into the etchant 98 from the exposed surface (exposed surface of the lower conductive layer 93) m1 of the source metal layer. As a result, there is a concern that the contact resistance between the lower conductive layer 93 and the conductive layer formed thereon increases in the wiring connection unit. In addition, as a result of the oxide semiconductor layer 97 being affected by the etchant 98 containing Cu, there is also a case where TFT characteristics deteriorate. Further, in addition to Cu, metal elements such as Al and Mo are also eluted into the PAN-based etchant, a similar problem may occur.

In addition, even in a case where the surface m1 of the source metal layer has resistance to the etchant 98, there is a concern that the etchant 98 deteriorates the surface m1 of the source metal layer.

In this manner, in the lower source structure substrate, the surfaces of the electrodes and wirings formed in the source metal layer are damaged due to various processes, and as a result, there is a case where a wiring connection unit or an oxide semiconductor TFT having desired characteristics cannot be obtained.

Although not illustrated, even in the lower gate structure substrate in which the gate metal layer is provided to be closer to the substrate than the source metal layer, as described above, there is a concern that the electrodes and wirings formed in the gate metal layer are process-damaged. In this specification, there is a case where the metal layer positioned to be closer to the substrate than the TFT active layer among the source metal layer and the gate metal layer is referred to as a "lower metal layer", and a bus line formed on the lower metal layer (source bus line or gate bus line) is referred to as a "lower bus line".

The present inventors has studied based on the above findings, and found that, after performing patterning of the lower metal layer, by covering the side surface and the upper surface thereof with a transparent conductive layer, it is possible to reduce the process damage to the lower metal layer, and the present invention has been made.

In one embodiment of the present invention, the electrodes and wirings such as the lower bus line, the lower conductive layer of the wiring connection unit, or the like, have a laminated structure including a metal layer formed in the lower metal layer and a transparent conductive layer that covers the side surface and the upper surface of the metal layer. By protecting the lower metal layer surface with the transparent conductive layer, it is possible to suppress damage to the lower metal layer surface and elution of the metal element contained in the lower metal layer into the etchant. In addition, by patterning the lower metal layer and the transparent conductive layer separately, for example, even when a disconnection occurs in the lower metal layer, it becomes possible to automatically repair the disconnection by the transparent conductive layer.

First Embodiment

Hereinafter, the active matrix substrate of a first embodiment will be described with reference to the drawings.

Figure 1:
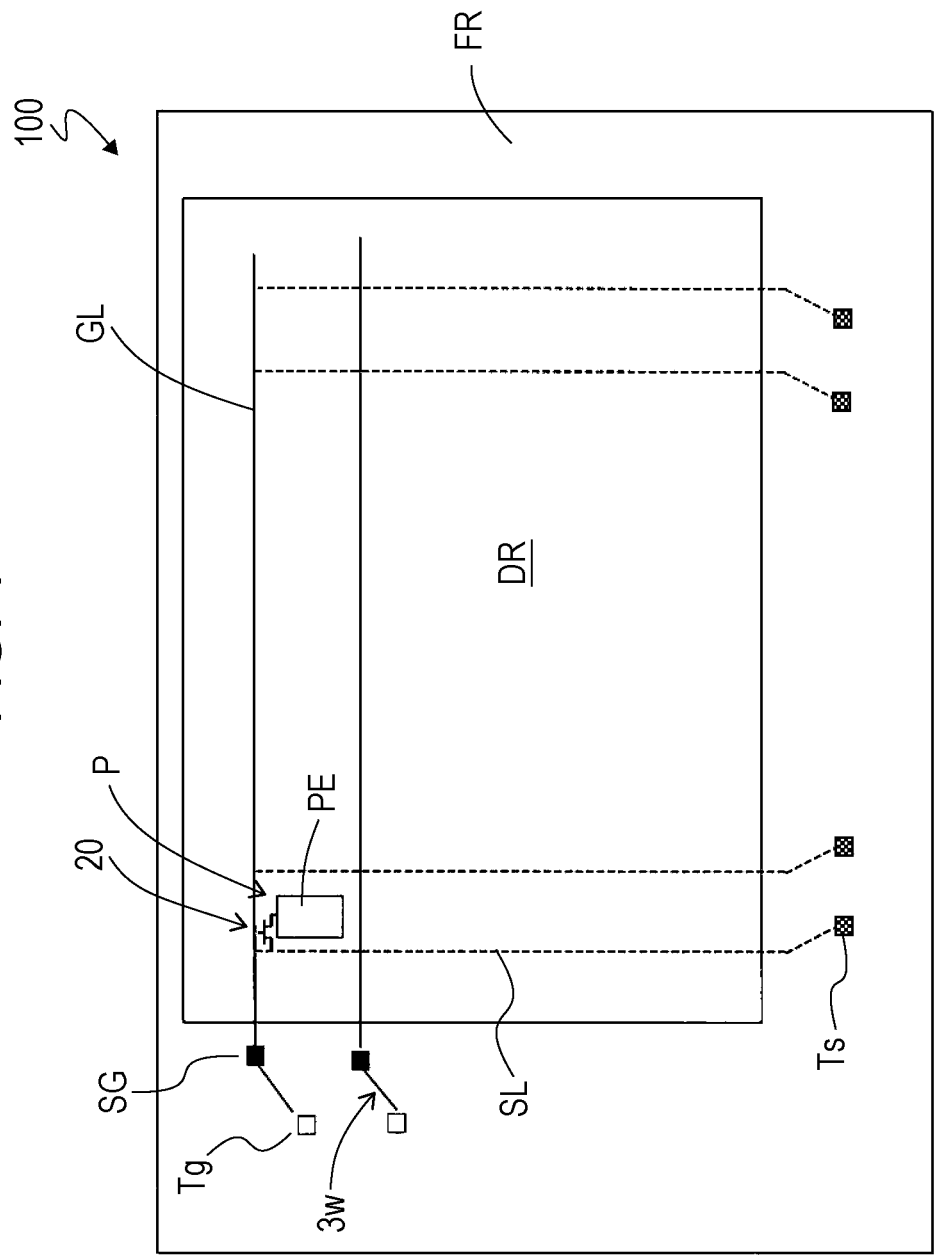
FIG. 1 is a schematic view illustrating an example of a planar structure of an active matrix substrate 100.

FIG. 1 is a schematic view illustrating an example of a planar structure of an active matrix substrate 100. The active matrix substrate 100 has a display region DR that contributes to display and a peripheral region (frame region) FR positioned outside the display region DR.

In the display region DR, a plurality of source bus lines SL that extend in a first direction and a plurality of gate bus lines GL that extend in a second direction intersecting (in this example, orthogonal to) the first direction are provided. Each region surrounded by these bus lines is a "pixel region P". The pixel region P (sometimes referred to as a "pixel") is a region that corresponds to a pixel of a display device. The plurality of pixel regions P are disposed in a matrix. A pixel electrode PE and an oxide semiconductor TFT (hereinafter, simply referred to as "TFT") 20 are formed in association with each pixel region P. The gate electrodes of each TFT 20 are electrically connected to the corresponding gate bus lines GL. Further, a part (first region) of the oxide semiconductor layer of each TFT 20 is electrically connected to the source bus line SL, and another part (second region) is electrically connected to the pixel electrode PE.

Although not illustrated, in a case where the active matrix substrate 100 is applied to a display device in a lateral electric field mode such as a fringe field switching (FFS) mode, the active matrix substrate 100 includes a common electrode that opposes the pixel electrode PE with an insulating layer (dielectric layer) in between.

In the peripheral region FR, wiring connection units such as a plurality of gate terminal units Tg, a plurality of source terminal units Ts, and a plurality of source-gate connection units SG are arranged. Each gate bus line GL is connected to a gate driver (not illustrated) via a corresponding gate terminal unit Tg. Each source bus line SL is connected to a source driver (not illustrated) via a corresponding source terminal unit Ts. The gate driver and the source driver may be formed monolithically on the active matrix substrate 100 or may be mounted.

The source-gate connection unit SG is a reconnection unit formed of a wiring formed in the source metal layer (formed using the same conductive film as the source bus line SL) and a wiring formed in the gate metal layer (formed using the same conductive film as the gate bus line GL). As illustrated in the drawings, the source-gate connection unit SG may be disposed, for example, between each gate bus line GL and a gate terminal unit Tg, and may connect the gate bus line GL to a connection wiring (source connection wiring) 3w formed in the source metal layer. The source connection wiring 3w is connected to the gate driver via the gate terminal unit Tg. In this case, the source terminal unit Ts and the gate terminal unit Tg may have the same structure.

Next, each region of the active matrix substrate 100 of the present embodiment will be described more specifically.

The active matrix substrate 100 has a lower source structure. In other words, the source bus line SL is positioned to be closer to the substrate than the gate bus line GL. The source bus line SL is formed using a metal film (source conductive film) and a transparent conductive film (lower transparent conductive film).

In the following description, a layer formed using the source conductive film is referred to as a "source metal layer MS", and a layer formed on the source metal layer MS so as to be in contact with the source metal layer MS using the lower transparent conductive film is referred to as a "lower transparent conductive layer TL". In addition, a layer formed using the same conductive film as the gate bus line GL (gate conductive film) is referred to as a "gate metal layer MG", a layer formed using the same conductive film (drain conductive film) as the drain electrode of the oxide semiconductor TFT is referred to as a "drain metal layer MD", a layer formed using the same conductive film (first transparent conductive film) as the pixel electrode PE is referred to as a "pixel electrode TP", and a layer formed using the same conductive film (second transparent conductive film) as the common electrode CE is referred to as a "common electrode layer TC".

In the drawings, the reference numbers of each configuration elements may be followed by parentheses to indicate the layer on which the configuration element is formed. For example, an electrode or a wiring formed in the gate metal layer MG may be denoted by "(MG)" after the reference number thereof.

<Pixel Region P>

Hereinafter, the structure of the pixel region P of the active matrix substrate of the present embodiment will be described with reference to the drawings, taking an active matrix substrate applied to an FFS mode display device as an example. The FFS mode is a lateral electric field mode in which a pair of electrodes are provided on one of the substrates and an electric field is applied to liquid crystal molecules in a direction (lateral direction) parallel to the substrate surface.

Figure 2A:
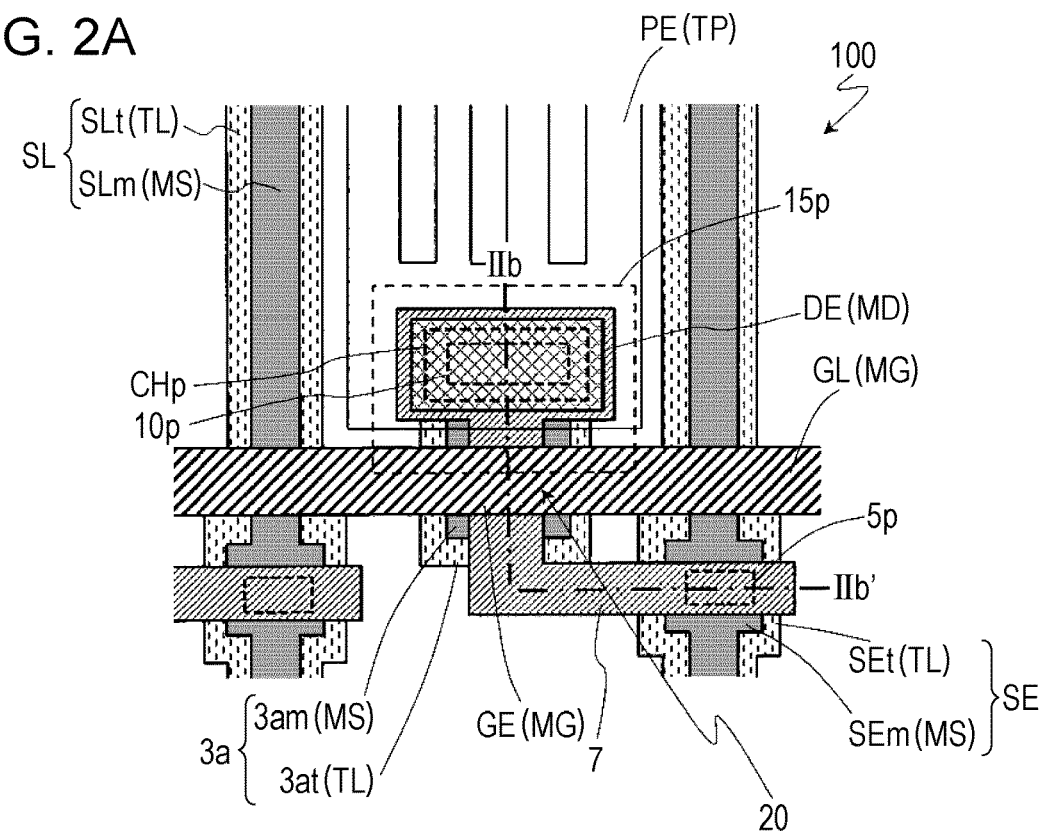
FIG. 2A is a plan view illustrating a pixel region in the active matrix substrate 100 according to a first embodiment.
Figure 2B:
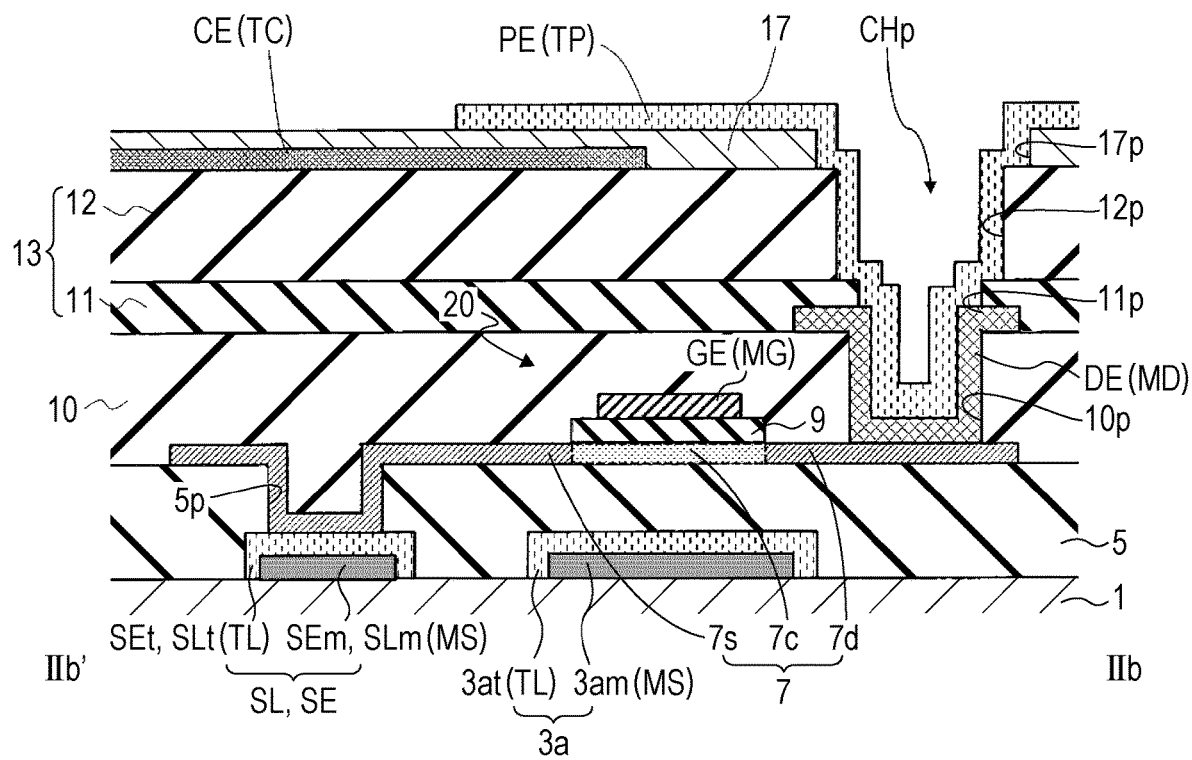
FIG. 2B is a sectional view illustrating the pixel region in the active matrix substrate 100.

FIG. 2A is a plan view illustrating each pixel region P in the active matrix substrate 100, and FIG. 2B is a sectional view of the TFT 20 of the pixel region P taken along line IIb-IIb'.

The active matrix substrate 100 includes a substrate 1, and the plurality of source bus lines SL and the plurality of gate bus lines GL supported on the main surface of the substrate 1. Each pixel region P is defined by one source bus line SL and one gate bus line GL. Each pixel region P has the top-gate type TFT 20, the pixel electrode PE, and the common electrode CE.

As illustrated in FIG. 2B, the active matrix substrate 100 includes, from the substrate 1 side, the source metal layer MS, the lower transparent conductive layer TL that covers the source metal layer MS, a lower interlayer insulating layer 5 that covers the source metal layer MS and the lower transparent conductive layer TL, an oxide semiconductor layer 7, a gate insulating layer 9, the gate metal layer MG, an interlayer insulating layer 10 that covers the gate metal layer MG, and the drain metal layer MD. On the interlayer insulating layer 10 and the drain metal layer MD, an upper insulating layer 13, the common electrode layer TC including the common electrode CE, a dielectric layer 17, and the pixel electrode layer TP including the pixel electrode PE are formed in this order. As will be described later, the common electrode layer TC may be formed on the pixel electrode layer TP with the dielectric layer 17 in between.

The source bus line SL is formed in the source metal layer MS and the lower transparent conductive layer TL. The source bus line SL has a laminated structure including a metal layer SLm formed in the source metal layer MS and a transparent conductive layer SLt that covers the upper surface and the side surface of the metal layer SLm. The active matrix substrate 100 may further include, in addition to the source bus lines SL, electrodes and wirings having a similar laminated structure. In the present specification, such a laminated structure is referred to as a "first laminated structure". As will be described later, the wirings and electrodes having the first laminated structure may be formed by performing the patterning of the source metal layer MS in a first photolithography step, and then by performing patterning of the lower transparent conductive layer TL in a second photolithography step using the same photomask as that of the first photolithography step.

The source bus line SL is covered with the lower insulating layer 5. The lower insulating layer 5 may be in direct contact with the transparent conductive layer SLt and may not be in direct contact with the metal layer SLm.

The TFT 20 includes the oxide semiconductor layer 7 disposed on the lower insulating layer 5 and the gate electrode GE disposed on a part of the oxide semiconductor layer 7 with the gate insulating layer 9 in between.

The oxide semiconductor layer 7 includes a channel region 7c and a first region 7s and a second region 7d arranged on both sides of the channel region 7c. The first region 7s and the second region 7d are low resistance regions having a lower specific resistance than that of the channel region 7c. The gate electrode GE is disposed so as to overlap the channel region 7c when viewed from the normal direction (hereinafter, abbreviated as "normal direction of the substrate 1") of the main surface of the substrate 1. The gate insulating layer 9 may cover the channel region 7c and may not cover the first region 7s and the second region 7d.

The oxide semiconductor layer 7 is disposed on the lower insulating layer 5 and in a source opening portion 5p formed in the lower insulating layer 5. The first region 7s of the oxide semiconductor layer 7 is electrically connected to the corresponding source bus line SL in the source opening portion 5p.

The first region 7s may be electrically connected to the source bus line SL via the source electrode SE. Similar to the source bus line SL, the source electrode SE may have the first laminated structure including a metal layer SEm formed in the source metal layer MS and a transparent conductive layer SEt formed in the lower transparent conductive layer TL. The source electrode SE may be connected to the source bus line SL. For example, when viewed from the normal direction of the substrate 1, the source electrode SE may be formed in an extension unit or a protrusion unit (branch unit) that extends in another direction from a part of the side surface of the source bus line SL that extends in the first direction. The source electrode SE may be a part of the source bus line SL. In such a case, a part of the source bus line SL, which is connected to the first region 7s, may be referred to as a "source electrode SE". In this example, the first region 7s of the oxide semiconductor layer 7 extends so as to overlap a part of the source bus line SL when viewed from the normal direction of the substrate 1. The lower surface of the first region 7s is in direct contact with the transparent conductive layer SEt of the source electrode SE, which is a part of the source bus line SL, in the source opening portion 5p.

The gate electrode GE of the TFT 20 is electrically connected to the corresponding gate bus line GL. The gate electrode GE is formed using the same conductive film (gate conductive film) as the gate bus line GL. The gate electrode GE may be connected to (formed integrally with) the gate bus line GL. For example, when viewed from the normal direction of the substrate 1, the gate electrode GE may be formed in an extension unit or a protrusion unit (branch unit) that extends in another direction from a part of the side surface of the gate bus line GL that extends in the second direction. Alternatively, the gate electrode GE may be a part of the gate bus line GL. In this case, there is a case where a part of the gate bus line GL that overlaps the oxide semiconductor layer 7 when viewed from the normal direction of the substrate 1 is referred to as a "gate electrode GE".

The TFT 20 may include a light shielding layer 3a on the substrate 1 side of the oxide semiconductor layer 7. Similar to the source bus line SL, for example, the light shielding layer 3a may have the first laminated structure including a metal layer 3am and a transparent conductive layer 3at that covers the metal layer 3am. When viewed from the normal direction of the substrate 1, the metal layer 3am of the light shielding layer 3a may be disposed so as to overlap at least the channel region 7c in the oxide semiconductor layer 7. Accordingly, characteristic deterioration of the oxide semiconductor layer 7 due to light (backlight light) from the substrate 1 side can be suppressed.

The interlayer insulating layer 10 is formed so as to cover the oxide semiconductor layer 7, the gate insulating layer 9, and the gate metal layer MG. The interlayer insulating layer 10 may be in contact with the first region 7s and the second region 7d of the oxide semiconductor layer 7. As the interlayer insulating layer 10, a reductive insulating film (for example, a silicon nitride film) that can reduce the oxide semiconductor may be used. In this case, the specific resistance of the part (the first region 7s and the second region 7d) of the oxide semiconductor layer 7, which is in contact with the interlayer insulating layer 10, can be lower than that of the part (channel region 7c) that is not in contact with the interlayer insulating layer 10.

On the interlayer insulating layer 10, the drain metal layer MD including a drain electrode DE of the TFT 20 is formed. The drain electrode DE is disposed on the interlayer insulating layer 10 and in a drain opening portion 10p provided in the interlayer insulating layer 10, and is connected to the second region 7d of the oxide semiconductor layer 7 in the drain opening portion 10p. The drain electrode DE, which is formed using (that is, inside) the drain conductive film, is electrically connected to the pixel electrode PE.

The upper insulating layer 13 is formed on the drain metal layer MD so as to cover the TFT 20. The upper insulating layer 13 includes, for example, an inorganic insulating layer (passivation film) 11. As illustrated in the drawings, the upper insulating layer 13 may have a laminated structure including the inorganic insulating layer 11 and an organic insulating layer 12 formed on the inorganic insulating layer 11. The organic insulating layer 12 may not be formed. Otherwise, the organic insulating layer 12 may be formed only in the display region.

On the upper insulating layer 13, a common electrode CE is formed. The common electrode CE does not have to be separated for each pixel region P. For example, the common electrode CE may have an opening portion 15p in a region (pixel contact region) where the pixel contact hole CHp is formed, and may be formed over the entire pixel region P except for the pixel contact region.

The pixel electrode PE is disposed on the common electrode CE with the dielectric layer 17 in between. The pixel electrode PE is separated for each pixel region P. In each pixel region P, the pixel electrode PE is provided with one or a plurality of slits (opening portions) 19s or notch portions.

The pixel electrode PE is disposed on the dielectric layer 17 and is connected to the second region 7d of the oxide semiconductor layer 7 in the pixel contact hole CHp formed on the upper insulating layer 13 and the dielectric layer 17. In this example, the pixel contact hole CHp is constituted of an opening portion 11p of the inorganic insulating layer 11, an opening portion 12p of the organic insulating layer 12, and an opening portion 17p of the dielectric layer 17.

<Wiring Connection Unit (Terminal Unit T)>

Next, the structure of the wiring connection unit in the present embodiment will be described using the terminal unit as an example.

Figure 3A:
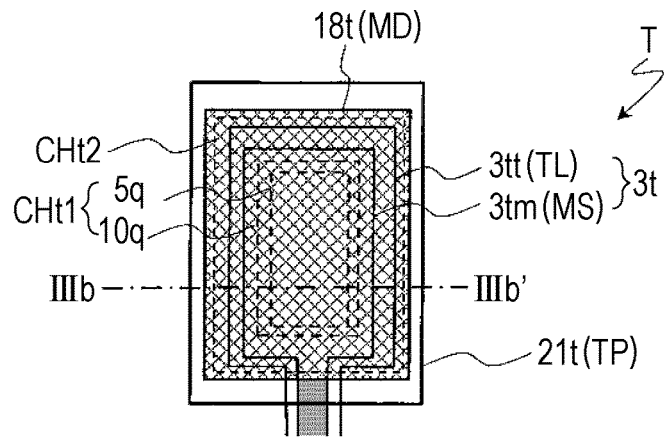
FIG. 3A is a plan view illustrating a terminal unit in the active matrix substrate 100.
Figure 3B:
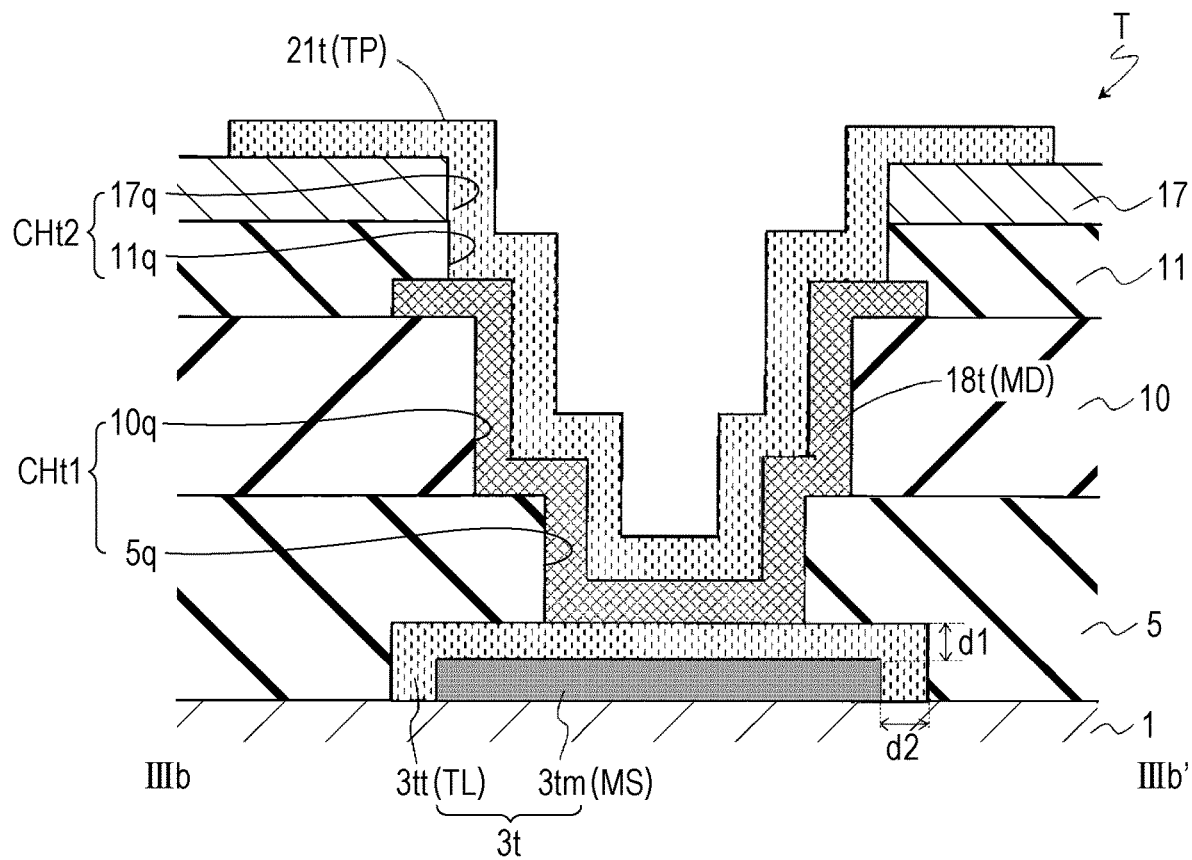
FIG. 3B is a sectional view illustrating the terminal unit in the active matrix substrate 100.

FIG. 3A is a plan view illustrating the source terminal unit Ts and/or the gate terminal unit Tg (hereinafter, collectively referred to as "terminal unit T"). FIG. 3B is a sectional view of the terminal unit T taken along the line IIIb-IIIb'.

The terminal unit T includes a lower conductive layer 3t formed in the source metal layer MS and the lower transparent conductive layer TL, a drain connection layer 18t formed in the drain metal layer MD (that is, by using the drain conductive film), and an upper conductive layer 21t.

The lower conductive layer 3t may have the first laminated structure including a metal layer 3tm formed in the source metal layer MS and a transparent conductive layer 3tt formed in the lower transparent conductive layer TL. The transparent conductive layer 3tt may cover the entire upper surface and side surface of the metal layer 3tm. The lower conductive layer 3t may be an end portion of the source bus line SL (source terminal unit Ts). Otherwise, the lower conductive layer 3t may be an end portion of the source connection wiring 3w connected to the gate bus line GL via the source-gate connection unit SG (gate terminal unit Tg).

On the lower conductive layer 3t, the lower insulating layer 5 and the interlayer insulating layer 10 is extended. In these insulating layers, a lower opening portion CHt1 that exposes a part of the transparent conductive layer 3tt of the lower conductive layer 3t is formed. The lower opening portion CHt1 is constituted of an opening portion 5q formed in the lower insulating layer 5, and an opening portion 10q formed in the interlayer insulating layer 10. The opening portion 5q and the opening portion 10q are arranged so as to at least partially overlap each other.

The drain connection layer 18t is connected to the lower conductive layer 3t in the lower opening portion CHt1.

The drain connection layer 18t is disposed on the interlayer insulating layer 10 and in the lower opening portion CHt1, and the drain connection layer 18t and the lower conductive layer 3t may be in direct contact with each other in the lower opening portion CHt1. In this specification, there is a case where an opening portion formed in the insulating layer including the lower insulating layer 5 is referred to as a "first opening portion", and a conductive layer (in this example, the drain connection layer 18t) that is in contact with the lower conductive layer 3t in the first opening portion is referred to as "another conductive layer".

The drain connection layer 18t is covered with an insulating layer. In this example, the insulating layer includes the inorganic insulating layer 11 and the dielectric layer 17. The organic insulating layer 12 may not be provided to extend to the terminal unit formation region.

An upper opening portion CHt2 that exposes at least a part of the drain connection layer 18t is formed in the insulating layer. In this example, the upper opening portion CHt2 includes an opening portion 11q formed in the inorganic insulating layer 11, and an opening portion 17q formed in the dielectric layer 17. When viewed from the normal direction of the substrate 1, the upper opening portion CHt2 and the lower opening portion CHt1 may at least partially overlap each other. Accordingly, the area required for forming the terminal unit can be reduced.

The upper conductive layer 21t is connected to the drain connection layer 18t on the insulating layer and in the upper opening portion CHt2 formed in the insulating layer. In other words, the upper conductive layer 21t is electrically connected to the lower conductive layer 3t via the drain connection layer 18t. In the terminal unit contact hole CHt, the upper conductive layer 21t and the drain connection layer 18t may be in direct contact with each other.

The upper conductive layer 21t is formed, for example, in the pixel electrode layer TP (that is, by using the first transparent conductive film). The upper conductive layer 21t may be an island-like portion separated from the pixel electrode PE. When the upper conductive layer 21t is formed in the pixel electrode layer TP, there is an advantage that the pixel contact hole CHp and the upper opening portion CHt2 can be simultaneously formed by patterning the inorganic insulating layer 11 and the dielectric layer 17 collectively.

In addition, the upper conductive layer 21t may be formed using another conductive film formed above the inorganic insulating layer 11. For example, the upper conductive layer 21t may be formed in the common electrode layer TC.

Effect

In the present embodiment, in the lower source structure substrate, the electrodes and wirings such as the source bus line SL, the source electrode SE, and the lower conductive layer 3t of the terminal unit have the first laminated structure including the metal layer formed in the source metal layer MS and the transparent conductive layer that is formed in the lower transparent conductive layer TL and covers the metal layer. Such an electrode and wiring structure has the following advantages.

As described above with reference to FIGS. 18A to 18C, in the manufacturing process of the reference example, there is a concern that the surface (metal surface) of the source metal layer is process-damaged.

Specifically, in the step illustrated in FIG. 18A of the reference example, there is a case where the surface of the source metal layer is damaged by the plasma treatment when the lower insulating layer 95 is formed. For example, there is a concern that the metal surface of the source metal layer is oxidized by the plasma treatment, resulting in an increase in electric resistance or a decrease in adhesion to an upper layer. On the other hand, in the present embodiment, since not only the upper surface but also the side surface of the metal layer formed in the source metal layer MS is protected by using the lower transparent conductive layer TL, it is possible to suppress damage of the surface of the metal layer by the plasma treatment. In addition, since the resistance of the material (ITO or the like) of the lower transparent conductive layer TL is unlikely to be increased by the plasma treatment, even when the plasma treatment is performed, an increase in contact resistance of the wiring connection unit can be suppressed.

Still, in the reference example, in the step illustrated in FIG. 18B, there is a problem that the metal surface m1 of the source metal layer MS exposed at the opening portion of the lower insulating layer 95 is melted by an etchant in the etching step of the oxide semiconductor film (for example, PAN-based etchant). On the other hand, in the present embodiment, since the metal surface of the source metal layer MS is covered with the transparent conductive layer, the transparent conductive layer is exposed at the opening portion of the lower insulating layer 5, and the metal surface is not exposed. Therefore, it is possible to suppress the process damage to the metal surface. Furthermore, by using a material having resistance to the PAN-based etchant for the lower transparent conductive layer TL, the metal element of the source metal layer MS is eluted into the etchant and affects the characteristics of the oxide semiconductor layer can be suppressed more effectively.

In this manner, according to the present embodiment, even in a case where a metal element such as Cu, Al, or Mo is used for the source metal layer MS (in a case where the source metal layer MS has a laminated structure, the uppermost layer), the problem caused by the etchant for the oxide semiconductor film are unlikely to occur. Therefore, the degree of freedom in selecting the material and structure of the source metal layer MS, the etchant for the oxide semiconductor film, and the like can be increased.

In the present embodiment, the wirings and electrodes such as the source bus line SL and the lower conductive layer (such as the lower conductive layer 3t) of the wiring connection unit have a redundant structure including a metal layer and a transparent conductive layer. These wirings and electrodes are formed, for example, by forming the transparent conductive layer by performing the patterning of the lower transparent conductive layer TL separately, for example, after forming the metal layer by patterning the source metal layer MS. Therefore, even when a disconnection occurs in the metal layer (for example, the Cu layer), automatic correction is possible by the transparent conductive layer.

The source metal layer MS may have, for example, a single-layer structure including a metal layer (including an alloy layer) containing Cu, Al, or Mo, and may have a laminated structure in which the metal layer containing Cu, Al, or Mo is the uppermost layer. Specifically, the source metal layer MS may have a laminated structure including a lower layer such as a Ti layer and an upper layer such as a Cu layer and an Al layer (Cu/Ti structure, Al/Ti structure). Otherwise, a single layer such as a Cu layer and an Al layer may be used.

In addition, a layer (for example, a Ti layer) having resistance to the PAN-based etchant may be provided as the uppermost layer of the source metal layer MS. For example, the source metal layer MS may have a Ti/Cu/Ti structure. However, it is difficult to collectively pattern the laminated film having the Ti/Cu/Ti structure by wet etching, and there is a case where it is necessary to separately dry-etch only the Ti film. On the other hand, according to the present embodiment, even when the Ti layer is not provided as the upper layer of the source metal layer MS, the elution of Cu or Al into the etchant can be suppressed by the lower transparent conductive layer TL.

As a material of the lower transparent conductive layer TL, a known metal oxide such as indium tin oxide (ITO), indium zinc oxide, zinc oxide (ZnO), and tin oxide ($SnO_2$) can be used. The material of the lower transparent conductive layer TL preferably has resistance to an etchant used for patterning the oxide semiconductor film. In a case of using the PAN-based etchant, indium tin oxide (ITO), indium zinc oxide, or the like may be used.

The patterning of the source metal layer MS and the lower transparent conductive layer TL can be performed using the same photomask. Accordingly, since the number of photomasks does not need to be increased, an increase in manufacturing cost can be suppressed. For example, as will be described later, using a first photomask, after performing the patterning of the source metal layer MS by a known photolithography step, the patterning of the lower transparent conductive layer TL may be performed using the same photomask (first photomask). By performing the patterning of the lower transparent conductive layer TL under conditions that cause under-etching, a transparent conductive layer that covers the metal layer in the source metal layer MS can be formed.

In the first laminated structure, the thickness (a distance between the upper surface of the metal layer and the upper surface of the transparent conductive layer, along the normal direction of the substrate 1) d1 of a part of the transparent conductive layer, which is positioned on the upper surface of the metal layer, depends on the thickness of the lower transparent conductive film, and is, for example, 20 nm or more and 120 nm or less. Meanwhile, a thickness (a distance between the side surface of the metal layer and the side surface of the transparent conductive layer within a surface parallel to the main surface of the substrate 1) d2 of a part of the transparent conductive layer, which is positioned on the side surface of the metal layer is, for example, 20 nm or more and 120 nm or less. The thickness d2 may be the same as the thickness d1, or may be different from the thickness d1. The thickness d2 can be adjusted, for example, by etching conditions. The thickness d2 may be smaller than the thickness d1. Otherwise, in order to more reliably cover the entire side surface of the metal layer (more reliably prevent damage to the side surface of the metal layer) and to prevent cracks in the transparent conductive layer (lower transparent conductive layer), the etching conditions may be set such that the thickness d2 is larger than the thickness d1 (for example, 20 nm or more).

In addition, in a case where the metal layer and the transparent conductive layer are simultaneously patterned (using the same resist mask), there is a concern that the disconnection occurs across these two layers. Further, since the side surface of the metal layer cannot be protected by the transparent conductive layer, there is a concern that the side surface of the metal layer is damaged by the plasma treatment or the like. On the other hand, according to the present embodiment, by patterning the metal layer and the transparent conductive layer separately, even when the disconnection occurs in one of the metal layer and the transparent conductive layer, the other one can compensate the disconnection. In addition, not only the upper surface but also the side surface of the metal layer can be protected by the transparent conductive layer, and damage to the metal layer (for example, discoloration or deterioration due to oxidation) can be effectively suppressed.

<Other Wiring Connection Unit (Source-gate Connection Unit)>

The active matrix substrate 100 may further include the source-gate connection unit SG in addition to the terminal unit T as a wiring connection unit.

Figure 4:
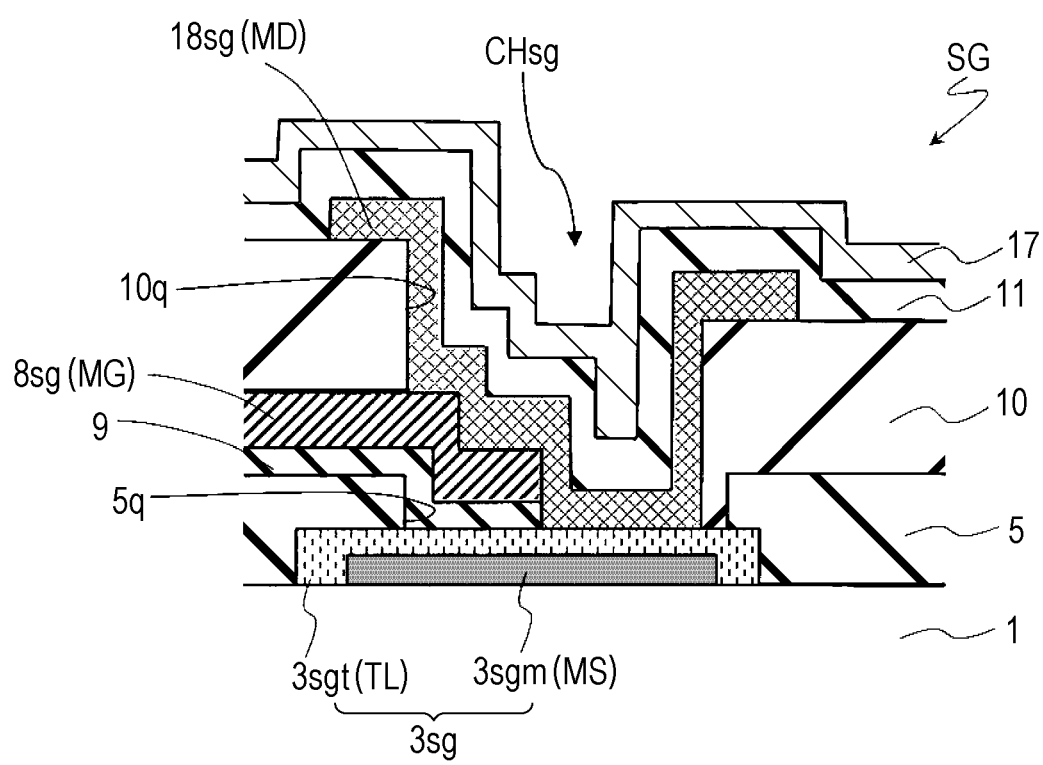
FIG. 4 is a sectional view illustrating a source-gate connection unit in the active matrix substrate 100.

FIG. 4 is a sectional view illustrating the source-gate connection unit SG.

The source-gate connection unit SG is a connection unit that electrically connects another lower conductive layer 3sg formed in the source metal layer MS and the lower transparent conductive layer TL and a gate conductive unit 8sg formed in the gate metal layer MG, to each other. The gate conductive portion 8sg may be a part of the gate bus line GL. Another lower conductive layer 3sg may be a part of the source connection wiring 3w that connects the gate bus line GL and the gate terminal unit Tg to each other.

The source-gate connection unit SG includes another lower conductive layer 3sg, the lower insulating layer 5 that extends on the other lower conductive layer 3sg, and another drain connection layer 18sg formed on the drain metal layer MD.

The other lower conductive layer 3sg has the first laminated structure including the metal layer 3sgm formed in the source metal layer MS and a transparent conductive layer 3sgt formed in the lower transparent conductive layer TL. The transparent conductive layer 3sgt may cover the upper surface and the side surface of the metal layer 3sgm.

The lower insulating layer 5 has the opening portion 5q that exposes a part of another lower conductive layer 3sg. The gate insulating layer 9 is disposed to cover only a part (first part) of the part exposed at the opening portion 5q in the other lower conductive layer 3sg. On the first part, the gate conductive unit 8sg is disposed with the gate insulating layer 9 in between. The interlayer insulating layer 10 extends on the gate conductive portion 8sg. In the interlayer insulating layer 10, the opening portion 10q that exposes a part of the gate conductive unit 8sg and at least a part of a second part of the other lower conductive layer 3sg, which is not covered with the gate interlayer insulating layer 9. The opening portion 10q and the opening portion 5q at least partially overlap each other, an SG contact hole CHsg is formed.

Another drain connection layer 18sg is disposed on the interlayer insulating layer 10 and in the SG contact hole CHsg. The other drain connection layer 18sg is connected to (here, in direct contact with) the gate conductive unit 8sg and the transparent conductive layer 3sgt of the other lower conductive layer 3sg in the SG contact hole CHsg.

On the other drain connection layer 18sg, an insulating layer (here, the inorganic insulating layer 11 and the dielectric layer 17) extends. The organic insulating layer 12 may not extend.

In this example, a connection layer (another drain connection lip 18sg) for connecting the other lower conductive layer 3sg and the gate conductive unit 8sg to each other is formed in the drain metal layer MD, but may be formed in the other conductive layer such as the pixel electrode layer TP.

<Manufacturing Method of Active Matrix Substrate 100>

Next, an example of a manufacturing method of the active matrix substrate 100 will be described with reference to the drawings.

Figure 5I:
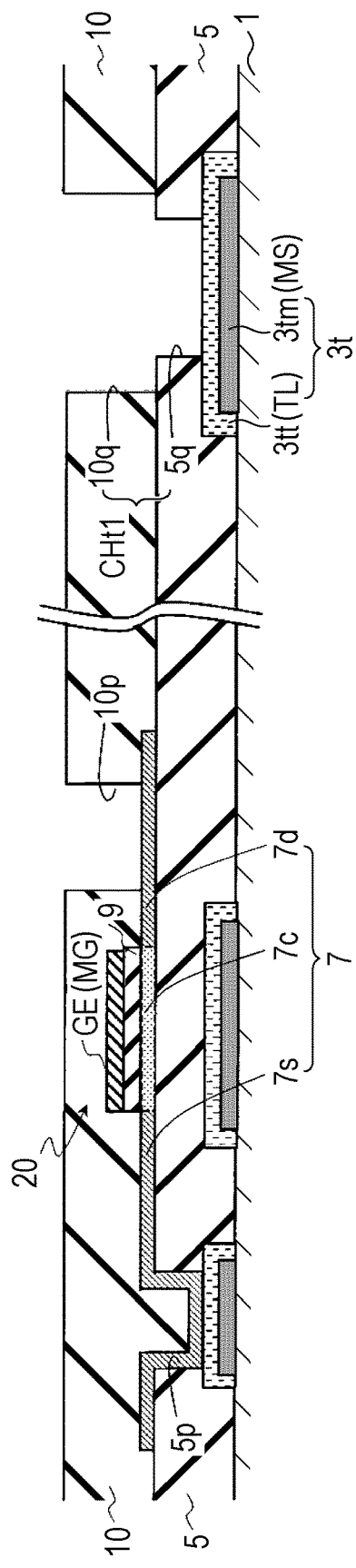
FIG. 5I is a step sectional view illustrating the manufacturing method of the active matrix substrate 100.
Figure 5J:
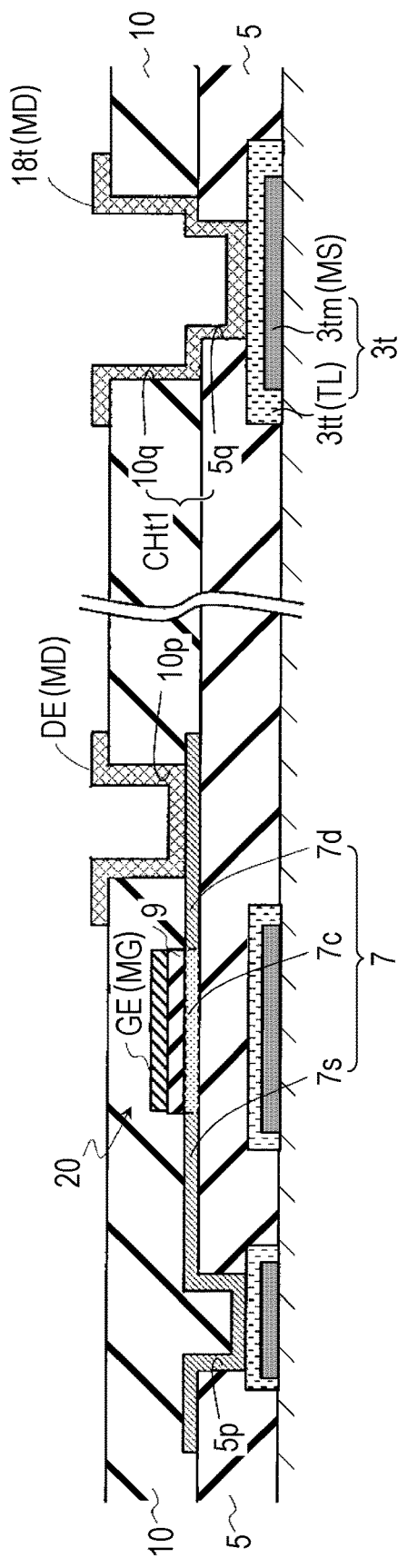
FIG. 5J is a step sectional view illustrating the manufacturing method of the active matrix substrate 100.
Figure 5K:
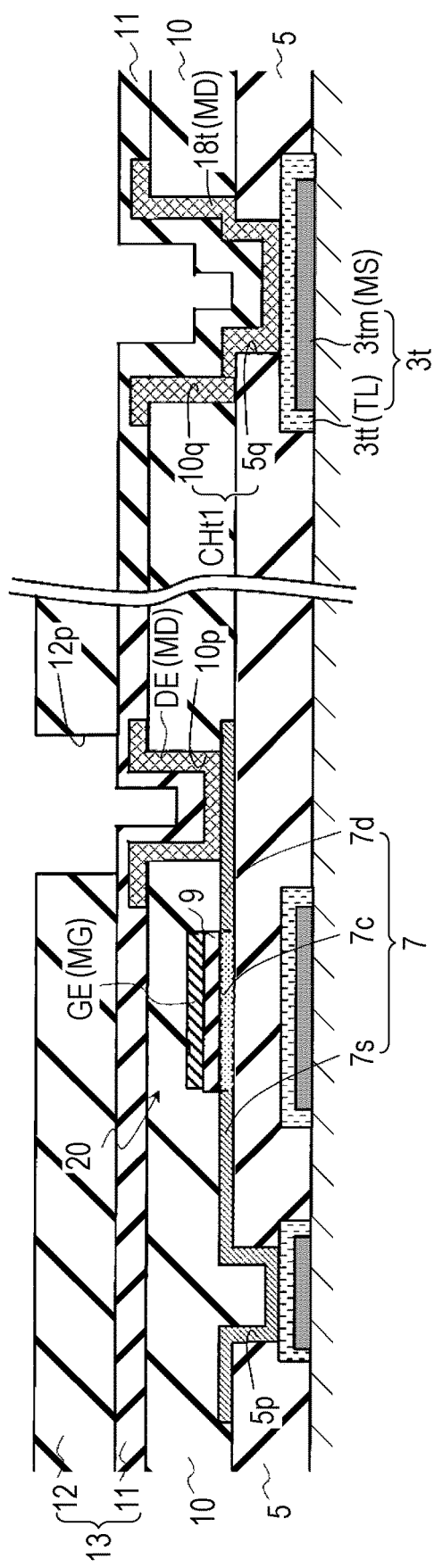
FIG. 5K is a step sectional view illustrating the manufacturing method of the active matrix substrate 100.
Figure 5L:
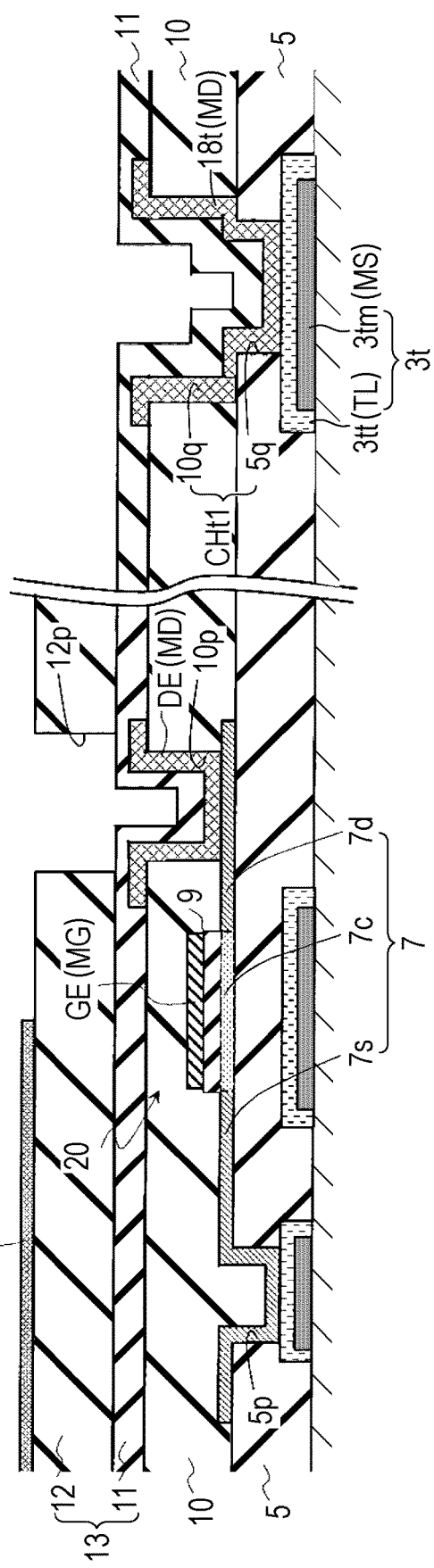
FIG. 5L is a step sectional view illustrating the manufacturing method of the active matrix substrate 100.
Figure 5M:
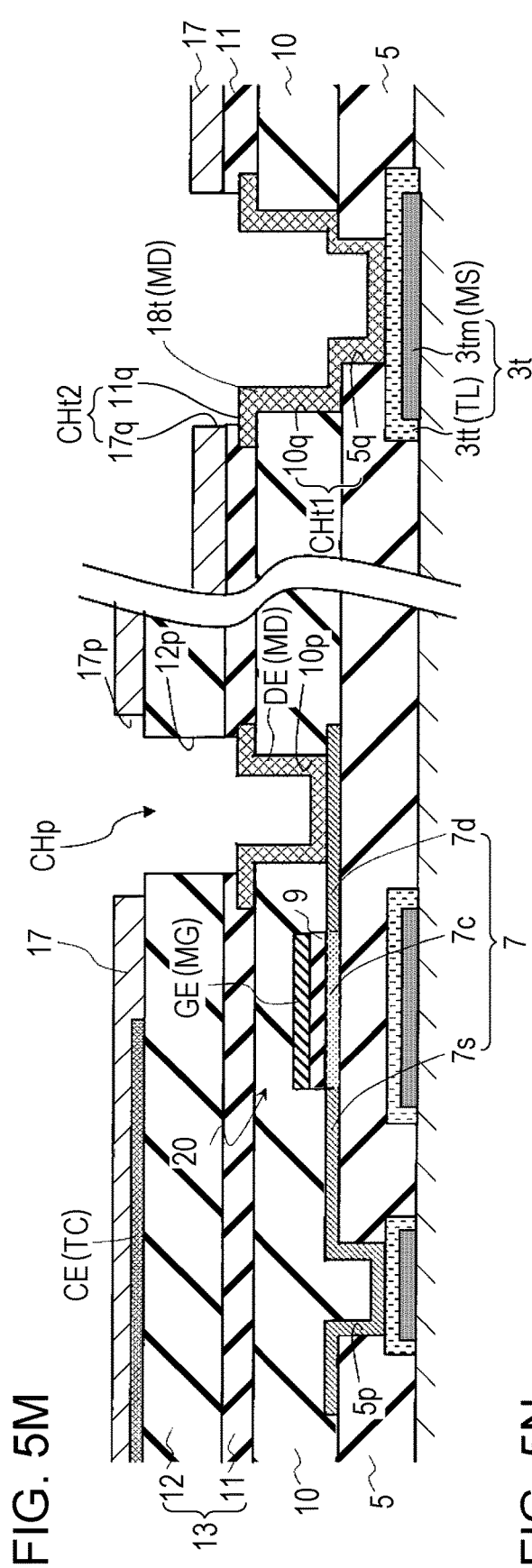
FIG. 5M is a step sectional view illustrating the manufacturing method of the active matrix substrate 100.
Figure 5N:
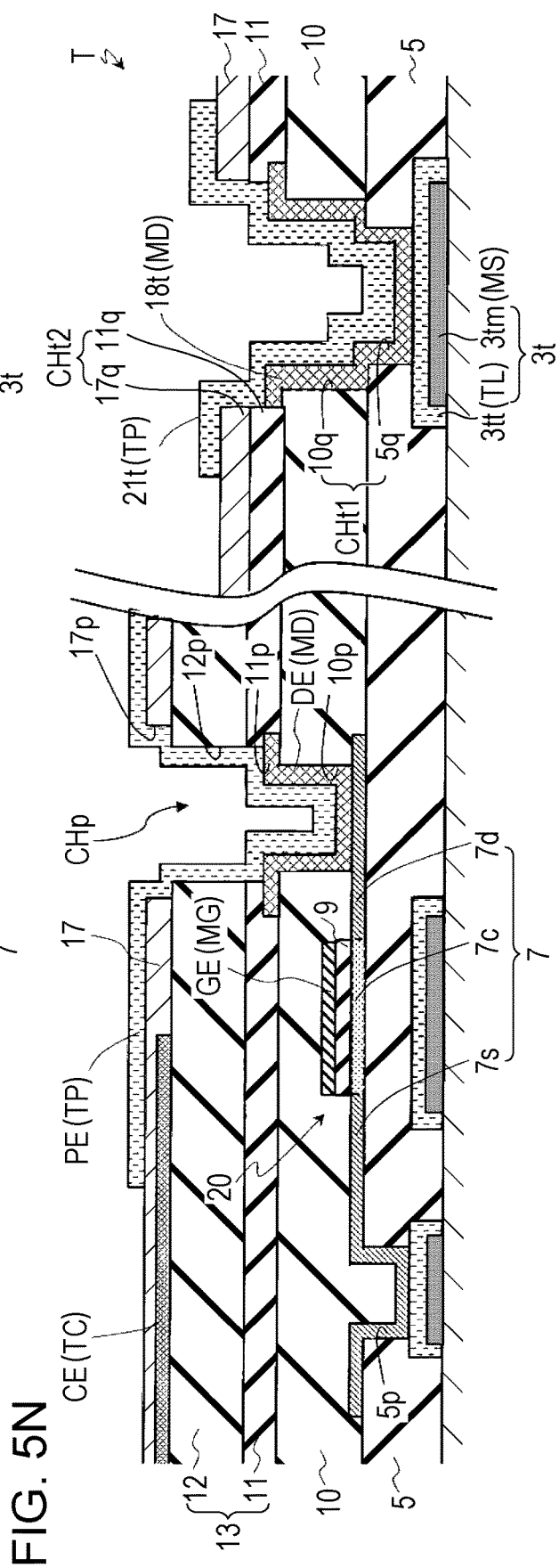
FIG. 5N is a step sectional view illustrating the manufacturing method of the active matrix substrate 100.

FIGS. 5A to 5N are schematic step sectional views for describing the manufacturing method of the active matrix substrate 100, and illustrate the pixel region P and the terminal unit formation region. Here, as the manufacturing method of the wiring connection unit, a method for manufacturing the terminal unit T is illustrated.

Step 1: Formation of Source Metal Layer MS (FIG. 5A)

A source conductive film (thickness: for example, 50 nm or more and 500 nm or less) is formed on the substrate 1 by, for example, a sputtering method. Next, the patterning of the source conductive film is performed by a known photolithography step. Here, a first resist layer (not illustrated) is formed by forming a resist film on the source conductive film and exposing the resist film to light using the first photomask. Using the first resist layer as a mask, the etching (for example, wet etching) of the source conductive film is performed.

In this manner, as illustrated in FIG. 5A, the source metal layer MS is formed including metal layers SLm, SEm, 3am, and 3tm that respectively serve as a source bus line, a source electrode, a light shielding layer, and a lower conductive layer.

As the substrate 1, a transparent and insulating substrate, for example, a glass substrate, a silicon substrate, a heat resistant plastic substrate (resin substrate), or the like can be used.

The material of the source conductive film is not particularly limited, a metal such as aluminum (Al), tungsten (W), molybdenum (Mo), tantalum (Ta), chromium (Cr), titanium (Ti), copper (Cu) or the like, an alloy thereof, or a film containing a metal nitride thereof can be appropriately used. In addition, a laminated film in which a plurality of these films are laminated may be used. Here, as the source conductive film, a laminated film (Cu/Ti film) including a Ti film (thickness: 30 nm) and a Cu film (thickness: 200 nm) in this order from the substrate 1 side is used. A laminated film (Al/Ti film) including a Ti film and an Al film in this order may be used.

Step 2: Formation of Lower Transparent Conductive Layer TL (FIGS. 5B and 5C)

Subsequently, as illustrated in FIG. 5B, a lower transparent conductive film (thickness: for example, 20 nm or more and 120 nm or less) 60 is formed so as to cover the source metal layer MS.

As the lower transparent conductive film 60, for example, metal oxide such as indium tin oxide (ITO), indium zinc oxide, zinc oxide (ZnO), and tin oxide ($SnO_2$) can be used. The formation of the lower transparent conductive film 60 may be performed by, for example, a sputtering method.

Subsequently, the patterning of the lower transparent conductive film 60 is performed. Here, a second resist layer (not illustrated) is formed by forming a resist film on the lower transparent conductive film 60 and exposing the resist film to light using the first photomask used in STEP 1. Using the second resist layer as a mask, the etching (for example, wet etching) of the lower the 60 is performed.

In this manner, as illustrated in FIG. 5C, the lower transparent conductive layer TL including a source bus line, a source electrode, a light shielding layer, and transparent conductive layers SLt, SEt, 3at, and 3tt that lower conductive layers are formed. Accordingly, the source bus line SL having the first layer structure, the source electrode SE, the light shielding layer 3a, and the lower conductive layer 3t are obtained.

The etching of the lower transparent insulating film 60 adjusts etching conditions such as etching time so as to perform the under-etching (insufficient etching).

Accordingly, a transparent conductive layer having a pattern that is one size larger than that of the second resist layer, that is, one size larger than that of the metal layer formed in STEP 1 is obtained. Instead, the etching conditions of the source conductive film in STEP 1 may be adjusted so as to perform over-etching (excessive etching).

Step 3: Formation of Lower Insulating Layer 5 (FIGS. 5D and 5E)

Next, as illustrated in FIG. 5D, the lower insulating layer 5 (thickness: for example, 200 nm or more and 600 nm or less) is formed so as to cover the source metal layer MS and the lower transparent conductive layer TL. As described above, since the surface of the source metal layer MS is protected by the lower transparent conductive layer TL, damage to the surface of the source metal layer MS due to the step of forming the lower insulating layer 5 (for example, plasma treatment) can be suppressed.

The lower insulating layer 5 is formed by, for example, a CVD method. As the lower insulating layer 5, a silicon oxide ($SiO_x$) layer, a silicon nitride (SiNO layer, a silicon oxynitride ($SiO_xN_y$: x>y) layer, a silicon nitride oxide ($SiN_xO_y$; x>y) layer, or the like can be appropriately used. The lower insulating layer 5 may be a single layer or may have a laminated structure. For example, a silicon nitride ($SiN_x$) layer, a silicon nitride oxide layer, or the like may be formed to prevent diffusion of impurities and the like from the substrate 1 on the substrate side (lower layer), and a silicon oxide ($SiO_2$) layer, a silicon oxynitride layer, or the like may be formed to ensure insulating characteristics on the upper surface thereof. Here, as the lower insulating 5, a silicon oxide ($SiO_2$) layer (thickness: for example, 350 nm) is formed by using, for example, a CVD method. Otherwise, as the lower insulating layer 5, a laminated film in which a silicon nitride ($SiN_x$) layer (thickness: 50 to 600 nm) is a lower layer and the silicon oxide ($SiO_2$) layer (thickness: 50 to 600 nm) is an upper layer may be formed. When an oxide film such as a silicon oxide film is used as the lower insulating layer 5 (as the uppermost layer in a case where the lower insulating layer 5 has a laminated structure), since the oxidation deficiency that occurs in the channel region of the oxide semiconductor layer to be formed later can be reduced by the oxide film, the resistance lowering of the channel region can be suppressed.

After this, the patterning of the lower insulating layer 5 is performed by a known photolithography step.

Accordingly, as illustrated in FIG. 5E, in the pixel region P, the source opening portion 5p that exposes a part of the source electrode SE (or the source bus line SL) is formed, and in the terminal unit formation region, the opening portion 5q that exposes a part (a part of the transparent conductive layer 3tt) of the lower conductive layer 3t is formed.

Step 4: Formation of Oxide Semiconductor Layer 7 (FIG. 5F)

Subsequently, an oxide semiconductor film (not illustrated) is formed on the lower insulating layer 5. After this, annealing treatment of the oxide semiconductor film may be performed. The thickness of the oxide semiconductor film may be, for example, 15 nm or more and 200 nm or less.

Subsequently, the patterning of the oxide semiconductor film is performed by a known photolithography step. Accordingly, as illustrated in FIG. 5F, the oxide semiconductor layer 7 to be an active layer of the TFT 20 is obtained.

The oxide semiconductor film can be formed by, for example, a sputtering method. Here, as the oxide semiconductor film, an In—Ga—Zn—O-based semiconductor film (thickness: 50 nm) containing In, Ga, and Zn is formed.

The patterning of the oxide semiconductor film is performed by, for example, wet etching using the PAN-based etchant containing phosphoric acid, nitric acid, and acetic acid. In the present embodiment, since the surface (metal surface) of the source metal layer MS in the opening portion 5a is protected by the transparent conductive layer 3tt, the surface does not come into contact with the PAN-based etchant. Therefore, elution of the material of the source metal layer MS can be suppressed. In addition, damage to the oxide semiconductor layer 7 due to the etchant containing the eluted material (Cu or the like) can be suppressed.

In addition, a patterning method of the oxide semiconductor film is not limited to the description above. For example, the etching may be performed using another etchant such as an oxalic acid-based etchant.

Step 5: Formation of Gate Insulating Layer 9 and Gate Metal Layer MG (FIG. 5G)

Next, as illustrated in FIG. 5G, a gate insulating film (thickness: for example, 80 nm or more and 250 nm or less) and a gate conductive film (thickness: for example 50 nm or more and 500 nm or less) are formed in this order so as to cover the oxide semiconductor layer 7. After this, by performing the patterning of the gate conductive film by a known photolithography step, the gate metal layer MG including the gate bus line GL, the gate electrode GE, and the gate conductive unit 8sg (not illustrated) of the source-gate connection unit SG is formed. Next, by performing the patterning of the gate insulating film and the gate conductive film using the same resist mask as that for patterning the gate conductive film (or using the gate metal layer MG as a mask), the gate insulating layer 9 is formed. According to this method, when viewed from the normal direction of the substrate 1, the side surface of the gate electrode GE and the side surface of the gate insulating layer 9 are aligned.

Instead of the above-described method, first, the gate insulating film may be formed so as to cover the oxide semiconductor layer 7, and the gate insulating layer 9 may be formed by patterning the gate insulating film. Next, the gate conductive film may be formed so as to cover the gate insulating layer 9, and the gate metal layer MG may be formed by patterning the gate conductive film.

As the gate insulating film, an insulating film similar to the lower insulating layer 5 (an insulating film illustrated as the lower insulating layer 5) can be used. Here, a silicon oxide ($SiO_2$) layer is formed as the gate insulating film. When an oxide film such as a silicon oxide film is used as the insulating film, since the oxidation deficiency that occurs in the channel region of the oxide semiconductor layer 7 can be suppressed by the oxide film, the resistance lowering of the channel region can be suppressed.

As the gate conductive film, for example, a metal such as molybdenum (Mo), tungsten (W), aluminum (Al), copper (Cu), titanium (Ti), or tantalum (Ta) or an alloy thereof can be used. The gate delay film may have a laminated structure including a plurality of layers formed from different conductive materials.

Step 6: Resistance Lowering Treatment and Formation of Interlayer Insulating Layer 10 (FIGS. 5H and 5I)

Subsequently, resistance lowering treatment of the oxide semiconductor layer 7 is performed. As the resistance lowering treatment, for example, plasma treatment may be performed. Accordingly, as illustrated in FIG. 5H, a region of the oxide semiconductor layer 7, which overlaps neither the gate bus line GL or the gate insulating layer 9 when viewed from the normal direction of the main surface of the substrate 1 becomes a low resistance region having a lower specific resistance than that of the region (here, a region that serves as a channel) which overlaps the gate bus line GL and the gate insulating layer 9. The low resistance region may be a conductor region (for example, sheet resistance: 200Ω/☐ or less). In this manner, the oxide semiconductor layer 7 including the first and second regions 7s and 7d, which are low resistance regions, and the channel region 7c that remains as a semiconductor region without lowering the resistance is obtained.

In the resistance lowering treatment (plasma treatment), a part of the oxide semiconductor layer 7, which is not covered with the gate bus line GL or the gate insulating layer 9, may be exposed to reducing plasma or plasma (for example, argon plasma) containing doping element. Accordingly, the resistance decreases in the vicinity of the surface of the exposed part of the oxide semiconductor layer 7, and the low resistance region is achieved. The part of the oxide semiconductor layer 7, which is masked by the gate bus line GL or the gate insulating layer 9, remains as a semiconductor region. In addition, the method and conditions of the resistance lowering treatment is described in, for example, Japanese Unexamined Patent Application Publication No. 2008-40343. The entire contents disclosed in Japanese Unexamined Patent Application Publication No. 2008-40343 are incorporated herein by reference.

Next, as illustrated in FIG. 5I, the interlayer insulating layer 10 that covers the oxide semiconductor layer 7, the gate insulating layer 9, and the gate electrode GE is formed. As the interlayer insulating layer 10, an inorganic insulating layer such as a silicon oxide film, a silicon nitride film, a silicon oxynitride film, or a silicon nitride oxide film can be formed as a single layer or a laminated layer. The thickness of the inorganic insulating layer may be 100 nm or more and 500 nm or less. When the interlayer insulating layer 10 is formed using an insulating film such as a silicon nitride film for reducing the oxide semiconductor, a region (here, a low resistance region) of the oxide semiconductor layer 7, which is in contact with the interlayer insulating layer 10, is preferable since the low specific resistance can be maintained. Here, as the interlayer insulating layer 10, for example, a $SiN_x$ layer (thickness: 300 nm) is formed by a CVD method.

In a case where an insulating layer capable of reducing the oxide semiconductor (for example, a hydrogen-donating layer such as a silicon nitride layer) is used as the interlayer insulating layer 10, even when the above-described resistance lowering treatment is not performed, the resistance of a part of the oxide semiconductor layer 7, which is in contact with the interlayer insulating layer 10, can be lower than that of a part that is not in contact with the insulating layer 10.

After this, for example, the drain opening portion 10p that reaches the oxide semiconductor layer 7 is formed in the interlayer insulating layer 10 by, for example, dry etching, and the opening portion 10q is formed so as to at least partially overlap the opening portion 3q in the terminal unit formation region. With the opening portion 3q and the opening portion 10q, a lower opening portion CHt1 that reaches the lower conductive layer 3t is obtained.

Step 7: Formation of Drain Metal Layer MD (FIG. 5J)

Next, the drain conductive film (thickness: for example, 50 nm or more and 500 nm or less) is formed on the interlayer insulating layer 10, and the patterning of the drain conductive film is performed. Accordingly, as illustrated in FIG. 5J, the drain metal layer MD including the drain electrode DE and the drain connection layer 18t is formed. The drain electrode DE is disposed on the interlayer insulating layer 10 and in the drain opening portion 10p, and is in contact with the second region 7d of the oxide semiconductor layer 7 in a drain opening portion 10p. The drain connection layer 18t is disposed on the interlayer insulating layer 10 and in the lower opening portion CHt1, and is in contact with the lower conductive layer 3t in the lower opening portion CHt1.

As the drain conductive film, for example, an element selected from aluminum (Al), chromium (Cr), copper (Cu), tantalum (Ta), titanium (Ti), molybdenum (Mo) or tungsten (W), or an alloy containing the elements as components can be used. For example, a three-layer structure including a titanium film-aluminum film-titanium film, or a three-layer structure including a molybdenum film-aluminum film-molybdenum film may be provided. In addition, the drain conductive film is not limited to a three-layer structure, and may have a single-layer structure or a laminated structure including a two-layer structure or four or more layers. Here, a laminated film having a Ti film (thickness: 15 to 70 nm) as a lower layer and a Cu film (thickness: 200 to 400 nm) as an upper layer is used.

Step 8: Formation of Inorganic Insulating Layer 11 and Organic Insulating Layer 12 (FIG. 5K)

Next, as illustrated in FIG. 5K, the upper insulating layer 13 is formed so as to cover the interlayer insulating layer 10 and the drain metal layer MD. Here, as the upper insulating layer 13, the inorganic insulating layer 11 (thickness: for example, 100 nm or more and 500 nm or less) and the organic insulating layer 12 (thickness: for example, 1 to 311 m, preferably 2 to 311 m) are formed in this order. As illustrated in the drawings, a part of the organic insulating layer 12, which is positioned in the terminal unit formation region, may be removed. The entire part of the organic insulating layer 12, which is positioned in the non-display region, may be removed. In addition, the organic insulating layer 12 may not be formed.

As the inorganic insulating layer 11, the same inorganic insulating film as the interlayer insulating layer (an insulating film illustrated as the interlayer insulating layer 10) can be used. Here, as the inorganic insulating layer 11, for example, a $SiN_x$ layer (thickness: 300 nm) is formed by a CVD method. The organic insulating layer 12 may be, for example, an organic insulating film (for example, an acrylic resin film) containing a photosensitive resin material.

After this, the patterning of the organic insulating layer 12 is performed. Accordingly, in each pixel region P, the opening portion 12p that exposes a part of the inorganic insulating layer 11 is formed in the organic insulating layer 12. The opening portion 12p is disposed so as to overlap the drain electrode DE when viewed from the normal direction of the substrate 1.

Although not illustrated, after this, the etching of the inorganic insulating layer 11 is performed by a known photolithography step, and the opening portion 11p that exposes the drain electrode DE and the opening portion 11q that exposes the drain connection layer 18t may be provided on the inorganic insulating layer 11. In this example, the etching of the inorganic insulating layer 11 is performed simultaneously with the etching of the dielectric layer 17 which will be described later. Accordingly, the common electrode layer TC and the dielectric layer 17 can be formed in a state where the surface of the drain electrode DE is protected by the inorganic insulating layer 11.

Step 9: Formation of Common Electrode Layer TC (FIG. 5L)

Subsequently, as illustrated in FIG. 5L, a common electrode layer TC including the common electrode CE is formed on the upper insulating layer 13.

First, a second transparent conductive film (thickness: 20 to 300 nm) (not illustrated) is formed on the upper insulating layer 13 and in the opening portion 12p. Here, for example, an indium-zinc oxide film is formed as the second transparent conductive film by a sputtering method. As a material of the second transparent electrode film, a metal oxide such as indium-tin oxide (ITO), indium-zinc oxide, or ZnO can be used. After this, the patterning of the second transparent conductive film is performed. In the patterning, for example, the wet etching may be performed using an oxalic acid-based etchant. Accordingly, the common electrode CE is obtained. The common electrode CE may be disposed, for example, over substantially the entire display region except for a pixel contact hole formation region where the pixel contact hole CHp is formed.

Step 10: Formation of Dielectric Layer 17 (FIG. 5M)

Next, as illustrated in FIG. 5M, the dielectric layer (thickness: 50 to 500 nm) 17 is formed so as to cover the common electrode layer TC, and the dielectric layer 17 and the patterning of the inorganic insulating layer 11 is performed.

In the pixel region P, the dielectric layer 17 is formed on the organic insulating layer 12 and the common electrode CE and in the opening portion 12p. In the terminal unit formation region, the dielectric layer 17 is formed on the inorganic insulating layer 11. The material of the dielectric layer 17 may be the same as the material illustrated as the material of the inorganic insulating layer 11. Here, a SiN film is formed as the dielectric layer 17 by, for example, a CVD method.

After this, a resist layer (not illustrated) formed on the dielectric layer 17 is formed by a photolithography step. Using the resist layer and the organic insulating layer 12 as a mask, the etching of the dielectric layer 17 and the inorganic insulating layer 11 is performed. The etching of the dielectric layer 17 and the inorganic insulating layer 11 may be performed in the same etching step. Accordingly, in the pixel region P, a pixel contact hole CHp that exposes a part of the second region 7d of the oxide semiconductor layer 7 is formed. The pixel contact hole CHp is constituted of the opening portion 11p formed in the inorganic insulating layer 11, the opening portion 12p of the organic insulating layer 12, and the opening portion 17p of the dielectric layer 17. The opening portion 17p may at least partially overlap the opening portion 12p when viewed from the normal direction of the substrate 1.

In the terminal unit formation region, the dielectric layer 17 and the inorganic insulating layer 11 are simultaneously etched, and the upper opening portion CHt2 that exposes a part of the drain connection layer 18t is formed. The upper opening portion CHt2 is constituted of the opening portion 11q and the opening portion 17q. When viewed from the normal direction of the substrate 1, the side surface of the opening portion 11q may be aligned with the side surface of the opening portion 17Q.

Step 10: Formation of Pixel Electrode Layer TP (FIG. 5N)

Next, the pixel electrode layer TP including the pixel electrode PE is formed.

First, a first transparent conductive film (not illustrated) (thickness: 20 to 300 nm) is formed on the dielectric layer 17, in the pixel contact hole CHp and in the upper opening portion CHt2. The material of the first transparent conductive film may be the same as the material illustrated as the material of the second transparent conductive film.

After this, the patterning of the first transparent conductive film is performed. For example, the wet etching of the first transparent conductive film may be performed using an oxalic acid-based etchant. Accordingly, as illustrated in FIG. 5N, the pixel electrode PE and the upper conductive layer 21t are formed. The pixel electrode PE is formed on the dielectric layer 17 and in the pixel contact hole C in the pixel region P, and is in contact with the second region 7d in the pixel contact hole CHp. In addition, the upper conductive layer 21t is formed on the dielectric layer 17 and in the upper opening portion CHt2 in the terminal unit formation region, and is in contact with the drain connection layer 18t in the upper opening portion CHt2. In this manner, the active matrix substrate 100 is manufactured.

According to the above-described method, the transparent conductive layer can be formed so as to cover the surface of the metal layer formed on the source metal layer MS without increasing the number of photomasks to be used. Therefore, the process damage to the metal of the source metal layer MS can be suppressed. In addition, electrodes and wirings having a redundant structure including a metal layer and a transparent conductive layer can be formed.

<Other Manufacturing Methods>

The manufacturing method of the present embodiment is not limited to the above-described method. In STEP 3, when the source opening portion 5p is formed in the lower insulating layer 5 in the pixel region, the opening portion 5q may not be formed in the terminal unit formation region. The opening portion 5q can be formed simultaneously with the formation of the opening portion 10q in the interlayer insulating layer 10.

FIGS. 6A to 6E are step sectional views for describing another manufacturing method of the active matrix substrate 100. Hereinafter, differences from the above-described method will be mainly described.

After forming the lower insulating layer 5 that covers the source metal layer MS and the lower transparent conductive layer TL by a method similar to that described above, as illustrated in FIG. 6A, the source opening portion 5p is formed in the lower insulating layer 5 in the pixel region. In the terminal unit formation region, a state where the lower insulating layer 5 covers the entire lower conductive layer 3t is achieved.

Subsequently, in the method similar to that described above, as illustrated in FIG. 6B, the oxide semiconductor layer 7, the gate insulating layer 9, and the gate metal layer MG including the gate electrode GE are formed. Next, as illustrated in FIG. 6C, the interlayer insulating layer 10 that covers the gate electrode GE is formed.

Figure 6D:
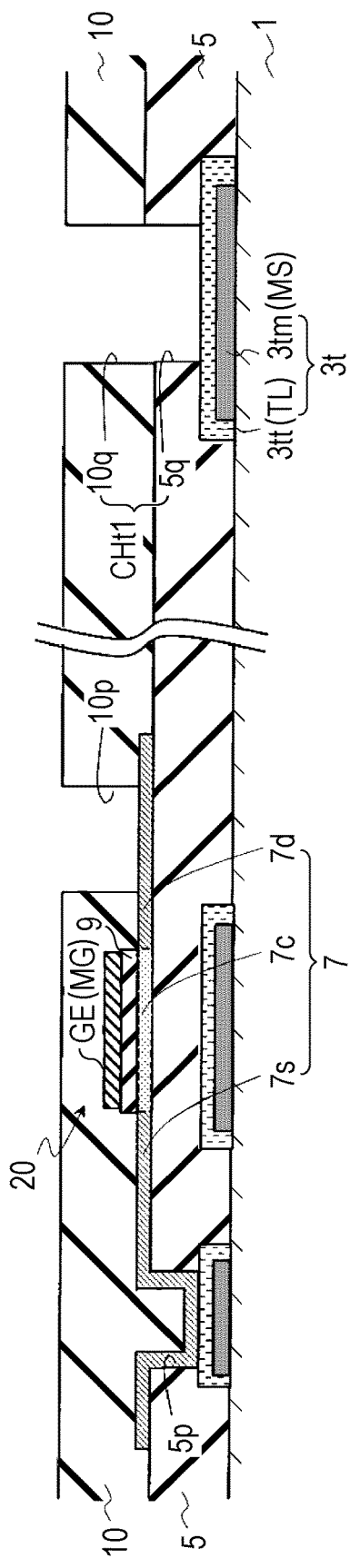
FIG. 6D is a step sectional view illustrating another manufacturing method of the active matrix substrate 100.

After this, as illustrated in FIG. 6D, the patterning of the interlayer insulating layer 10 and the lower insulating layer 5 is performed. Accordingly, the drain opening portion 10p that exposes a part of the oxide semiconductor layer 7 is formed in the pixel region P. In the terminal unit formation region, a lower opening portion CHt1 that exposes a part of the lower conductive layer 3t is formed in the interlayer insulating layer 10 and the lower insulating layer 5. Since the lower insulating layer 5 and the interlayer insulating layer 10 are etched using the same resist mask, the side surface of opening portion 5q and the side surface of opening portion 10q are aligned in the lower opening portion CHt1.

Figure 6E:
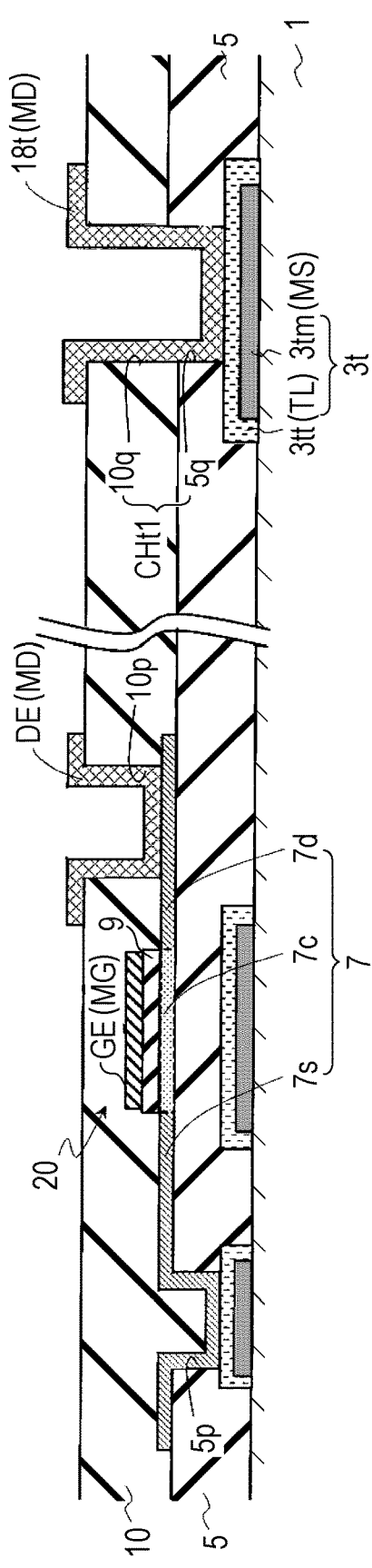
FIG. 6E is a step sectional view illustrating another manufacturing method of the active matrix substrate 100.

Subsequently, as illustrated in FIG. 6E, the drain metal layer MD including the drain electrode DE and the drain connection layer 18t is formed. Subsequent steps are the same as the above-described steps with reference to FIGS. 5K to 5N.

According to this process, since the surface of the lower conductive layer 3t is protected by the lower insulating layer 5 in the steps of forming and etching the oxide semiconductor layer 7, the gate insulating layer 9, the gate metal layer MG, and the interlayer insulating layer 10, damage to lower conductive layer 3t can be suppressed.

Second Embodiment

Hereinafter, the active matrix substrate of a second embodiment will be described with reference to the drawings. Here, differences from the above-described embodiment will be mainly described, and the description of the same configuration will be appropriately omitted.

In the present embodiment, the terminal unit is different from the terminal unit according to the above-described embodiment in that the drain connection layer 18t is not provided and the upper conductive layer 21t is directly connected to the lower conductive layer 3t (FIGS. 3A and 3B).

Figure 7A:
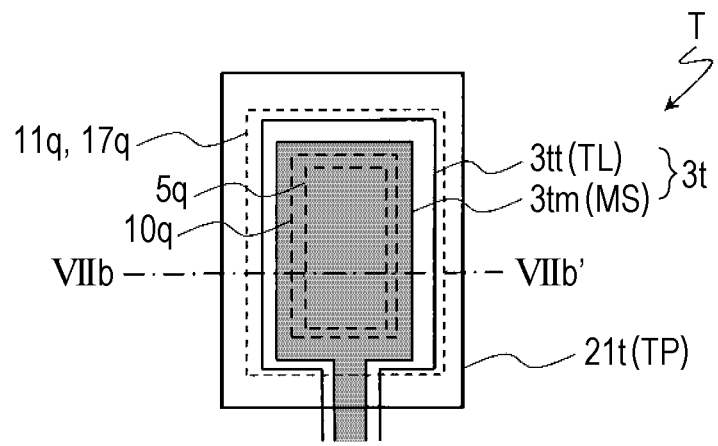
FIG. 7A is a plan view illustrating a terminal unit in an active matrix substrate according to a second embodiment.
Figure 7B:
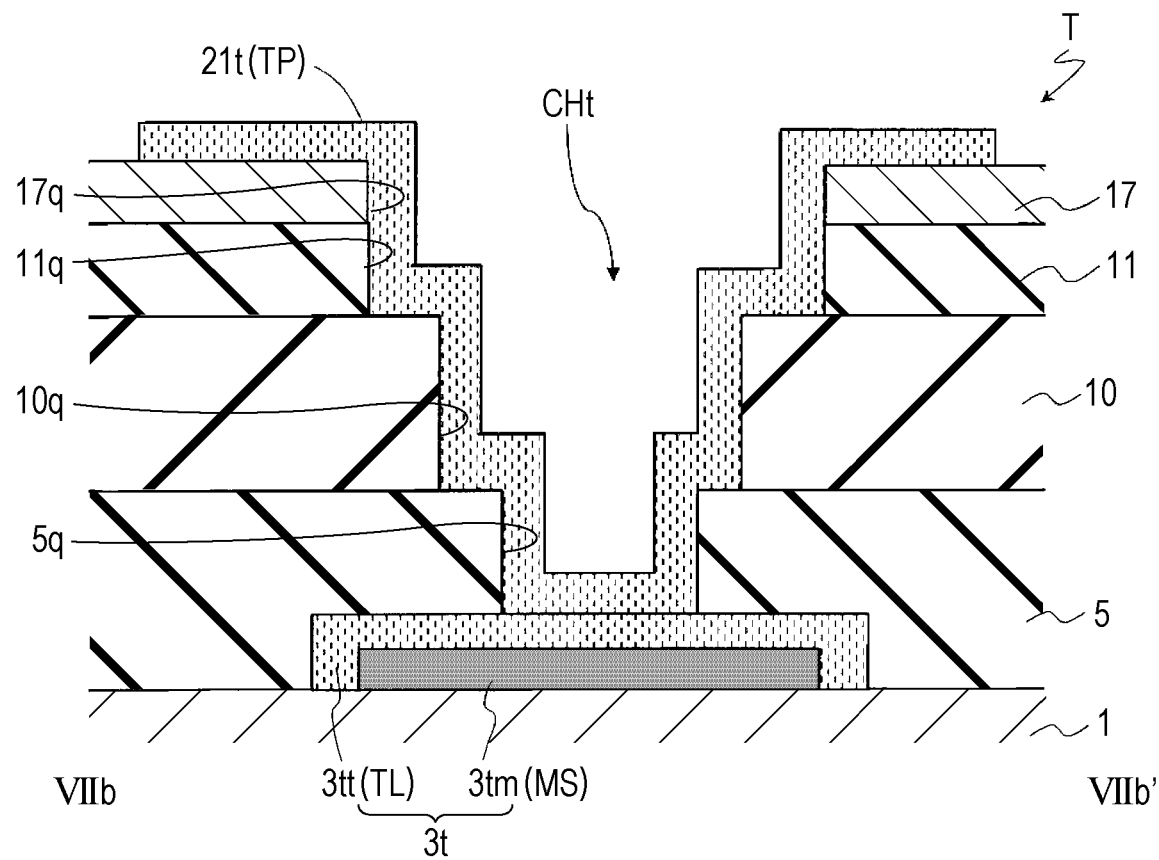
FIG. 7B is a sectional view illustrating the terminal unit in the active matrix substrate according to the second embodiment.

FIGS. 7A and 7B are a plan view and a sectional view illustrating the terminal unit T according to the second embodiment, respectively.

In this example, the terminal unit T includes the lower conductive layer 3t, the insulating layer that covers the lower conductive layer 3t, and the upper conductive layer 21t disposed in the terminal unit contact hole CHt formed on the insulating layer and on the insulating layer. The upper conductive layer 21t is in direct contact with the transparent conductive layer 3tt of the lower conductive layer 3t in the terminal unit contact hole CHt. In this example, the insulating layer includes the lower insulating layer 5, the interlayer insulating layer 10, the inorganic insulating layer 11, and the dielectric layer 17, and may not include the organic insulating layer 12. The terminal unit contact hole CHt is constituted of the opening portions 5q, 10q, 11q, and 17q formed in the lower inorganic insulating layer 5, the interlayer insulating layer 10, the inorganic insulating layer 11, and the dielectric layer 17. The opening portions 5q, 10q, 11q, and 17q may be disposed so as to expose a part of the lower conductive layer 3t, and the arrangement relationship and the size are not limited to the illustrated example.

The terminal unit T can be manufactured by the same method as that in the first embodiment. However, during the patterning of the drain conductive film (drain metal layer MD), the drain conductive film is removed from the terminal unit formation region.

In the terminal unit contact hole CHt, the side surfaces of the opening portion 17q and the opening portion 11q may be aligned. Such a configuration can be obtained by etching the dielectric layer 17 and the inorganic insulating layer 11 using the same resist mask.

According to the present embodiment, since the upper conductive layer 21t and the transparent conductive layer 3tt formed using the transparent conductive film can be directly connected to each other via another conductive film (for example, the drain metal layer MD), it is possible to further reduce the resistance that occurs in the terminal unit.

Modification Example 1

Figure 8A:
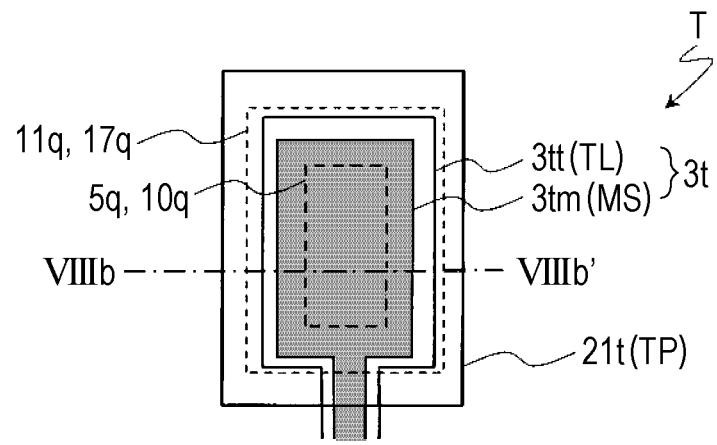
FIG. 8A is a plan view illustrating a terminal unit in an active matrix substrate according to Modification Example 1.
Figure 8B:
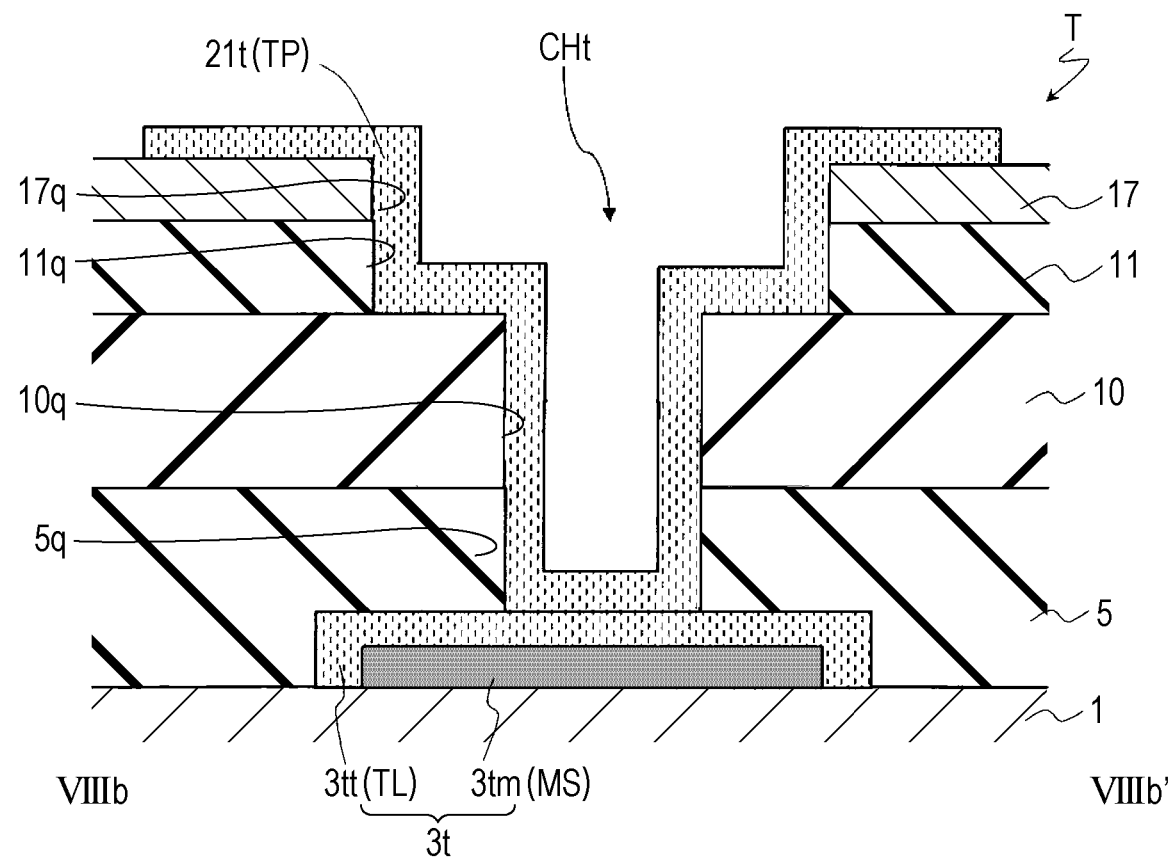
FIG. 8B is a sectional view illustrating the terminal unit in the active matrix substrate according to Modification Example 1.

FIG. 8A and FIG. 8B are a plan view and a sectional view illustrating the terminal unit T in the active matrix substrate of Modification Example 1, respectively.

In the terminal unit T, when viewed from the normal direction of the substrate 1, in the terminal unit contact hole CHt, the side surfaces of the opening portion 5q and the opening portion 10q are aligned, and the side surfaces of the opening portion 11q and the opening portion 17q are aligned. Other configurations are the same as those of the terminal unit T according to Modification Example 1.

FIGS. 9A to 9F are step sectional views for describing the manufacturing method of the active matrix substrate according to Modification example 1.

The manufacturing method of the terminal unit T is the same as the method described above with reference to FIGS. 6A to 6E, except that the drain connection layer 18t is not formed.

First, the steps of forming the interlayer insulating layer 10 is performed by the method similar to FIGS. 6A to 6C. Next, as illustrated in FIG. 9A, the patterning of the interlayer insulating layer 10 and the lower insulating layer 5 is performed. Accordingly, the drain opening portion 10p that exposes a part of the oxide semiconductor layer 7 is formed in the pixel region. In the terminal unit formation region, the lower opening portion CHt1 that exposes a part of the lower conductive layer 3t is formed in the interlayer insulating layer 10 and the lower insulating layer 5. Since the lower insulating layer 5 and the interlayer insulating layer 10 are etched using the same mask, the side surface of opening portion 5q and the side surface of opening portion 10q are aligned in the lower opening portion CHt1.

Subsequently, as illustrated in FIG. 9B, the drain conductive film is formed, and the drain metal layer MD including the drain electrode DE is formed by performing the patterning. The drain conductive film on the terminal unit formation region is removed.

Next, as illustrated in FIG. 9C, the inorganic insulating layer 11 and the organic insulating layer 12 are formed, and the patterning of the organic insulating layer 12 is performed. After this, as illustrated in FIG. 9D, the common electrode layer TC is formed.

Subsequently, formation and patterning of the dielectric layer 17 are performed. In the patterning of the dielectric layer 17, the dielectric layer 17 and the inorganic insulating layer 11 are simultaneously patterned. Accordingly, as illustrated in FIG. 9E, the pixel contact hole CHp that exposes a part of the drain electrode DE is formed in the pixel region. The opening portions 17q and 11q are formed in the dielectric layer 17 and the inorganic insulating layer 11, respectively, so as to at least partially overlap the lower opening portion CHt1 in the terminal unit formation region. Accordingly, the terminal unit contact hole CHt that exposes a part of the lower conductive layer 3t is formed in the lower insulating layer 5, the interlayer insulating layer 10, the inorganic insulating layer 11, and the dielectric layer 17.

The terminal unit contact hole CHt includes the opening portion 5q formed in the lower insulating layer 5, the opening portion 10q formed in the interlayer insulating layer 10, the opening portion 11q formed in the inorganic insulating layer 11, and the opening portion 17a formed in the dielectric layer 17. In this example, when viewed from the normal direction of the substrate 1, the side surfaces of the opening portion 5q and the opening portion 10q are aligned, and the side surfaces of the opening portion 11q and the opening portion 17q are aligned. The opening portion 11q and the opening portion 17q may be arranged so as to at least partially overlap the opening portion 5q and the opening portion 10q.

After this, as illustrated in FIG. 9F, the pixel electrode layer TP including the pixel electrode PE and the upper conductive layer 21t is formed. The pixel electrode PE is connected to the drain electrode DE in the pixel contact hole CHp, and the upper conductive layer 21t is connected to the lower conductive layer 3t (transparent conductive layer 3tt) in the terminal unit contact hole CHt.

According to the above-described process, since the surface of the lower conductive layer 3t is protected by the lower insulating layer 5 in the steps of forming and etching the oxide semiconductor layer 7, the gate insulating layer 9, the gate metal layer MG, and the interlayer insulating layer 10, damage to lower conductive layer 3t can be suppressed.

Modification Example 2

Figure 10A:
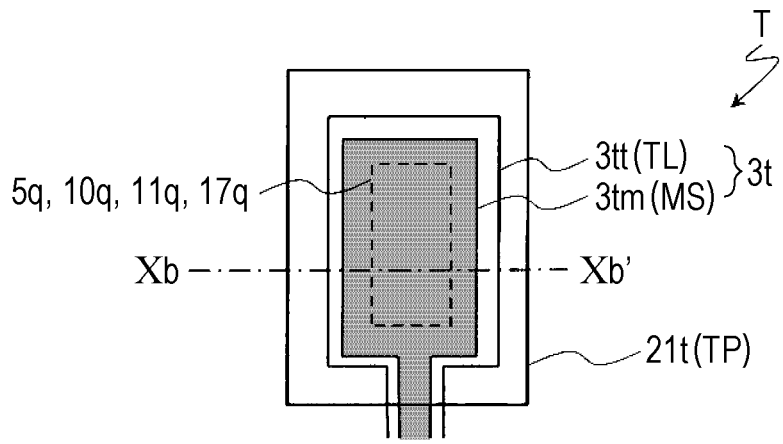
FIG. 10A is a plan view illustrating a terminal unit in an active matrix substrate according to Modification Example 2.
Figure 10B:
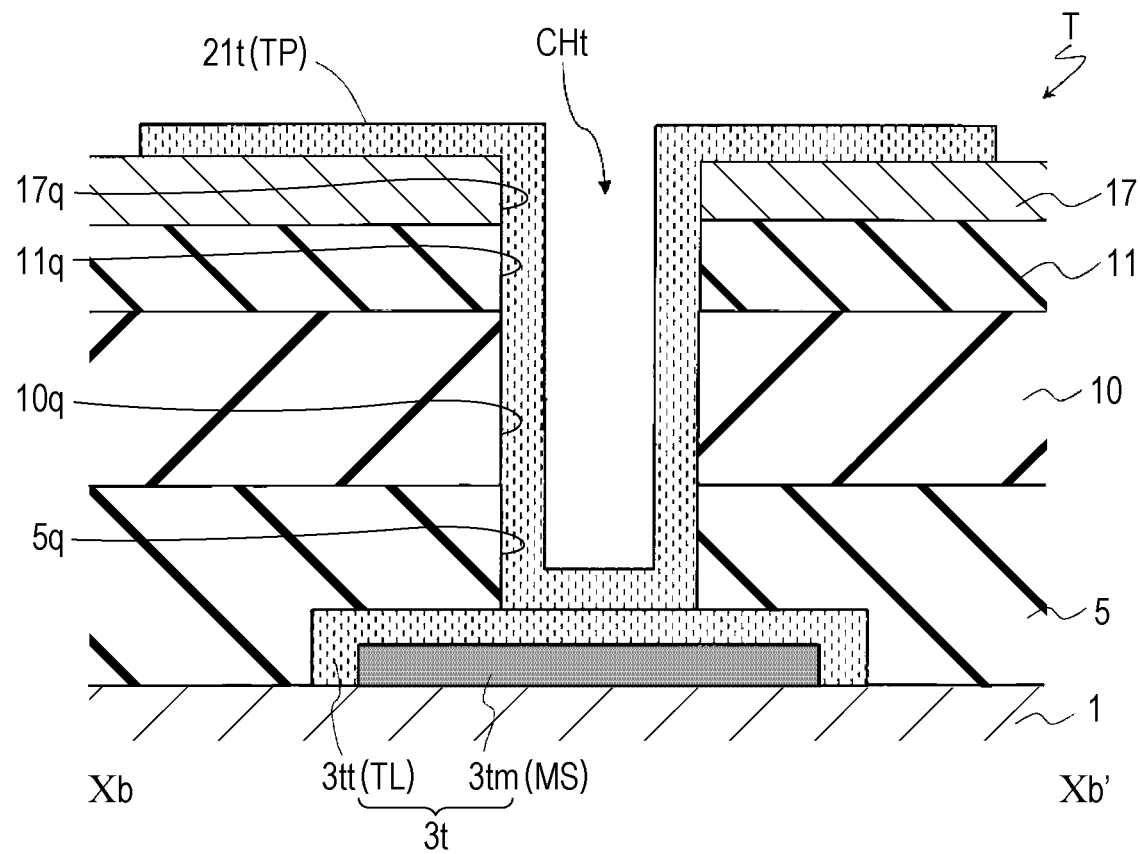
FIG. 10B is a sectional view illustrating the terminal unit in the active matrix substrate according to Modification Example 2.

FIG. 10A and FIG. 10B are a plan view and a sectional view illustrating the terminal unit T in the active matrix substrate of Modification Example 2, respectively.

In the terminal unit T, when viewed from the normal direction of the substrate 1, in the terminal unit contact hole CHt, the side surfaces of the opening portion 5q, the opening portion 10q, the opening portion 11q, and the opening portion 17q are aligned. Other configurations are the same as those of the terminal unit T according to Modification Example 1.

FIGS. 11A to 11F are step sectional views for describing the manufacturing method of the active matrix substrate according to Modification Example 2.

In this example, the terminal unit contact hole CHt of the terminal unit T is formed by simultaneously etching the lower insulating layer 5, the interlayer insulating layer 10, the inorganic insulating layer 11, and the dielectric layer 17.

First, the steps of forming the interlayer insulating layer 10 is performed by the method similar to FIGS. 6A to 6C. Next, as illustrated in FIG. 11A, the patterning of the interlayer insulating layer 10 is performed. Accordingly, the drain opening portion 10p that exposes a part of the oxide semiconductor layer 7 is formed in the pixel region. In the terminal unit formation region, the entire lower conductive layer 3t is in a state of being covered with the lower insulating layer 5 and the interlayer insulating layer 10.

Subsequently, as illustrated in FIG. 11B, the drain electrode DE is formed in the drain opening portion 10p. After this, as illustrated in FIG. 11C, the inorganic insulating layer 11 and the organic insulating layer 12 are formed, and the patterning of the organic insulating layer 12 is performed. Further, as illustrated in FIG. 11D, the common electrode layer TC including the common electrode CE is formed.

After this, the dielectric layer 17 is formed, and the patterning is performed. As illustrated in FIG. 11E, in the pixel region, the dielectric layer 17 and the inorganic insulating layer 11 are simultaneously etched, and the pixel contact hole CHp that exposes a part of the drain electrode DE is formed. In the terminal unit formation region, the dielectric layer 17, the inorganic insulating layer 11, the interlayer insulating layer 10, and the lower insulating layer 5 are simultaneously etched, and the terminal unit contact hole CHt that exposes a part of the lower conductive layer 3t is formed. The terminal unit contact hole CHt includes the opening portion 5q formed in the lower insulating layer 5, the opening portion 10q formed in the interlayer insulating layer 10, the opening portion 11a formed in the inorganic insulating layer 11, and the opening portion 17a formed in the dielectric layer 17. In this example, when viewed from the normal direction of the substrate 1, the side surfaces of the opening portion 5q, the opening portion 10q, the opening portion 11q, and the opening portion 17q are aligned.

After this, as illustrated in FIG. 11F, the pixel electrode layer TP including the pixel electrode PE and the upper conductive layer 21t is formed. The pixel electrode PE is connected to the drain electrode DE in the pixel contact hole CHp, and the upper conductive layer 21t is connected to the lower conductive layer 3t (transparent conductive layer 3tt) in the terminal unit contact hole CHt.

According to this process, similar to Modification Example 1, since the surface of the lower conductive layer 3t is protected by the lower insulating layer 5 in the steps of forming and etching the oxide semiconductor layer 7, the gate insulating layer 9, the gate metal layer MG, and the interlayer insulating layer 10, damage to lower conductive layer 3t can be suppressed.

Modification Example 3

In the processes according to Modification Examples 1 and 2 described above, when patterning the transparent conductive film for the common electrode, in the opening portion formed in the terminal unit, the exposed part of the transparent conductive layer 3tt of the lower conductive layer 3t is removed, and the metal layer 3tm may be exposed.

FIGS. 12A to 12D are step sectional views for describing the manufacturing method of the active matrix substrate according to Modification example 3.

Figure 12A:
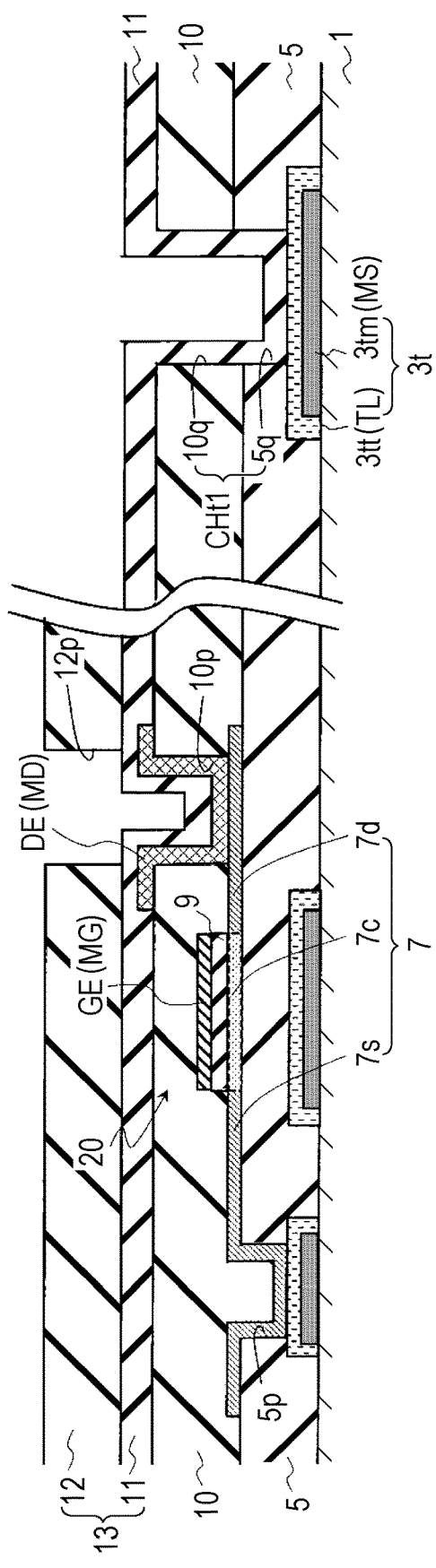
FIG. 12A is a step sectional view illustrating a manufacturing method of an active matrix substrate according to Modification Example 3.

As illustrated in FIG. 12A, in the method similar to that in Modification Example 1, in the pixel region P and the terminal unit formation region, after the patterning of the lower insulating layer 5 and the interlayer insulating layer 10 is performed, the inorganic insulating layer 11 and the organic An insulating layer 12 are formed. Next, the patterning of the organic insulating layer 12 is performed.

Figure 12B:
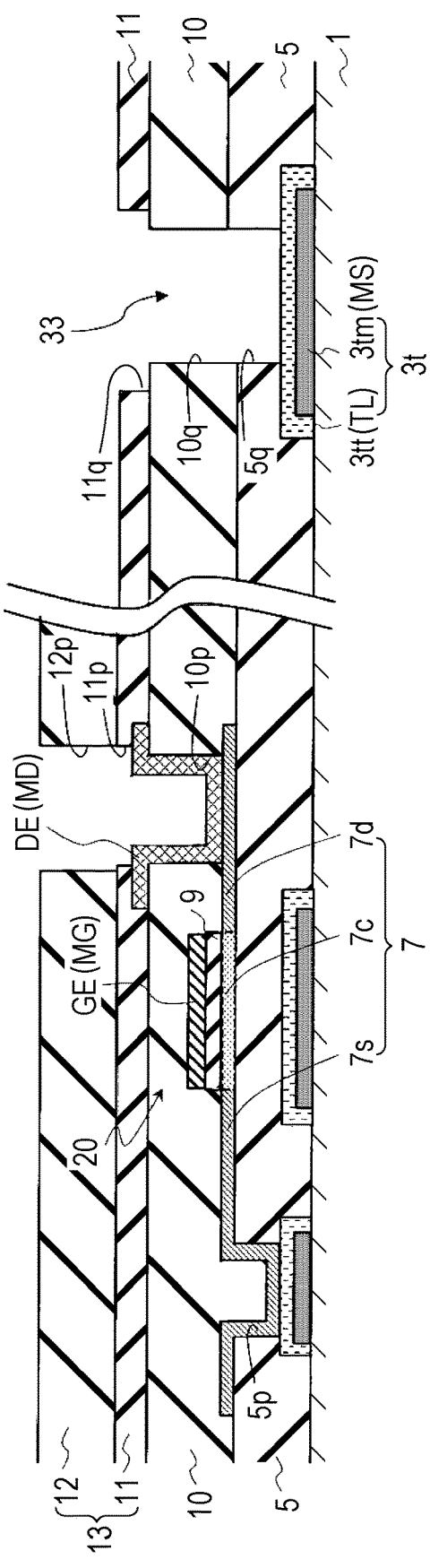
FIG. 12B is a step sectional view illustrating the manufacturing method of the active matrix substrate according to Modification Example 3.

Subsequently, the patterning of the inorganic insulating layer 11 is performed. Accordingly, as illustrated in FIG. 12B, the opening portion 11p that exposes a part of the drain electrode DE is formed in the pixel region P, and the opening portion 11q is formed in the terminal unit formation region so as to at least partially overlap the lower opening portion CHt1. Through the lower opening portion CHt1 and the opening portion 11p, an opening portion 33 that exposes a part of the transparent conductive layer 3tt in the lower conductive layer 3t is obtained.

Subsequently, by forming and patterning a transparent conductive film (for example, an ITO film), the common electrode layer TC including the common electrode CE is formed as illustrated in FIG. 12C. At this time, when the patterning of the transparent conductive film is performed using, for example, an oxalic acid-based etchant, a part of the transparent conductive layer 3tt, which is exposed at the opening portion 33, is also removed at the same time, and the surface 31 of the metal layer 3tm is exposed.

After this, as illustrated in FIG. 12D, the dielectric layer 17 is formed, and the opening portions 17p and 17q are formed in the dielectric layer 17. The opening portion 17p at least partially overlaps the opening portions 11p and 12p of the inorganic insulating layer 11 and the organic insulating layer 12. The opening portion 17q at least partially overlaps the opening portion 33. Accordingly, the pixel contact hole CHp is formed in the pixel region P. In the terminal unit formation region, the terminal unit contact hole CHt that exposes the metal surface 31 of the lower conductive layer 3t is formed.

Next, the pixel electrode layer TP including the pixel electrode PE and the upper conductive layer 21t is formed. In this example, since the part of the lower transparent conductive layer TL, which is positioned in the terminal unit contact hole CHt, is removed, the upper conductive layer 21t is in direct contact with the surface (for example, the metal surface such as Cu) of the metal layer 3tm in the terminal unit contact hole CHt. Therefore, a terminal unit having lower resistance can be formed.

FIGS. 13A to 13D are step sectional views for describing another manufacturing method of the active matrix substrate according to Modification Example 3.

The method illustrated in FIGS. 13A to 13D is different from the method illustrated in FIGS. 12A to 12D in that the etching of the insulating layer 10 and the etching of the lower insulating layer 5 are performed simultaneously with the inorganic insulating layer 11 in the terminal unit formation region.

As illustrated in FIG. 13A, in the method similar to that in Modification Example 2, in the terminal unit formation region, in order to perform the patterning of the lower insulating layer 5 and the interlayer insulating layer 10, the inorganic insulating layer 11 and the organic insulating layer 12 are formed, and the patterning of the organic insulating layer 12 is performed.

Next, as illustrated in FIG. 13B, in the pixel region P, the opening portion 11p is formed in the inorganic insulating layer 11, and in the terminal unit formation region, by patterning the inorganic insulating layer 11, the interlayer insulating layer 10, and the lower insulating layer 5 simultaneously, the opening portion 33 that exposes a part of the transparent conductive layer 3tt is formed. The opening portion 33 includes the opening portion 11q of the inorganic insulating layer 11, the opening portion 10q of the interlayer insulating layer 10, and the opening portion 5q of the lower insulating layer 4. The side surfaces of these opening portions are aligned with each other.

After this, as illustrated in FIG. 13C, the common electrode layer TC including the common electrode CE is formed. At this time, when the patterning of the transparent conductive film is performed using, for example, an oxalic acid-based etchant, a part of the transparent conductive layer 3tt, which is exposed at the opening portion 33, is also removed at the same time, and the surface 31 of the metal layer 3tm is exposed.

After this, as illustrated in FIG. 13D, the dielectric layer 17 is formed, and then, the pixel electrode layer TP including the pixel electrode PE and the upper conductive layer 21t is formed. These forming methods are the same as the method illustrated in FIG. 12D. Even in this example, since the upper conductive layer 21t is in direct contact with the surface 31 of the metal layer 3tm in the terminal unit contact hole CHt, a terminal unit having lower resistance can be formed.

Third Embodiment

The active matrix substrate of the third embodiment is different from the above-described embodiments in the lower gate structure substrate. In other words, in the present embodiment, the lower metal layer (the metal layer positioned on the substrate side of the source metal layer and the gate metal layer) is the gate metal layer MG, and the lower bus line (the bus line formed in the lower metal layer) is the gate bus line GL. The gate metal layer MG is covered with the lower transparent conductive layer TL. The electrodes and wirings such as the gate bus line GL and the gate electrode GE are formed in the gate metal layer MG and the lower transparent conductive layer TL, and the first laminated structure including the metal layer and the transparent conductive layer is included. Hereinafter, differences from the above-described embodiment will be mainly described, and the description of the same configuration will be appropriately omitted.

<Pixel Region P>

Figure 14A:
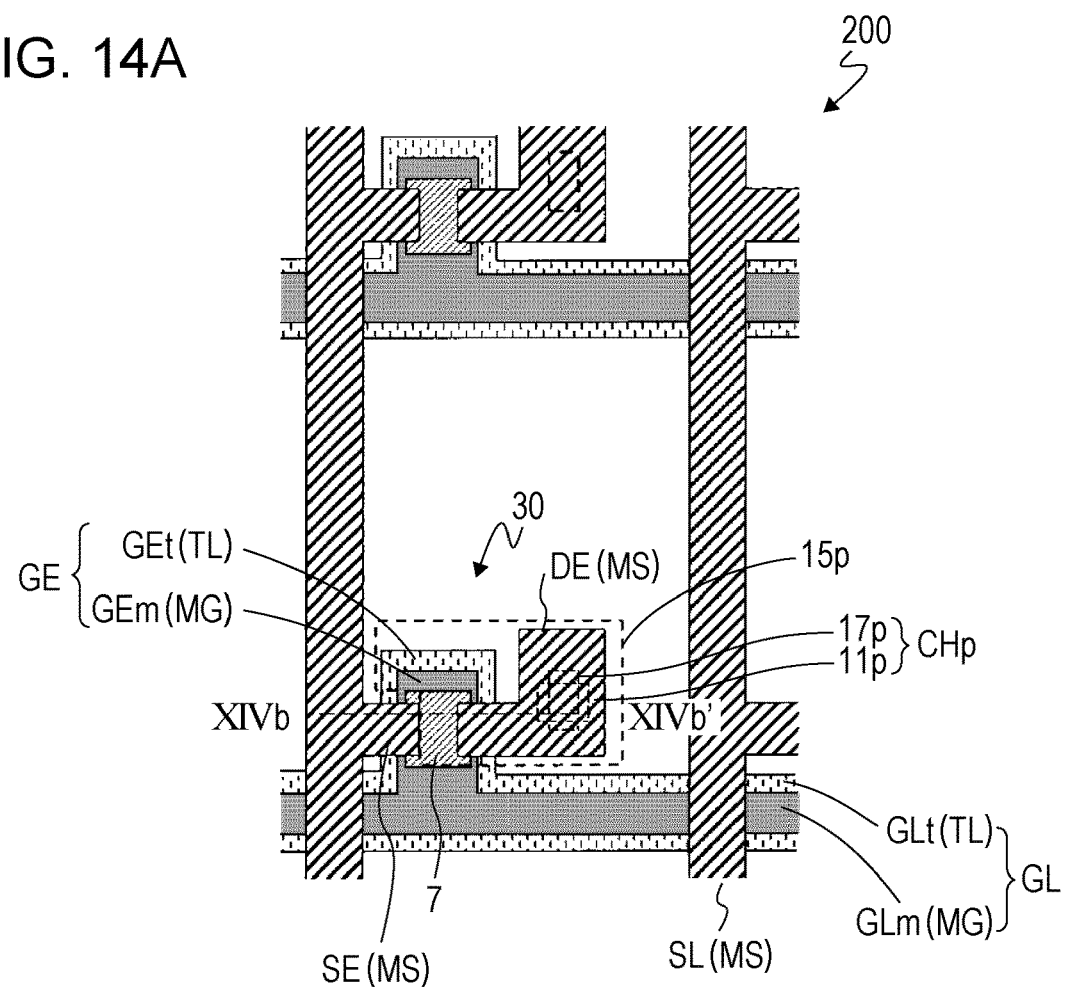
FIG. 14A is a plan view illustrating a pixel region in an active matrix substrate 200 according to a third embodiment.
Figure 14B:
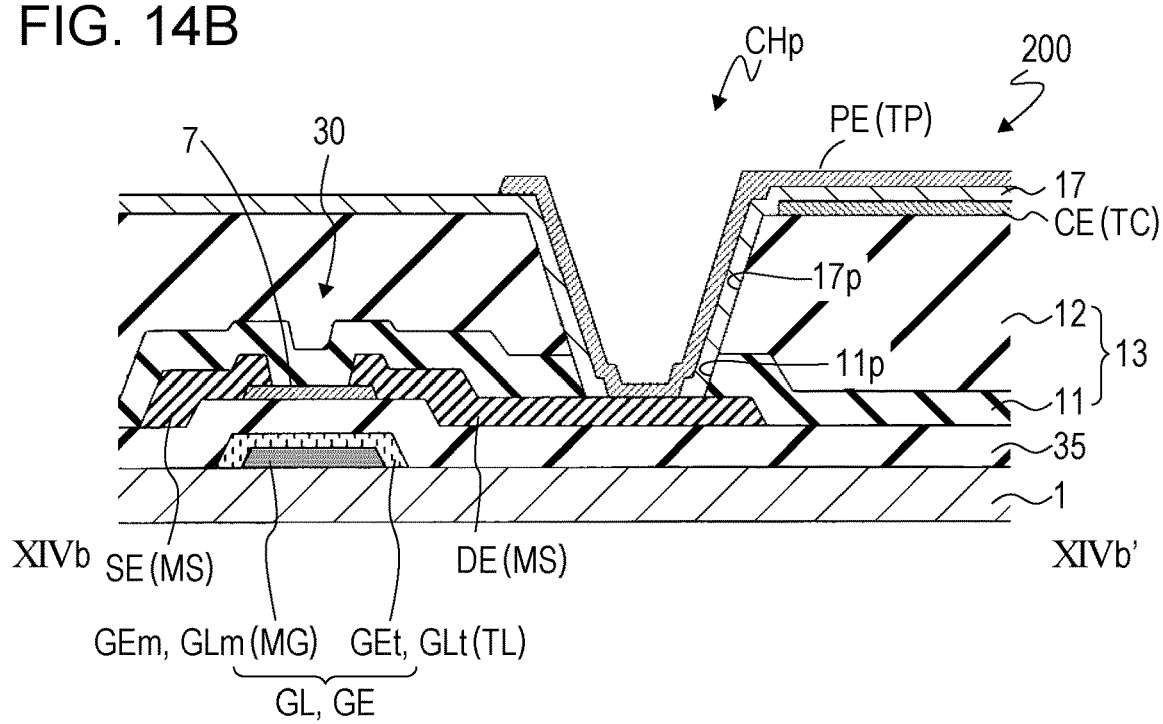
FIG. 14B is a sectional view illustrating the pixel region in the active matrix substrate 200.

FIG. 14A is a plan view illustrating each pixel region P in an active matrix substrate 200, and FIG. 14B is a sectional view of a TFT 30 of the pixel region P taken along line XIVb-XIVb'.

As illustrated in FIG. 14B, the active matrix substrate 200 has the gate metal layer MG, a lower insulating layer 35, the oxide semiconductor layer 7, and the source metal layer MS in this order from the substrate 1 side. The gate metal layer MG is disposed to be closer to the substrate 1 than the oxide semiconductor layer 7 that serves as an active layer of the TFT 30 (lower gate structure substrate). The source metal layer MS also includes the drain electrode DE in addition to the source bus line SL and the source electrode SE.

In the present embodiment, the gate bus line GL has a first laminated structure including a metal layer GLm formed in the gate metal layer MG and a transparent conductive layer GLt that covers the upper surface and the side surface of the metal layer GLm. The active matrix substrate 200 may further include, in addition to the gate bus lines GL, electrodes and wirings having the first laminated structure. Similar to the above-describe embodiment, the wirings and electrodes having the first laminated structure may be formed by performing the patterning of the lower transparent conductive layer TL in the second photolithography step using the same photomask as that of the first photolithography step after patterning the gate metal layer MG in the first photolithography step.

The TFT 30 is a bottom-gate type TFT including the gate electrode GE formed in the gate metal layer MG, the oxide semiconductor layer 7 disposed on the gate electrode GE with the lower insulating layer 35 in between, and the source electrode SE and the drain electrode DE which are disposed on the oxide semiconductor layer 7. The lower insulating layer 35 functions as the gate insulating layer.

The gate electrode GE is electrically connected to the corresponding gate bus line GL. Similar to the gate bus line GL, the gate electrode GE may have the first laminated structure including a metal layer GEm and the transparent conductive layer GEt. The gate electrode GE may be a part of the gate bus line GL or may be connected to the gate bus line GL.

The source electrode SE and the drain electrode DE are formed in the source metal layer MS. The source electrode SE is provided so as to be in contact with a part (first region) 7s of the oxide semiconductor layer 7. The drain electrode DE is provided so as to be in contact with another part (second region) 7d of the oxide semiconductor layer 7. In the oxide semiconductor layer 7, the region 7c positioned between the first region 7s and the second region 7d is a "channel region". The first region 7s and the second region 7d are low resistance regions having a lower specific resistance than that of the channel region 7c. When viewed from the normal direction of the substrate 1, the channel region 7c is disposed so as to overlap the gate electrode GE.

Similar to the above-described embodiments, the source electrode SE is electrically connected to the corresponding source bus line SL. The source electrode SE may be connected to the source bus line SL, or may be a part of the source bus line SL.

The source metal layer MS and the TFT 30 are covered with the upper insulating layer 13 including the inorganic insulating layer 11. On the upper insulating layer 13, similar to the above-described embodiments, the common electrode layer TC including the common electrode CE, the dielectric layer 17, and the pixel electrode layer TP including the pixel electrode PE are formed in this order. The pixel electrode PE is connected to the drain electrode DE in the pixel contact hole CHp. Although not illustrated, the common electrode layer TC may be formed on the pixel electrode layer TP with the dielectric layer 17 in between.

<Wiring Connection Unit (Terminal Unit T)>

Figure 15A:
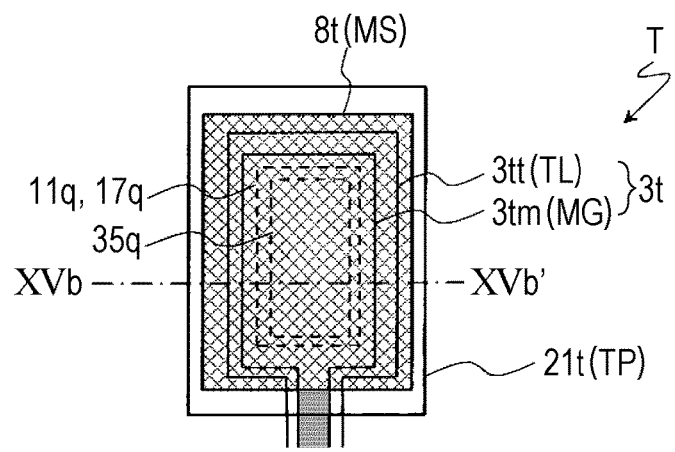
FIG. 15A is a plan view illustrating a terminal unit of the active matrix substrate 200.
Figure 15B:
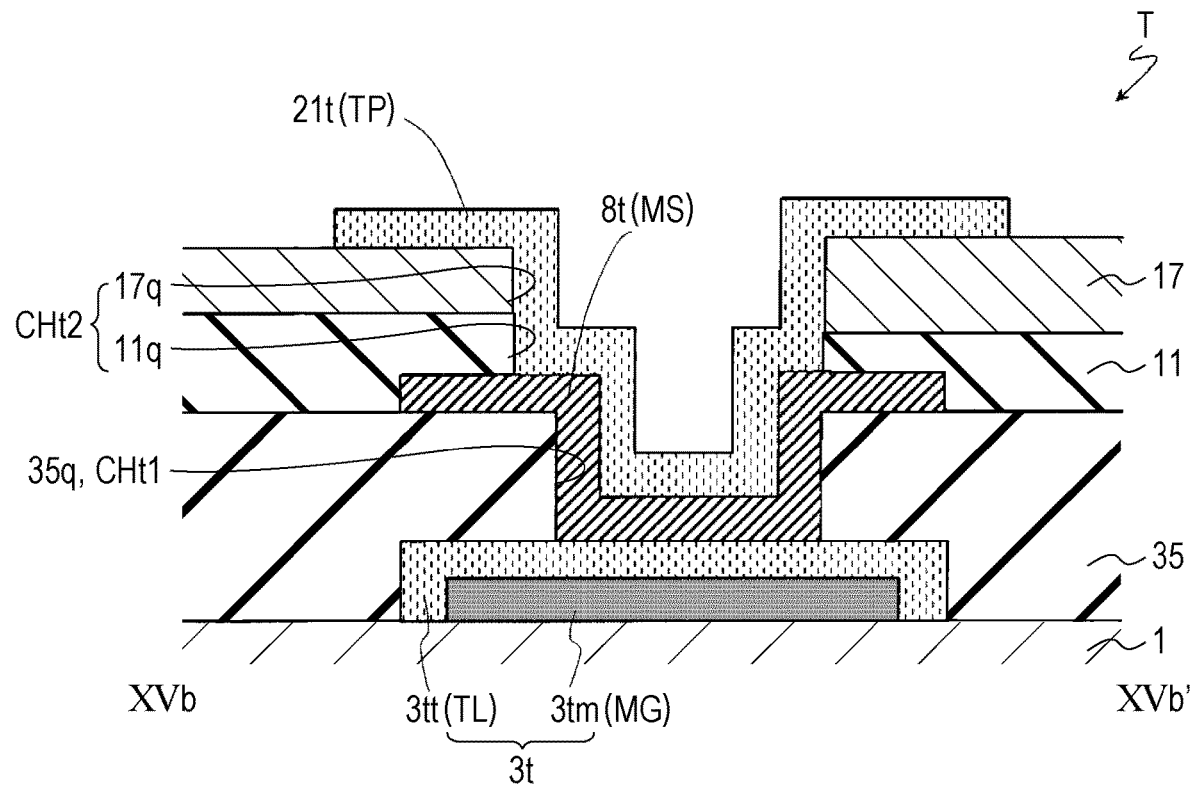
FIG. 15B is a sectional view illustrating the terminal unit of the active matrix substrate 200.

FIG. 15A is a plan view illustrating the source terminal unit Ts and/or the gate terminal unit Tg (hereinafter, collectively referred to as "terminal unit T"). FIG. 15B is a sectional view of the terminal unit T taken along the line XVb-XVb'.

The terminal unit T includes the lower conductive layer 3t formed on the gate metal layer MG and the lower transparent conductive layer TL, the lower insulating layer 35 that has extended on the lower conductive layer 3t, the source connection layer 8t formed in the source metal layer MS, and the upper conductive layer 21t.

The lower conductive layer 3t may have the first laminated structure including the metal layer 3tm formed in the gate metal layer MS and the transparent conductive layer 3tt formed in the lower transparent conductive layer TL. The transparent conductive layer 3tt may cover the entire upper surface and side surface of the metal layer 3tm. The lower conductive layer 3t may be an end portion of the gate bus line GL (gate terminal unit Tg). Otherwise, the lower conductive layer 3t may be an end portion of the gate connection wiring connected to the source bus line SL via the source-gate connection unit SG (source terminal unit Ts).

The lower insulating layer 35 has an opening portion (lower opening portion CHt1) 35q that exposes a part of the transparent conductive layer 3tt of the lower conductive layer 3t. The source connection layer 8t is in contact with the transparent conductive layer 3tt of the lower conductive layer 3t in the opening portion 35q.

The source connection layer 8t is covered with an insulating layer. The insulating layer includes the inorganic insulating layer 11 and the dielectric layer 17. The organic insulating layer 12 may not be provided to extend to the terminal unit formation region. The upper opening portion CHt2 that exposes at least a part of the source connection layer 8t is formed in the insulating layer. In this example, the upper opening portion CHt2 includes an opening portion 11q formed in the inorganic insulating layer 11, and an opening portion 17q formed in the dielectric layer 17.

The upper conductive layer 21t is connected to the source connection layer 8t on the insulating layer and in the upper opening portion CHt2 formed in the insulating layer. In other words, the upper conductive layer 21t is electrically connected to the lower conductive layer 3t via the source connection layer 8t. The upper conductive layer 21t is formed, for example, in the pixel electrode layer TP (that is, by using the first transparent conductive film). The upper conductive layer 21t may be an island-like portion separated from the pixel electrode PE. In addition, the upper conductive layer 21t may be formed on another conductive layer formed above the inorganic insulating layer 11.

In the active matrix substrate 200, the electrodes and wirings such as the gate bus line GL having the first laminated structure and the lower insulating layer 35 can be formed by the same method as that in the above-described embodiments (FIGS. 5A to 5C). After this, the lower insulating layer 35, the oxide semiconductor layer 7, and the source metal layer MS are formed in this order. The material of each layer, the forming method, and the like may be the same as those in the above-described embodiments. Subsequent steps (formation of the pixel electrode layer TP including the upper insulating layer 13, the common electrode layer TC, the dielectric layer 17, the pixel electrode PE, and the upper conductive layer 21t) are the same as those in the above-described embodiments.

Other Embodiments

Figure 16A:
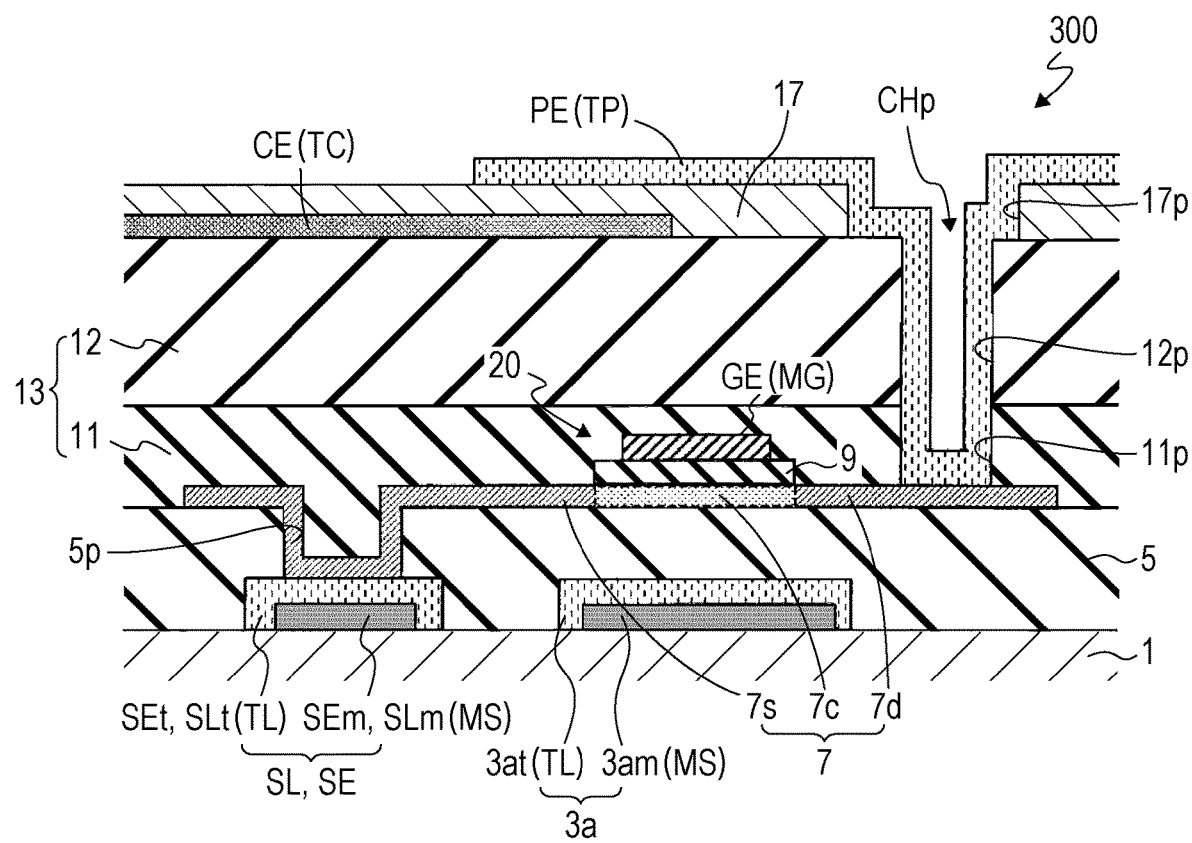
FIG. 16A is a sectional view illustrating a pixel region in an active matrix substrate 300.
Figure 16B:
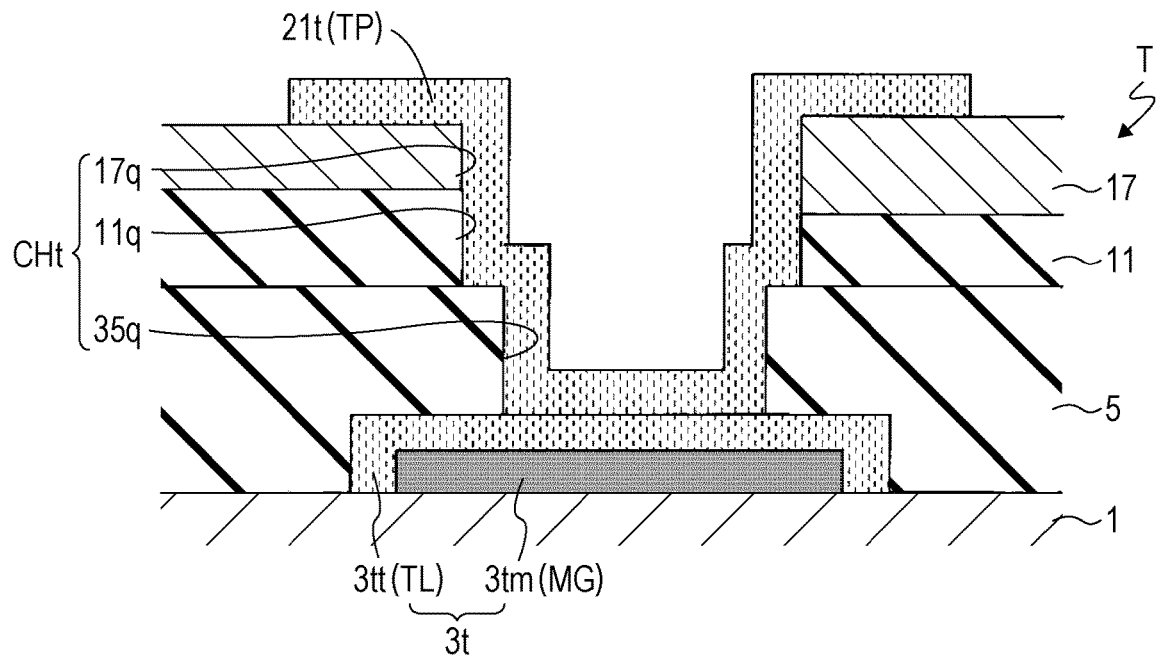
FIG. 16B is a sectional view illustrating a terminal unit in the active matrix substrate 300.

FIG. 16A and FIG. 16B are sectional views illustrating the pixel region P and the terminal unit T of an active matrix substrate 300 according to another embodiment, respectively.

The active matrix substrate 300 is different from the active matrix substrate 100 according to the first embodiment in that the drain metal layer MD and the interlayer insulating layer 10 are not provided.

In the active matrix substrate 300, the upper insulating layer 13 is formed so as to cover the oxide semiconductor layer 7, the gate metal layer MG, and the TFT 20. The pixel electrode PE is in direct contact with the second region 7d of the oxide semiconductor layer 7 in the pixel contact hole CHp formed on the upper insulating layer 13 and the dielectric layer 17.

In the terminal unit formation region, the upper conductive layer 21t is in direct contact with the lower conductive layer 3t in the terminal unit contact holes CHt formed in the lower insulating layer 5, the inorganic insulating layer 11, and the dielectric layer 17. Although not illustrated, as described in the second embodiment, the lower insulating layer 5, the inorganic insulating layer 11, and the dielectric layer 17 may be collectively patterned in the terminal unit formation region. The other structures are similar to those in the active matrix substrate 100 according to the first embodiment.

Figure 17A:
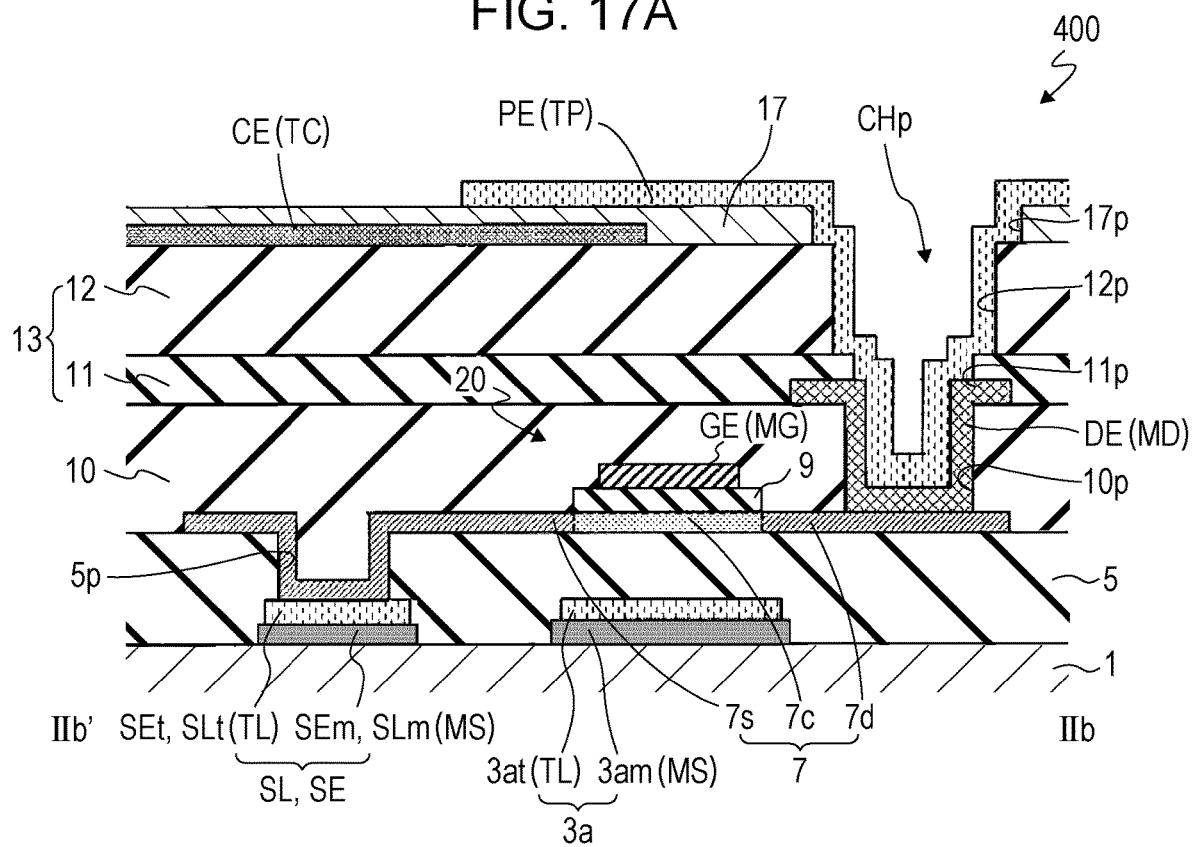
FIG. 17A is a sectional view illustrating a pixel region in an active matrix substrate 400.
Figure 17B:
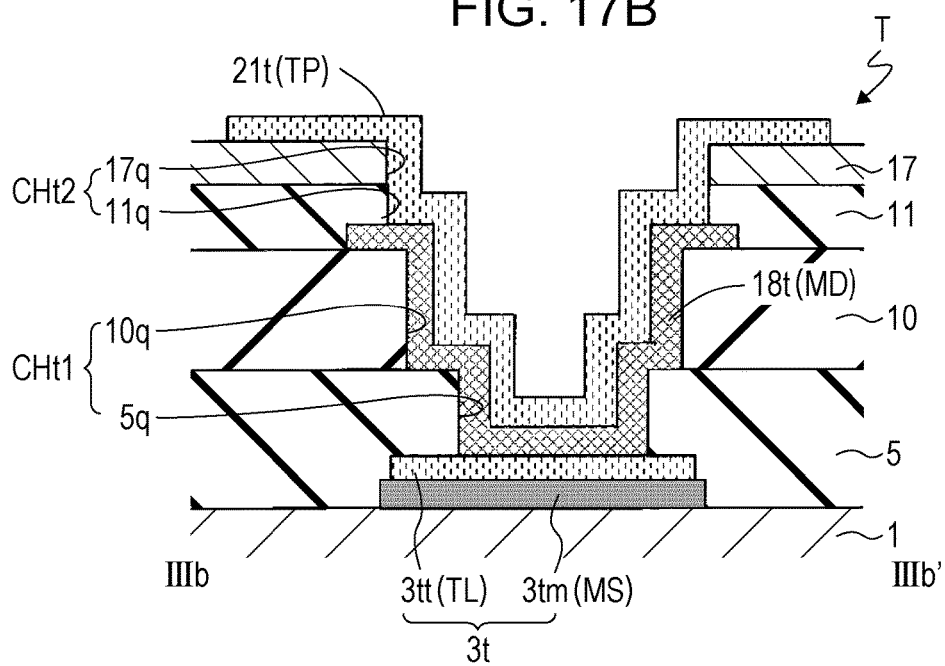
FIG. 17B is a sectional view illustrating a terminal unit of the active matrix substrate 400.

FIGS. 17A and 17B are sectional views illustrating the pixel region P and the terminal unit T in an active matrix substrate 400 according to still another embodiment.

In the active matrix substrate 400, the source bus lines SL and the transparent conductive layers SLt and 3tt of the lower conductive layer 3t are formed only on the upper surfaces of the metal layers SLm and 3tm. Other structures are the same as those of the active matrix substrate 100.

In this example, the transparent conductive layer covers at least a part of the upper surface of the metal layer, preferably, the entire upper surface. In the terminal unit formation region, when the transparent conductive layer is formed on the upper surface (at least a part thereof) of the metal layer, the transparent conductive layer 3tt is exposed in the opening portion 5q formed in the lower insulating layer 5, and the metal layer 3tm is not exposed. Therefore, damage to the metal layer 3tm due to etching of the oxide semiconductor film can be suppressed. Since the side surface of the metal layer is not protected by the transparent light shielding layer, in a case where the plasma treatment is performed at the time of forming the lower insulating layer 5, there is a possibility that the side surface of the metal layer is damaged.

The laminated structure of the source bus line SL and the lower conductive layer 3t in the active matrix substrate 400 can also be formed by simultaneously patterning the source metal layer MS and the lower transparent conductive layer TL using the same resist mask. However, from the viewpoint of compensating (repairing) the disconnection caused by the metal cover with the transparent conductive layer, it is preferable to pattern the source metal layer MS and the lower transparent conductive layer TL, separately. For example, using a first photomask, after performing the patterning of the source metal layer MS by a known photolithography step, the patterning of the lower transparent conductive layer TL may be performed using the same photomask (first photomask).

The laminated structure as illustrated in FIGS. 17A and 17B can also be applied to electrodes and wirings such as the lower bus line and the lower conductive layer of the terminal unit in the active matrix substrates according to the second and third embodiments.

<Regarding Oxide Semiconductors>

The oxide semiconductor included in the oxide semiconductor layer 7 may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor of which a C axis is oriented substantially perpendicular to the layer surface.

The oxide semiconductor layer 7 may have a laminated structure of two or more layers. In a case where the oxide semiconductor layer 7 has the laminated structure, the oxide semiconductor layer 7 may include a noncrystalline oxide semiconductor layer and a crystalline oxide semiconductor layer. Otherwise, a plurality of crystalline oxide semiconductor layers having different crystal structures may be included. Further, a plurality of noncrystalline oxide semiconductor layers may be included. In a case where the oxide semiconductor layer 7 has a two-layer structure including an upper layer and a lower layer, the energy gap of the oxide semiconductor included in a layer (a lower layer in a case of a bottom-gate type, and an upper layer in a case of a top-gate type) positioned on the gate electrode side among the two layers may be smaller than the energy gap of the oxide semiconductor included in the layer (an upper layer in a case of a bottom-gate type, and a lower layer in a case of a top-gate type) positioned on the side opposite to the gate electrode. However, in a case where the difference between the energy gaps of these layers is relatively small, the energy gap of the oxide semiconductor layer of the layer positioned on the gate electrode side may be larger than the energy gap of the oxide semiconductor of the layer positioned on the side opposite to the gate electrode.

The material of the noncrystalline oxide semiconductor and each of the above-described crystalline oxide semiconductors, the structure, the film formation method, the configuration of the oxide semiconductor layer having the laminated structure, and the like are described in, for example, Japanese Unexamined Patent Application Publication No. 2014-007399. The entire contents disclosed in Japanese Unexamined Patent Application Publication No. 2014-007399 are incorporated herein by reference.

The oxide semiconductor layer 7 may include, for example, at least one type of metal element among In, Ga, and Zn. In the present embodiment, the oxide semiconductor layer 7 includes, for example, In—Ga—Zn—O-based semiconductor (for example, indium gallium zinc oxide). Here, the In—Ga—Zn—O-based semiconductor is a three way oxide of In (indium), Ga (gallium), and Zn (zinc), and the ratio (composition ratio) of In, Ga, and Zn is not particularly limited, and for example, In:Ga:Zn=2:2:1, In:Ga:Zn=1:1:1, In:Ga:Zn=1:1:2, and the like are included. The oxide semiconductor layer 7 can be formed from the oxide semiconductor film including the In—Ga—Zn—O-based semiconductor.

The In—Ga—Zn—O-based semiconductor may be amorphous or crystalline. As the crystalline In—Ga—Zn—O-based semiconductor, a crystalline In—Ga—Zn—O-based semiconductor of which a C axis is oriented substantially perpendicular to the layer surface is preferable.

In addition, the crystalline structure of the crystalline In—Ga—Zn—O-based semiconductor is disclosed in, for example, Japanese Unexamined Patent Application Publication No. 2014-007399, Japanese Unexamined Patent Application Publication No. 2012-134475, and Japanese Unexamined Patent Application Publication No. 2014-209727. The entire contents disclosed in Japanese Unexamined Patent Application Publication No. 2012-134475 and Japanese Unexamined Patent Application Publication No. 2014-209727 are incorporated herein by reference. Since the TFT with an In—Ga—Zn—O-based oxide semiconductor layer has high mobility (more than 20 times that of a-SiTFT) and low leakage current (less than $\frac{1}{100}$ that of a-SiTFT), a driving TFT (for example, a TFT included in a driving circuit provided on the same substrate as the display region around the display region including a plurality of pixels) and a pixel TFT (a TFT provided in a pixel) are preferable.

The oxide semiconductor layer 7 may include another oxide semiconductor instead of the In—Ga—Zn—O-based semiconductor. For example, an In—Sn—Zn—O-based semiconductor (for example, $In_2O_3$—$SnO_2$—ZnO: InSnZnO) may be included. The In—Sn—Zn—O-based semiconductor is a three way oxide of In (indium), Sn (tin), and Zn (zinc). Otherwise, the oxide semiconductor layer 7 includes an In—Al—Zn—O-based semiconductor, an In—Al—Sn—Zn—O-based semiconductor, a Zn—O-based semiconductor, an In—Zn—O-based semiconductor, and a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, and an In—Ga—Zn—Sn—O-based semiconductor or the like.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An active matrix substrate having a display region including a plurality of pixel regions, and a non-display region other than the display region, comprising:
    a substrate;
    a plurality of lower bus lines and a plurality of upper bus lines which are supported on a main surface of the substrate, in which the plurality of lower bus lines are positioned closer to the substrate than the plurality of upper bus lines, one of the plurality of lower bus lines and the plurality of upper bus lines is a plurality of source bus lines, and another of the plurality of lower bus lines and the plurality of upper bus lines is a plurality of gate bus lines;
    a lower insulating layer positioned between the plurality of lower bus lines and the plurality of upper bus lines;
    an oxide semiconductor TFT positioned in each of the plurality of pixel regions and including an oxide semiconductor layer disposed on the lower insulating layer, a gate electrode electrically connected to corresponding one of the plurality of gate bus lines, a gate insulating layer positioned between the oxide semiconductor layer and the gate electrode, and a source electrode electrically connected to corresponding one of the plurality of source bus lines;
    a pixel electrode disposed in each of the plurality of pixel regions; and
    a plurality of wiring connection units disposed in the non-display region, wherein
    the oxide semiconductor layer includes a channel region, and a first region and a second region positioned on both sides of the channel region, the first region is electrically connected to the source electrode, and the second region is electrically connected to the pixel electrode,
    each of the plurality of wiring connection units includes a lower conductive layer formed using a conductive film identical with a conductive film of the plurality of lower bus lines, an insulating layer that extends on the lower conductive layer and includes the lower insulating layer, and has a first opening portion that exposes a part of the lower conductive layer, and another conductive layer connected to the lower conductive layer in the first opening portion, and the plurality of lower bus lines and the lower conductive layer have a first laminated structure including a metal layer and a transparent conductive layer that covers an upper surface and a side surface of the metal layer, wherein, in the first laminated structure, a first thickness of a part of the transparent conductive layer positioned on the upper surface of the metal layer is 20 nm or more and 120 nm or less, and a second thickness of a part of the transparent conductive layer positioned on the side surface of the metal layer is different from the first thickness of the part positioned on the upper surface and is 20 nm or more and 120 nm or less.

2. The active matrix substrate according to claim 1, wherein the other conductive layer is in direct contact with the transparent conductive layer of the lower conductive layer in the first opening portion.

3. The active matrix substrate according to claim 1, wherein the transparent conductive layer of the lower conductive layer has an opening portion that exposes only a part of the upper surface of the metal layer in the first opening portion, and the other conductive layer is in direct contact with the part exposed at the opening portion of the transparent conductive layer on the upper surface of the metal layer in the first opening portion.

4. The active matrix substrate according to claim 1, wherein the plurality of lower bus lines are the plurality of source bus lines and the plurality of upper bus lines are the plurality of gate bus lines, and the gate electrode of the oxide semiconductor TFT is disposed on the oxide semiconductor layer with the gate insulating layer in between.

5. The active matrix substrate according to claim 4, wherein the source electrode is a part of the corresponding one of the source bus lines or is connected to the corresponding one of the source bus lines, the source electrode has the first laminated structure, and the oxide semiconductor layer is formed on the lower insulating layer and in a source opening portion formed in the lower insulating layer, and is in contact with the transparent conductive layer of the source electrode in the source opening portion.

6. The active matrix substrate according to claim 5, further comprising an interlayer insulating layer that covers the oxide semiconductor layer and the gate electrode, wherein the oxide semiconductor TFT further includes a drain electrode, the drain electrode is disposed on the interlayer insulating layer and in a drain opening portion formed in the interlayer insulating layer, and is connected to the second region of the oxide semiconductor layer in the drain opening portion, the pixel electrode is electrically connected to the oxide semiconductor TFT via the drain electrode, and in each of the plurality of wiring connection units, the first opening portion is formed in an insulating layer including the lower insulating layer and the interlayer insulating layer.

7. The active matrix substrate according to claim 6, wherein a side surface of the lower insulating layer and a side surface of the interlayer insulating layer are aligned in the first opening portion.

8. The active matrix substrate according to claim 6, wherein the other conductive layer is a connection unit formed of a conductive film identical with a conductive film of the drain electrode, and each of the plurality of wiring connection units further includes an upper conductive layer disposed on the other conductive layer.

9. The active matrix substrate according to claim 6, wherein the other conductive layer in each of the plurality of wiring connection units is an upper conductive layer formed of a transparent conductive film identical with a transparent conductive film of the pixel electrode, and in each of the plurality of wiring connection units, the upper conductive layer is in direct contact with the lower conductive layer in the first opening portion.

10. The active matrix substrate according to claim 9, further comprising:

an upper insulating layer that covers the oxide semiconductor TFT;

a common electrode disposed on the upper insulating layer; and a dielectric layer positioned between the common electrode and the pixel electrode, wherein, in each of the plurality of wiring connection units, the first opening portion is formed in an insulating layer including the lower insulating layer, the interlayer insulating layer, the upper insulating layer, and the dielectric layer, and in the first opening portion, a side surface of the lower insulating layer, a side surface of the interlayer insulating layer, a side surface of the upper insulating layer, and a side surface of the dielectric layer are aligned.

11. The active matrix substrate according to claim 1, wherein the oxide semiconductor layer includes an In—Ga—Zn—O-based semiconductor.

12. An active matrix substrate having a display region including a plurality of pixel regions, and a non-display region other than the display region, comprising:

a substrate;

a plurality of lower bus lines and a plurality of upper bus lines which are supported on a main surface of the substrate, in which the plurality of lower bus lines are positioned closer to the substrate than the plurality of upper bus lines, one of the plurality of lower bus lines and the plurality of upper bus lines is a plurality of source bus lines, and another of the plurality of lower bus lines and the plurality of upper bus lines is a plurality of gate bus lines;

a lower insulating layer positioned between the plurality of lower bus lines and the plurality of upper bus lines;

an oxide semiconductor TFT positioned in each of the plurality of pixel regions and including an oxide semiconductor layer disposed on the lower insulating layer, a gate electrode electrically connected to corresponding one of the plurality of gate bus lines, a gate insulating layer positioned between the oxide semiconductor layer and the gate electrode, and a source electrode electrically connected to corresponding one of the plurality of source bus lines;
a pixel electrode disposed in each of the plurality of pixel regions; and
a plurality of wiring connection units disposed in the non-display region, wherein
the oxide semiconductor layer includes a channel region, and a first region and a second region positioned on both sides of the channel region, the first region is electrically connected to the source electrode, and the second region is electrically connected to the pixel electrode,
each of the plurality of wiring connection units includes
a lower conductive layer formed using a conductive film identical with a conductive film of the plurality of lower bus lines,
an insulating layer that extends on the lower conductive layer and includes the lower insulating layer, and has a first opening portion that exposes a part of the lower conductive layer, and
another conductive layer connected to the lower conductive layer in the first opening portion, and
the plurality of lower bus lines and the lower conductive layer have a first laminated structure including a metal layer and a transparent conductive layer that covers an upper surface and a side surface of the metal layer, wherein
the other conductive layer in each of the plurality of wiring connection units is an upper conductive layer formed of a transparent conductive film identical with a transparent conductive film of the pixel electrode, and
in each of the plurality of wiring connection units, the upper conductive layer is in direct contact with the lower conductive layer in the first opening portion.

13. The active matrix substrate according to claim 12, wherein the other conductive layer is in direct contact with the transparent conductive layer of the lower conductive layer in the first opening portion.

14. The active matrix substrate according to claim 12, wherein
the transparent conductive layer of the lower conductive layer has an opening portion that exposes only a part of the upper surface of the metal layer in the first opening portion, and
the other conductive layer is in direct contact with the part exposed at the opening portion of the transparent conductive layer on the upper surface of the metal layer in the first opening portion.

15. The active matrix substrate according to claim 12, wherein
the plurality of lower bus lines are the plurality of source bus lines and the plurality of upper bus lines are the plurality of gate bus lines, and
the gate electrode of the oxide semiconductor TFT is disposed on the oxide semiconductor layer with the gate insulating layer in between.

16. The active matrix substrate according to claim 15, wherein
the source electrode is a part of the corresponding one of the source bus lines or is connected to the corresponding one of the source bus lines,
the source electrode has the first laminated structure, and
the oxide semiconductor layer is formed on the lower insulating layer and in a source opening portion formed in the lower insulating layer, and is in contact with the transparent conductive layer of the source electrode in the source opening portion.

17. A manufacturing method of an active matrix substrate having a display region including a plurality of pixel regions and a non-display region other than the display region, and including a plurality of lower bus lines and a plurality of upper bus lines, an oxide semiconductor TFT disposed in each of the pixel regions, and a plurality of wiring connection units disposed in the non-display region, in which one of the plurality of lower bus lines and the plurality of upper bus lines is a plurality of source bus lines and another of the plurality of lower bus lines and the plurality of upper bus lines is a plurality of gate bus lines, the method comprising:
(a) forming a first conductive film on a substrate;
(b1) forming a first resist layer on the first conductive film using a first photomask, and forming a first metal layer that is a part of the plurality of lower bus lines and a second metal layer that is a part of a lower conductive layer of the plurality of wiring connection units, from the first conductive film by performing patterning of the first conductive film using the first resist layer as a mask;
(b2) forming a lower transparent conductive film so as to cover the first metal layer and the second metal layer;
(c) forming a second resist layer on the lower transparent conductive film using the first photomask again, and forming a first transparent conductive layer that covers at least a part of an upper surface of the first metal layer and a second transparent conductive layer that covers at least a part of an upper surface of the second metal layer, from the lower transparent conductive film by performing patterning of the lower transparent conductive film using the second resist layer as a mask, in which the plurality of lower bus lines having a laminated structure including the first metal layer and the first transparent conductive layer, and a lower conductive layer having a laminated structure including the second metal layer and the second transparent conductive layer are obtained;
(d) forming a lower insulating layer that covers the plurality of lower bus lines and the lower conductive layer;
(e) forming an oxide semiconductor film on the lower insulating layer and forming an oxide semiconductor layer that is an active layer of the oxide semiconductor TFT by performing patterning of the oxide semiconductor film;
(f) forming a first opening portion that exposes a part of the lower conductive layer, on an insulating layer including the lower insulating layer; and
(g) forming another conductive layer in contact with the part of the lower conductive layer in the first opening portion.

18. The manufacturing method of an active matrix substrate according to claim 17,
wherein, in (c), the first transparent conductive layer covers the upper surface and a side surface of the first metal layer, and the second transparent conductive layer covers the upper surface and a side surface of the second metal layer.

19. The manufacturing method of an active matrix substrate according to claim 17, wherein
the plurality of lower bus lines are the plurality of source bus lines,
the method further comprises
forming a source opening portion that exposes a part of corresponding one of the source bus lines in the lower insulating layer between (d) and (e), and after the step (e), the method further comprises
- (h) forming a gate insulating layer and a gate electrode of the oxide semiconductor TFT,
- (i) forming an interlayer insulating layer that covers the oxide semiconductor layer and the gate electrode,
- (j) forming a drain opening portion that exposes a part of the oxide semiconductor layer in the interlayer insulating layer, and
- (k) forming a drain conductive film on the interlayer insulating layer and forming a drain electrode in contact with the part of the oxide semiconductor layer in the drain opening portion by performing patterning of the drain conductive film.

20. The manufacturing method of an active matrix substrate according to claim 19, wherein
- (f) further includes forming the first opening portion in an insulating layer including the lower insulating layer and the interlayer insulating layer, which is performed simultaneously with (j), and
- in (k), the other conductive layer of each of the wiring connection units is formed together with the drain electrode by performing patterning of the drain conductive film.

\* \* \* \* \*